United States Patent [19]

Agrawal et al.

[11] Patent Number: 4,963,768

[45] Date of Patent: Oct. 16, 1990

[54] FLEXIBLE, PROGRAMMABLE CELL ARRAY INTERCONNECTED BY A PROGRAMMABLE SWITCH MATRIX

[75] Inventors: Om P. Agrawal, San Jose, Calif.; Kerry A. Ilgenstein, Austin, Tex.; Michael J. Wright, Santa Clara, Calif.; Jerry D. Moench, Austin, Tex.; Arthur H. Khu, San Mateo, Calif.

[73] Assignee: Advanced Micro Devices, Inc., Sunnyvale, Calif.

[21] Appl. No.: 243,574

[22] Filed: Sep. 12, 1988

Related U.S. Application Data

[63] Continuation-in-part of Ser. No. 178,707, Apr. 7, 1988, which is a continuation of Ser. No. 717,640, Mar. 29, 1985, Pat. No. 4,742,252.

[51] Int. Cl.$^5$ .......................................... H03K 19/177
[52] U.S. Cl. .................. 307/465; 340/825.83; 364/716
[58] Field of Search ............... 307/465, 463, 466–469; 364/716; 340/825.83, 825.84–825.88

[56] References Cited

U.S. PATENT DOCUMENTS

| | | | |
|---|---|---|---|
| 4,124,899 | 11/1978 | Birkner et al. | 307/465 |
| 4,617,479 | 10/1986 | Hartmann et al. | 307/465 |
| 4,684,830 | 8/1987 | Tsui et al. | 307/465 |
| 4,691,161 | 9/1987 | Kant et al. | 307/465 |
| 4,717,912 | 1/1988 | Harvey et al. | 307/465 |
| 4,742,252 | 5/1988 | Agrawal | 307/465 |
| 4,758,747 | 7/1988 | Young et al. | 307/465 |
| 4,771,285 | 9/1988 | Agrawal et al. | 307/465 |
| 4,789,951 | 12/1988 | Henry | 307/465 |

Primary Examiner—Stanley D. Miller
Assistant Examiner—Timothy P. Callahan
Attorney, Agent, or Firm—Skjerven, Morrill, MacPherson, Franklin & Friel

[57] ABSTRACT

A high density segmented programmable array logic device utilizes a switch interconnection matrix to couple an array of programmable logic cells. Each programmable logic cell includes programmable input logic macrocells, programmable feedback logic macrocells, programmable output logic macrocells, buried state logic macrocells and an assembly of programmable AND gates and OR gates. Each input macrocell, output macrocell and buried state macrocell has means for generating either a registered/latched output signal or a combinatorial output signal in response to an input signal to the cell. The various switches are used to couple signals to or from the assembly of programmable AND gates and OR gates.

19 Claims, 55 Drawing Sheets

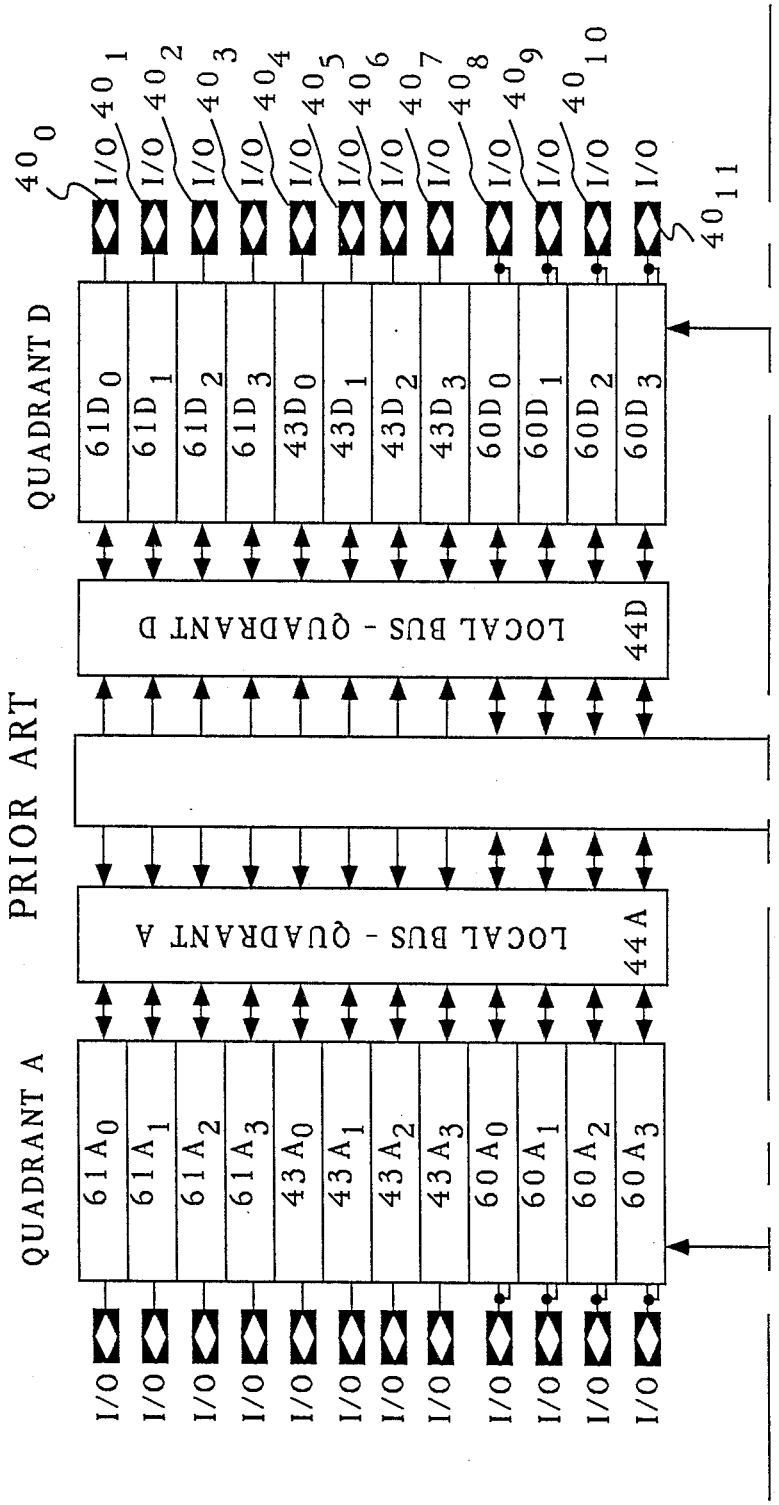

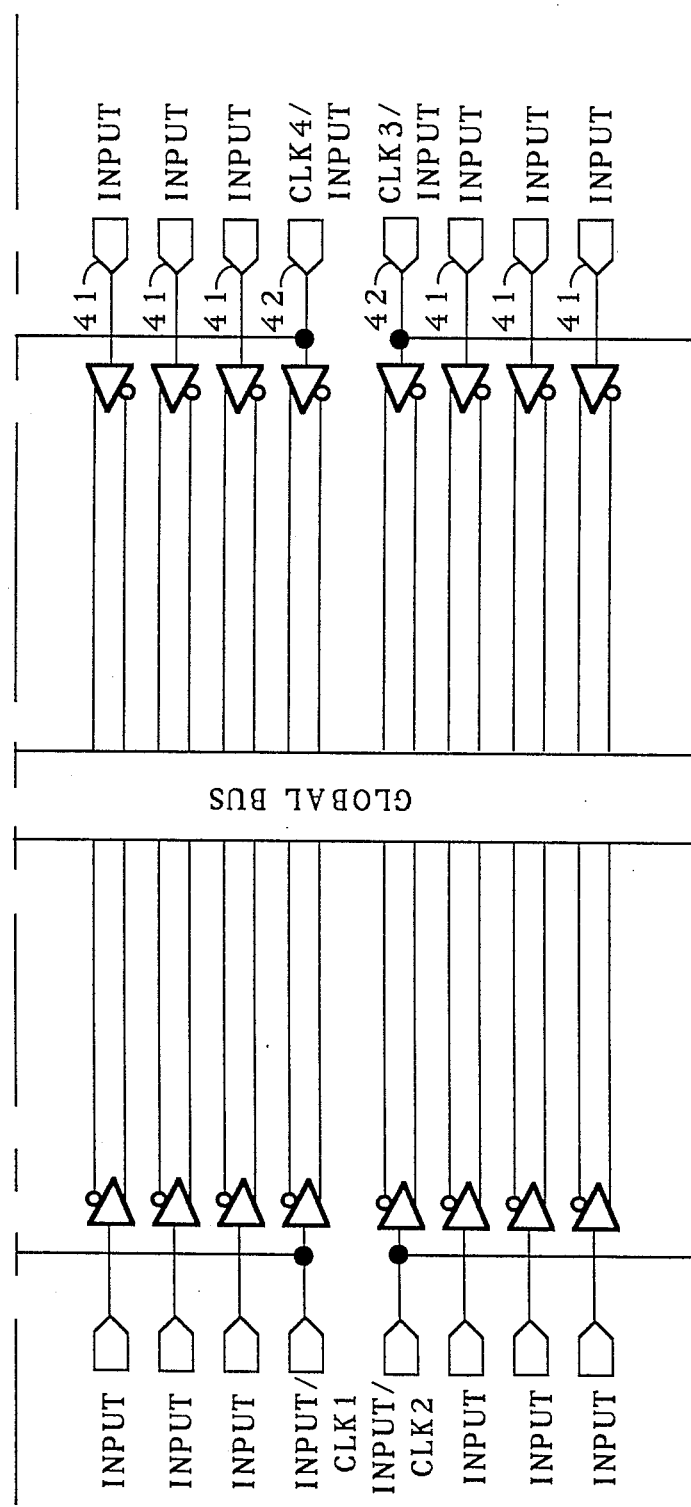
FIGURE 2A"
PRIOR ART

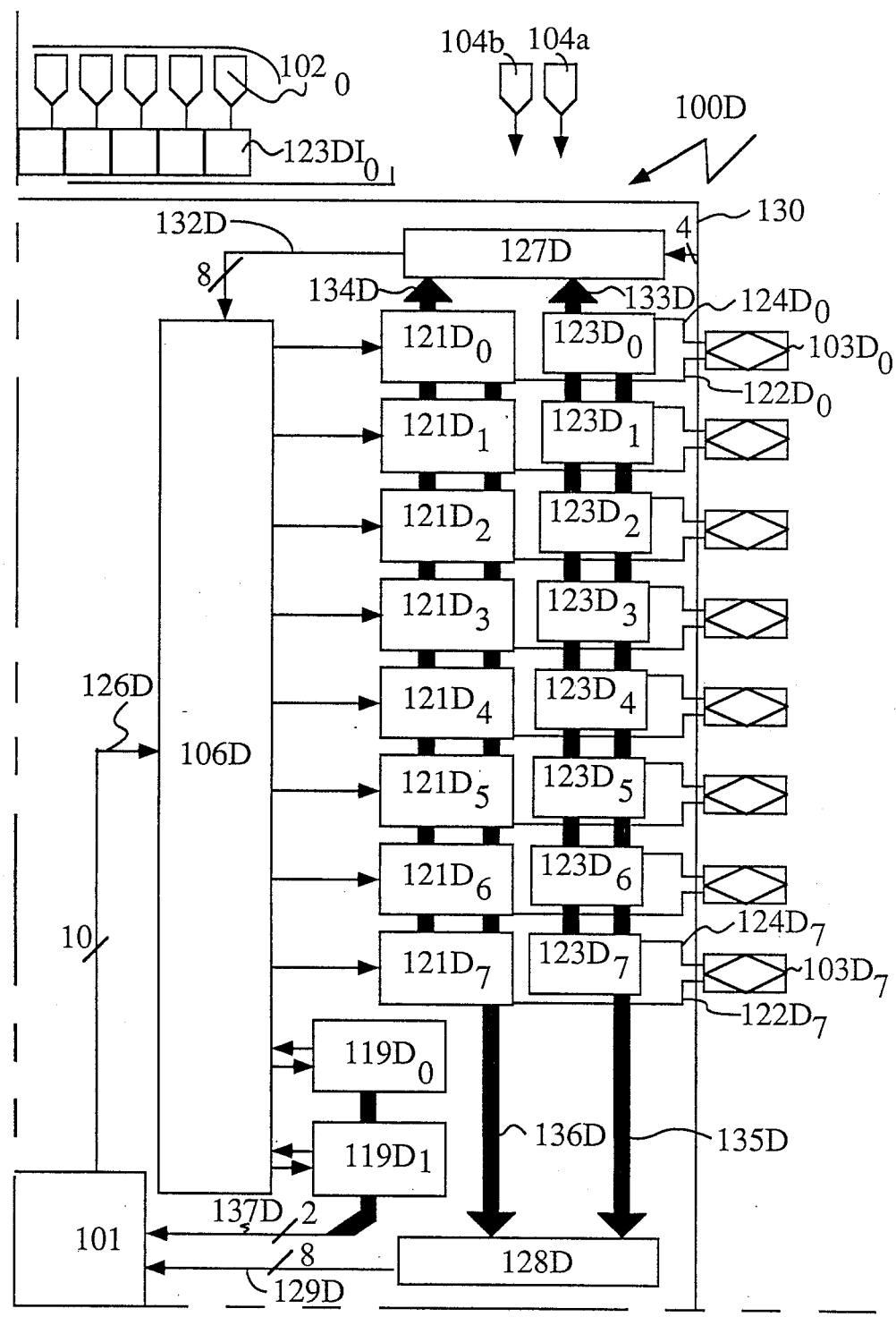
FIGURE 7A"

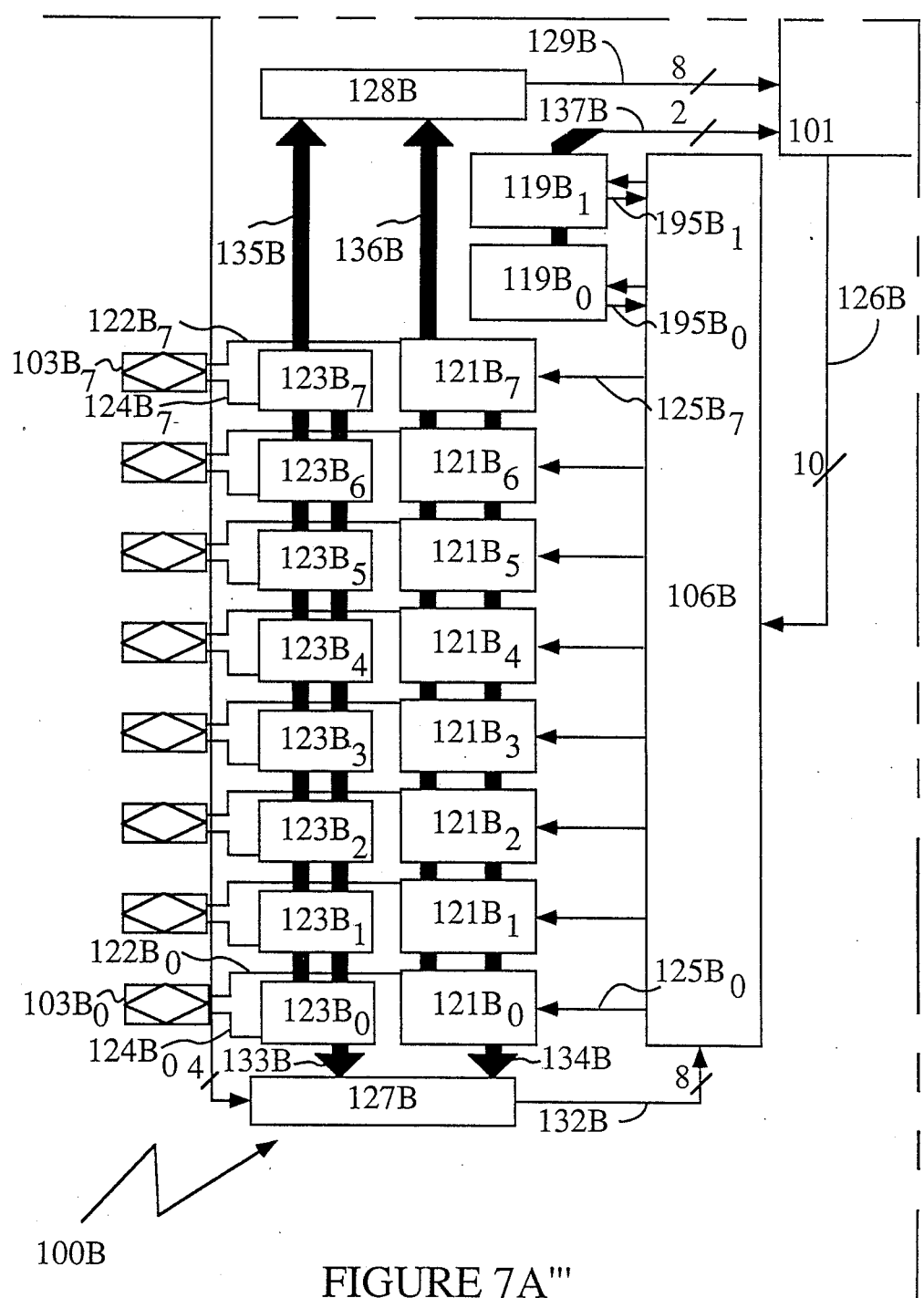
FIGURE 7A''''

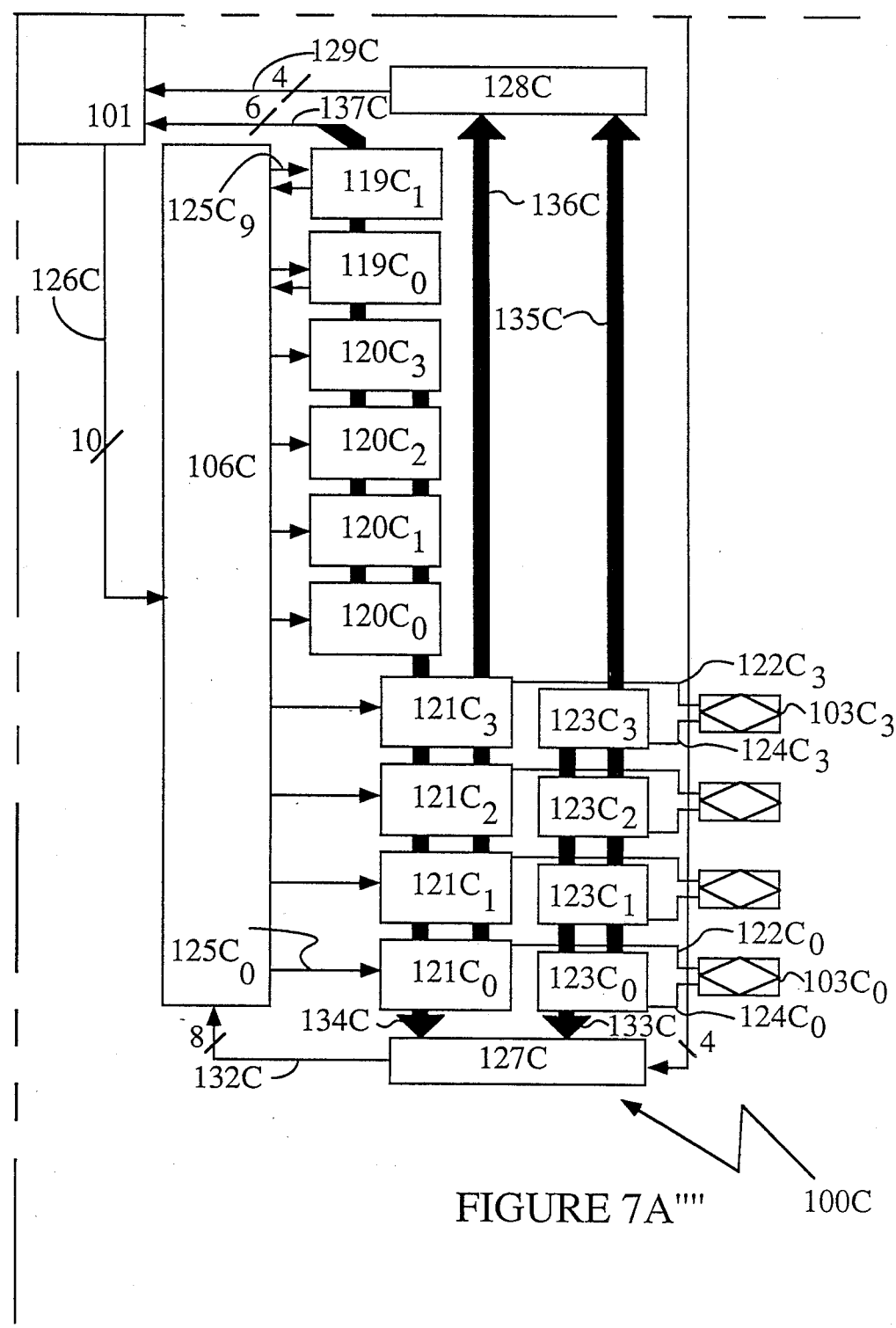
FIGURE 7A""

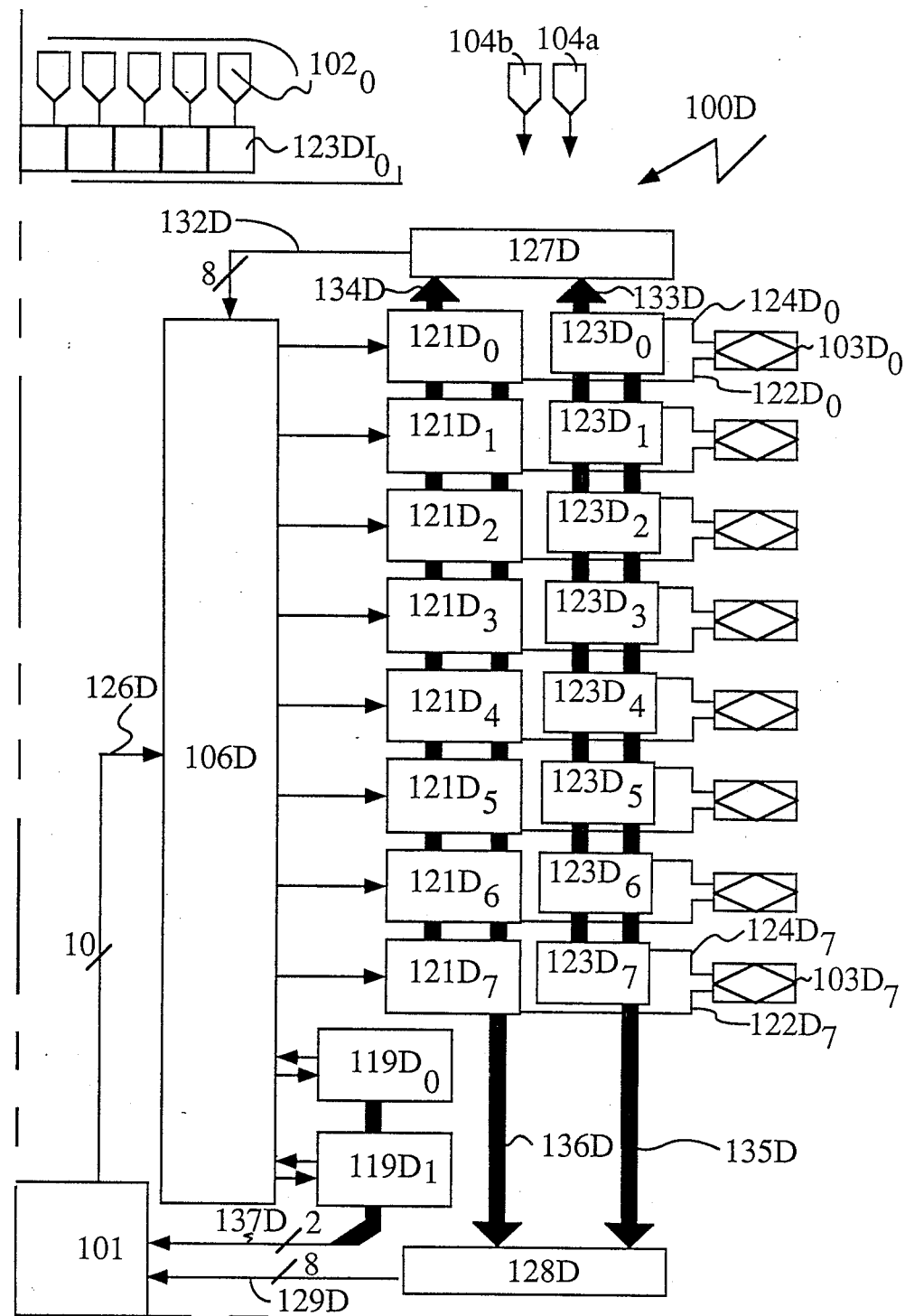
FIGURE 7B"

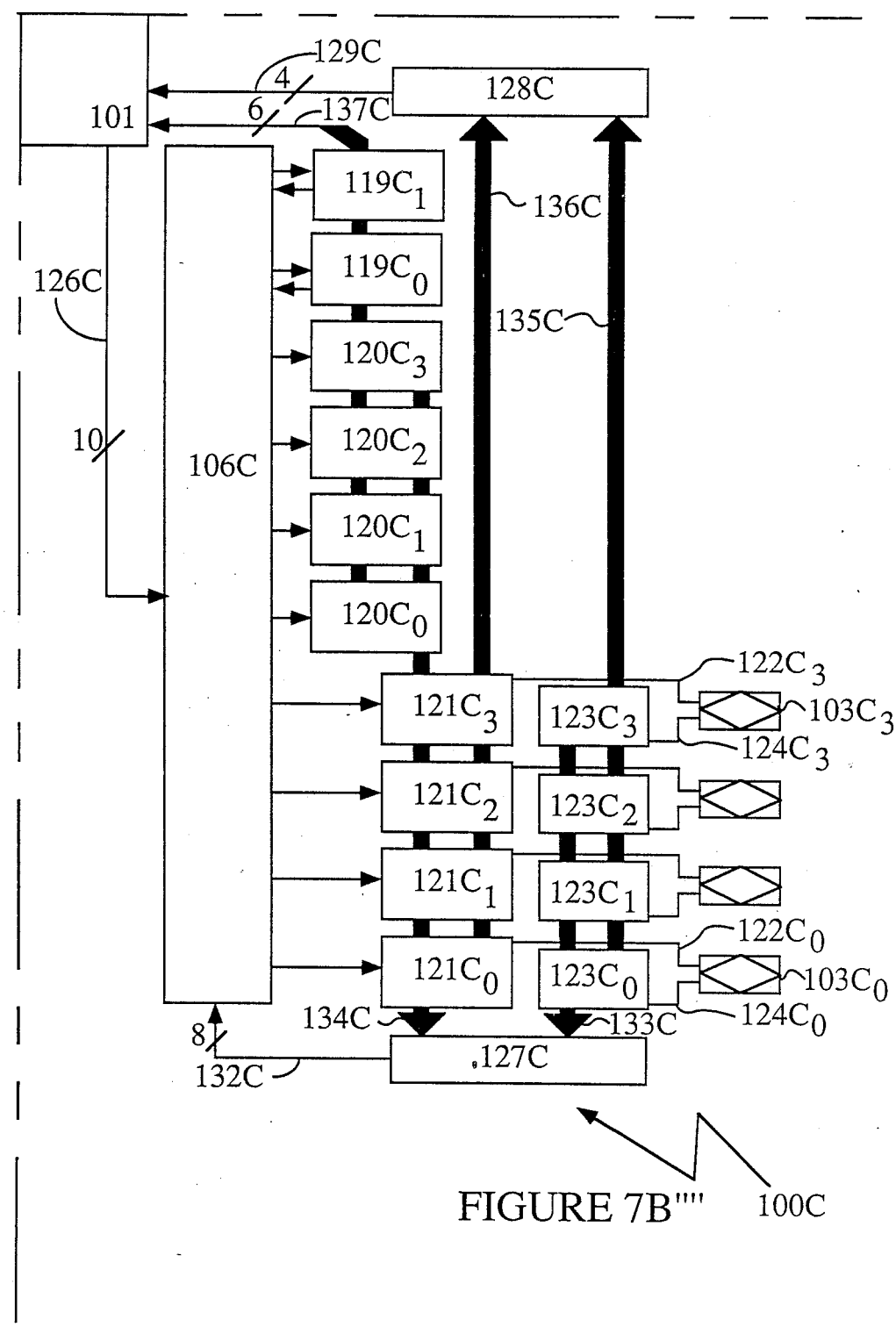
FIGURE 7B''''

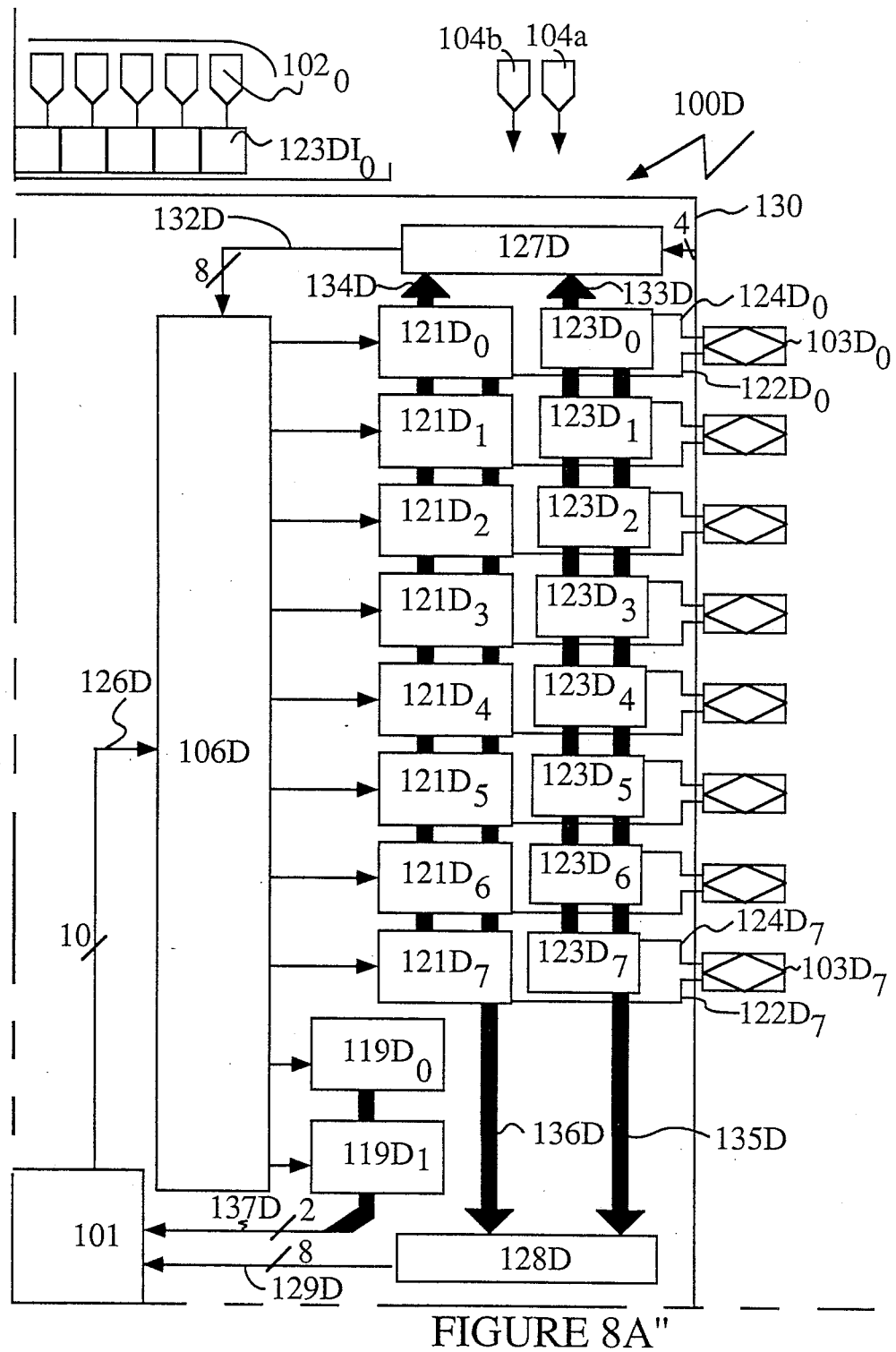
FIGURE 8A"

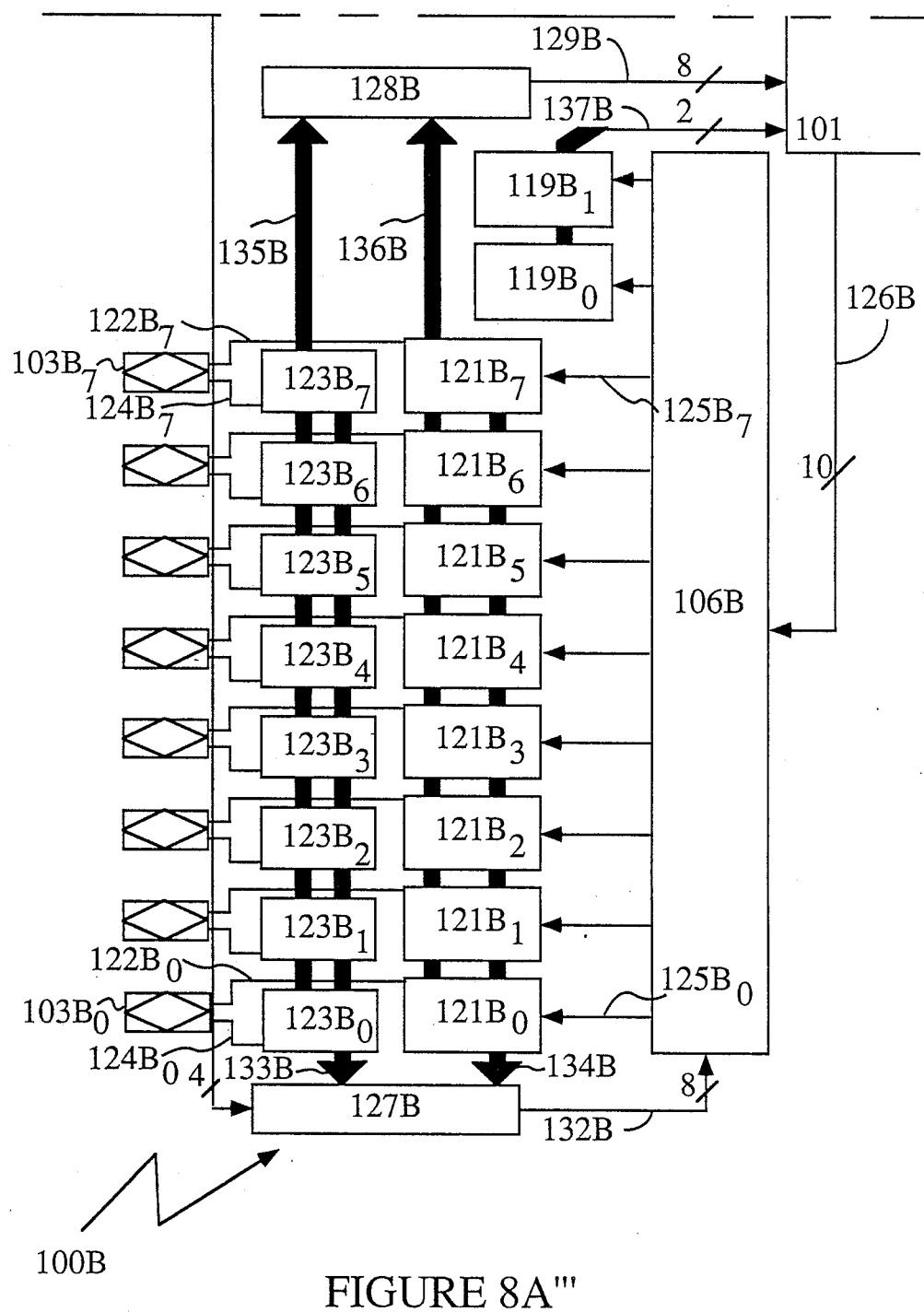
FIGURE 8A''''

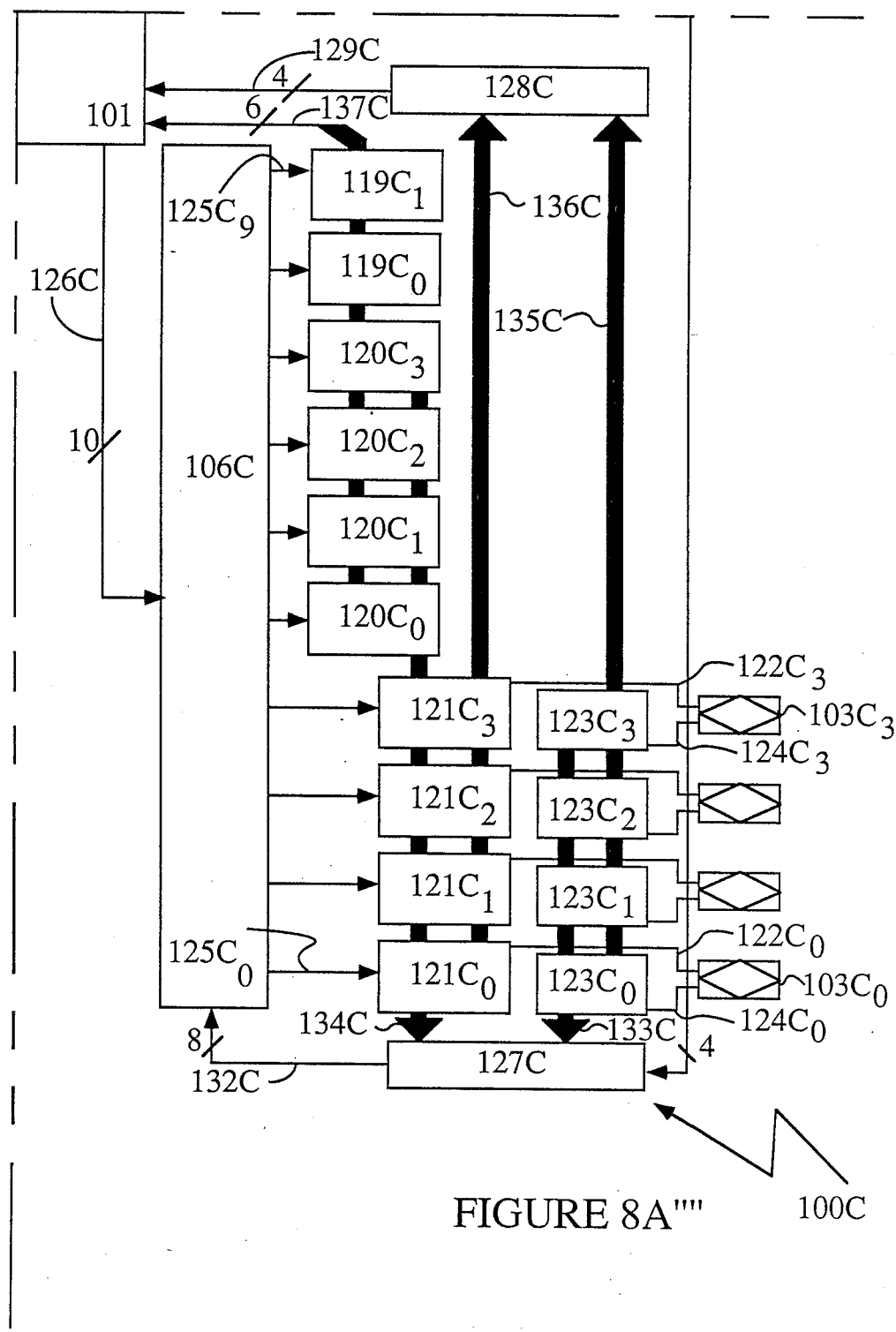
FIGURE 8A''''

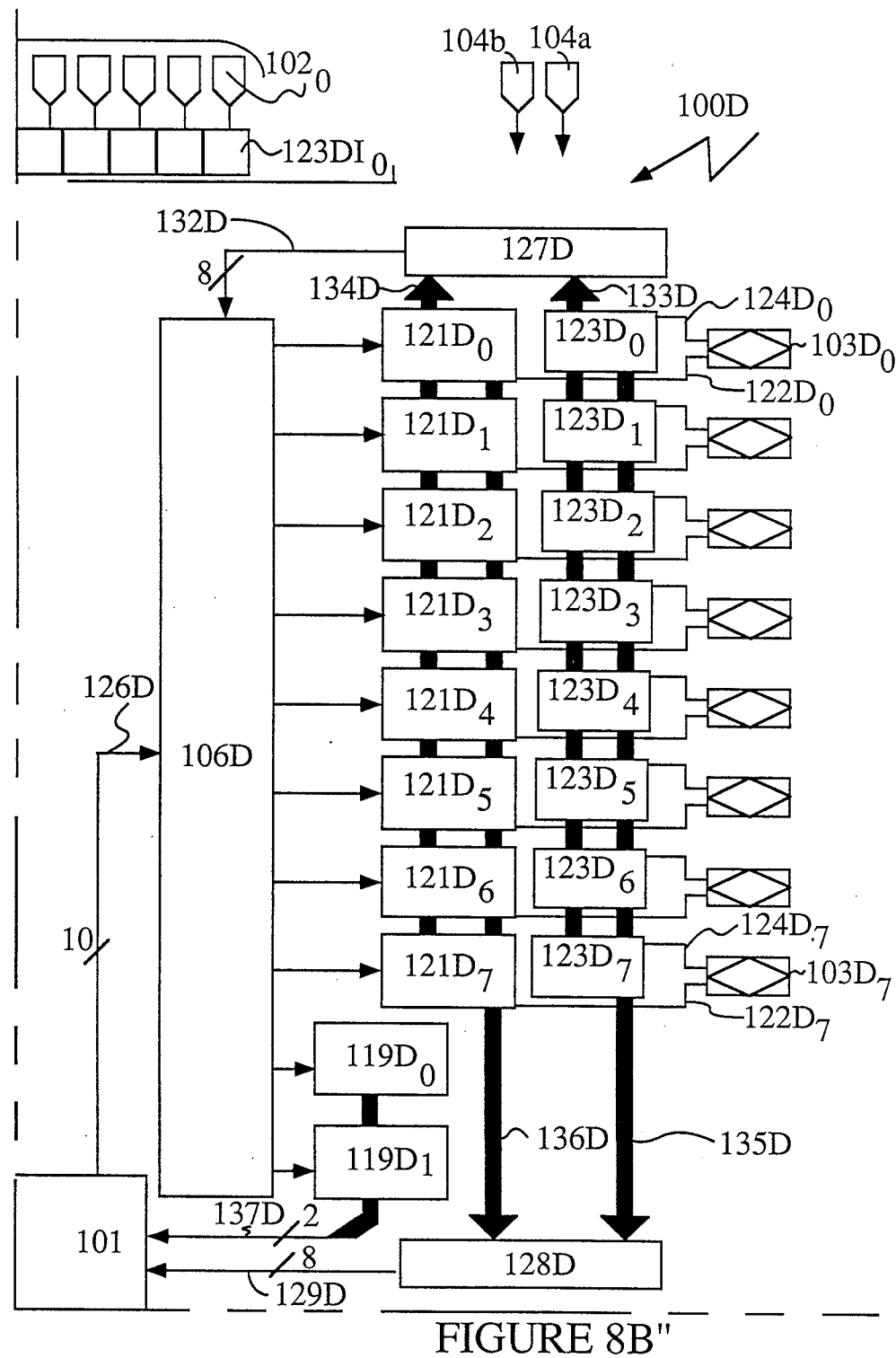
FIGURE 8B"

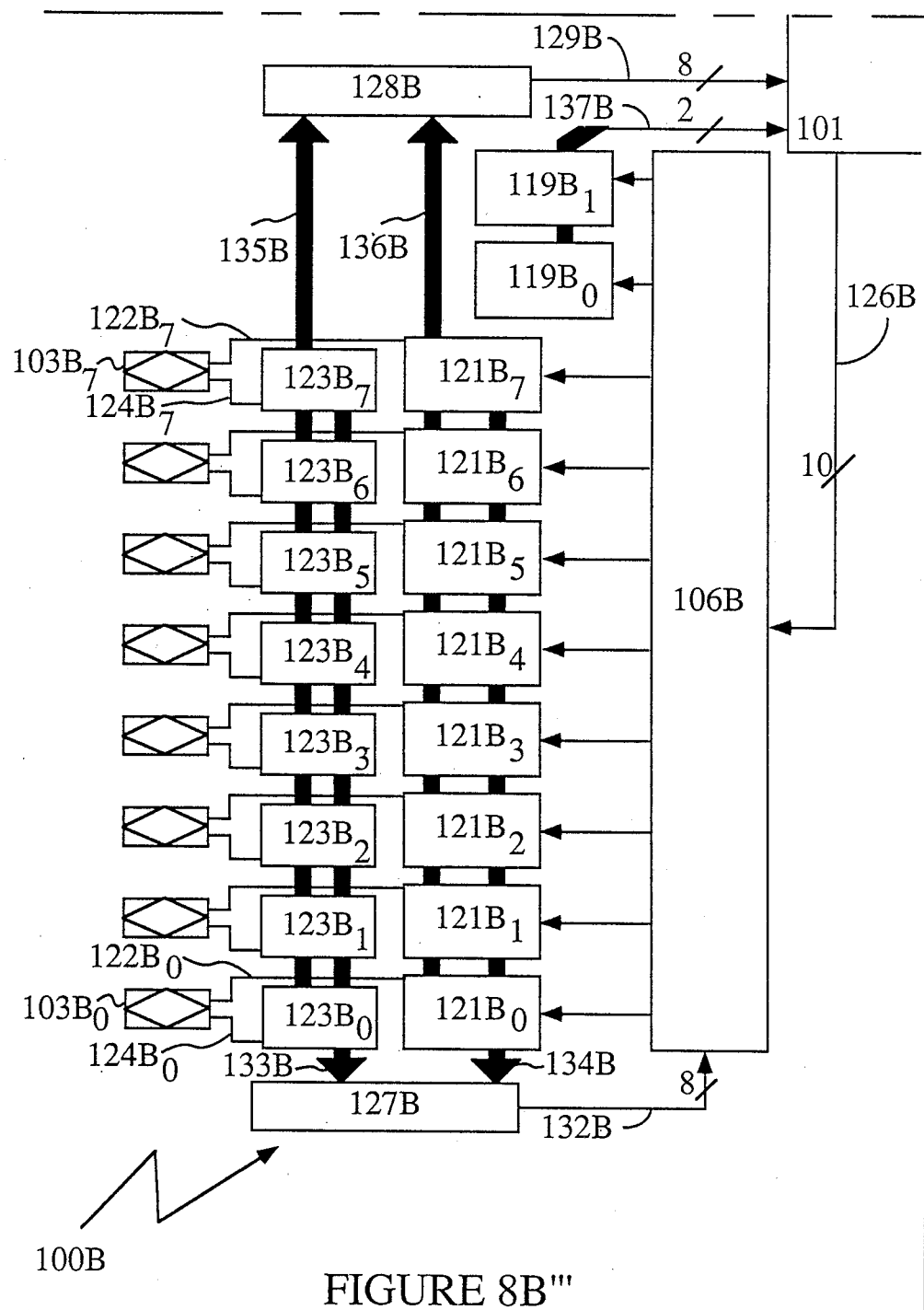
FIGURE 8B''''

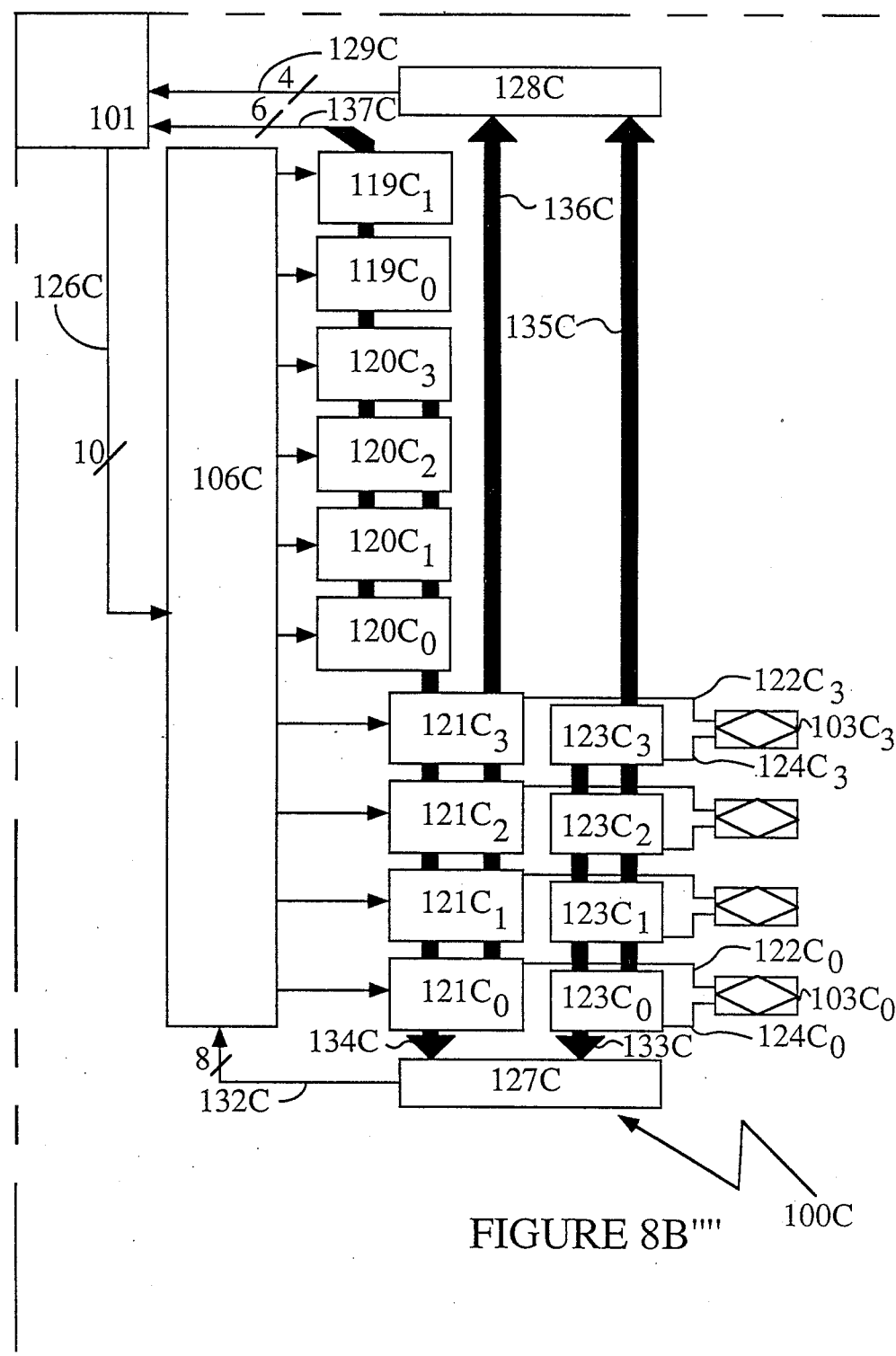
FIGURE 8B''''

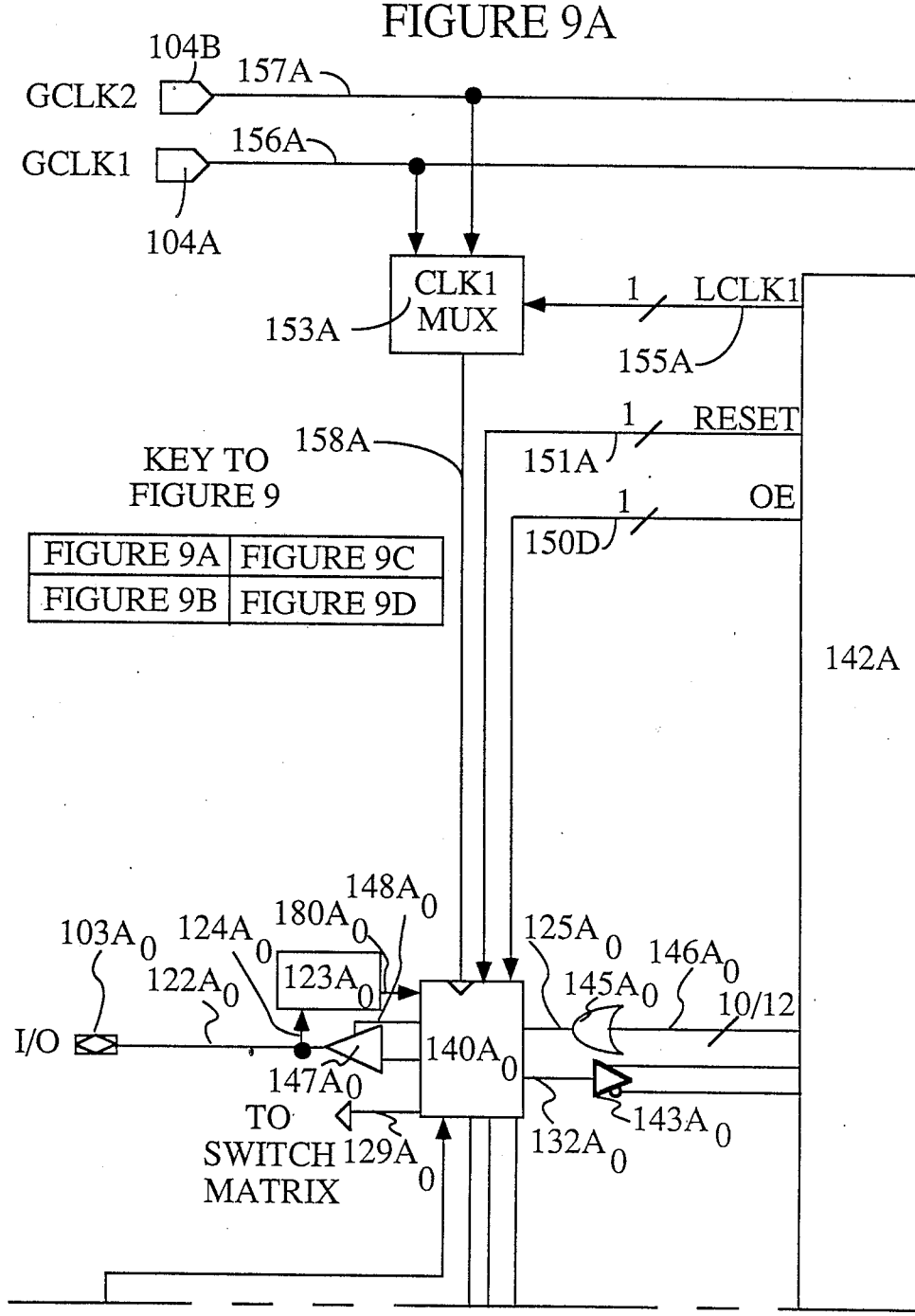

| Switch Matrix for Quadrant 100A QUADRANT 100A INPUT LINE (Figs. 10 and 16) | INPUT SET (Fig. 16) | MULTIPLEXER INPUT LINES FROM MACROCELLS | | |
|---|---|---|---|---|
| I10 | $16_{10}$ | $102_0$ | $140B_4$ | $141C_1$ | $140D_3$ |
| I11 | $16_{11}$ | $102_1$ | $140B_5$ | $140C_3$ | $140D_2$ |
| I12 | $16_{12}$ | $102_2$ | $140B_3$ | $140C_2$ | $140D_6$ |
| I13 | $16_{13}$ | $102_3$ | $140B_2$ | $141C_2$ | $140D_7$ |
| I14 | $16_{14}$ | $102_4$ | $140B_6$ | $141C_3$ | $140D_1$ |
| I15 | $16_{15}$ | $102_5$ | $140B_7$ | $140C_1$ | $140D_0$ |
| I16 | $16_{16}$ | $102_6$ | $140B_1$ | $140C_0$ | $119D_0$ |
| I17 | $16_{17}$ | $102_7$ | $140B_0$ | $119C_0$ | $119D_1$ |
| I18 | $16_{18}$ | $102_8$ | $119B_0$ | $119C_1$ | $140D_4$ |
| I19 | $16_{19}$ | $102_9$ | $119B_1$ | $141C_0$ | $140D_5$ |

FIGURE 18A

| Switch Matrix for Quadrant 100B QUADRANT 100B INPUT LINE (Figs. 10 and 16) | INPUT SET (Fig. 16) | MULTIPLEXER INPUT LINES FROM MACROCELLS | | |
|---|---|---|---|---|
| I10 | $16_{10}$ | $102_0$ | $141C_0$ | $140D_5$ | $140A_3$ |
| I11 | $16_{11}$ | $102_1$ | $141C_1$ | $140D_3$ | $140A_2$ |
| I12 | $16_{12}$ | $102_2$ | $140C_3$ | $140D_2$ | $141A_2$ |
| I13 | $16_{13}$ | $102_3$ | $140C_2$ | $140D_6$ | $141A_3$ |
| I14 | $16_{14}$ | $102_4$ | $141C_2$ | $140D_7$ | $140A_1$ |
| I15 | $16_{15}$ | $102_5$ | $141C_3$ | $140D_1$ | $140A_0$ |
| I16 | $16_{16}$ | $102_6$ | $140C_1$ | $140D_0$ | $119A_0$ |
| I17 | $16_{17}$ | $102_7$ | $140C_0$ | $119D_0$ | $119A_1$ |
| I18 | $16_{18}$ | $102_8$ | $119C_0$ | $119D_1$ | $141A_1$ |
| I19 | $16_{19}$ | $102_9$ | $119C_1$ | $140D_4$ | $141A_0$ |

FIGURE 18B

| Switch Matrix for Quadrant 100C QUADRANT 100C INPUT LINE (Figs. 10 and 16) | INPUT SET (Fig. 16) | MULTIPLEXER INPUT LINES FROM MACROCELLS | | |
|---|---|---|---|---|
| I10 | $16_{10}$ | $102_0$ | $140D_4$ | $141A_1$ | $140B_3$ |
| I11 | $16_{11}$ | $102_1$ | $140D_5$ | $140A_3$ | $140B_2$ |
| I12 | $16_{12}$ | $102_2$ | $140D_3$ | $140A_2$ | $140B_6$ |
| I13 | $16_{13}$ | $102_3$ | $140D_2$ | $141A_2$ | $140B_7$ |
| I14 | $16_{14}$ | $102_4$ | $140D_6$ | $141A_3$ | $140B_1$ |
| I15 | $16_{15}$ | $102_5$ | $140D_7$ | $140A_1$ | $140B_0$ |
| I16 | $16_{16}$ | $102_6$ | $140D_1$ | $140A_0$ | $119B_0$ |
| I17 | $16_{17}$ | $102_7$ | $140D_0$ | $119A_0$ | $119B_1$ |
| I18 | $16_{18}$ | $102_8$ | $119D_0$ | $119A_1$ | $140B_4$ |
| I19 | $16_{19}$ | $102_9$ | $119D_1$ | $141A_0$ | $140B_5$ |

FIGURE 18C

| Switch Matrix for Quadrant 100D QUADRANT 100D INPUT LINE (Figs. 10 and 16) | INPUT SET (Fig. 16) | MULTIPLEXER INPUT LINES FROM MACROCELLS | | |
|---|---|---|---|---|
| $I10$ | $16_{10}$ | $102_0$ | $141A_0$ | $140B_5$ | $140C_3$ |
| $I11$ | $16_{11}$ | $102_1$ | $141A_1$ | $140B_3$ | $140C_2$ |
| $I12$ | $16_{12}$ | $102_2$ | $140A_3$ | $140B_2$ | $141C_2$ |
| $I13$ | $16_{13}$ | $102_3$ | $140A_2$ | $140B_6$ | $141C_3$ |
| $I14$ | $16_{14}$ | $102_4$ | $141A_2$ | $140B_7$ | $140C_1$ |
| $I15$ | $16_{15}$ | $102_5$ | $141A_3$ | $140B_1$ | $140C_0$ |
| $I16$ | $16_{16}$ | $102_6$ | $140A_1$ | $140B_0$ | $119C_0$ |
| $I17$ | $16_{17}$ | $102_7$ | $140A_0$ | $119B_0$ | $119C_1$ |
| $I18$ | $16_{18}$ | $102_8$ | $119A_0$ | $119B_1$ | $141C_0$ |
| $I19$ | $16_{19}$ | $102_9$ | $119A_0$ | $140B_4$ | $141C_1$ |

FIGURE 18D

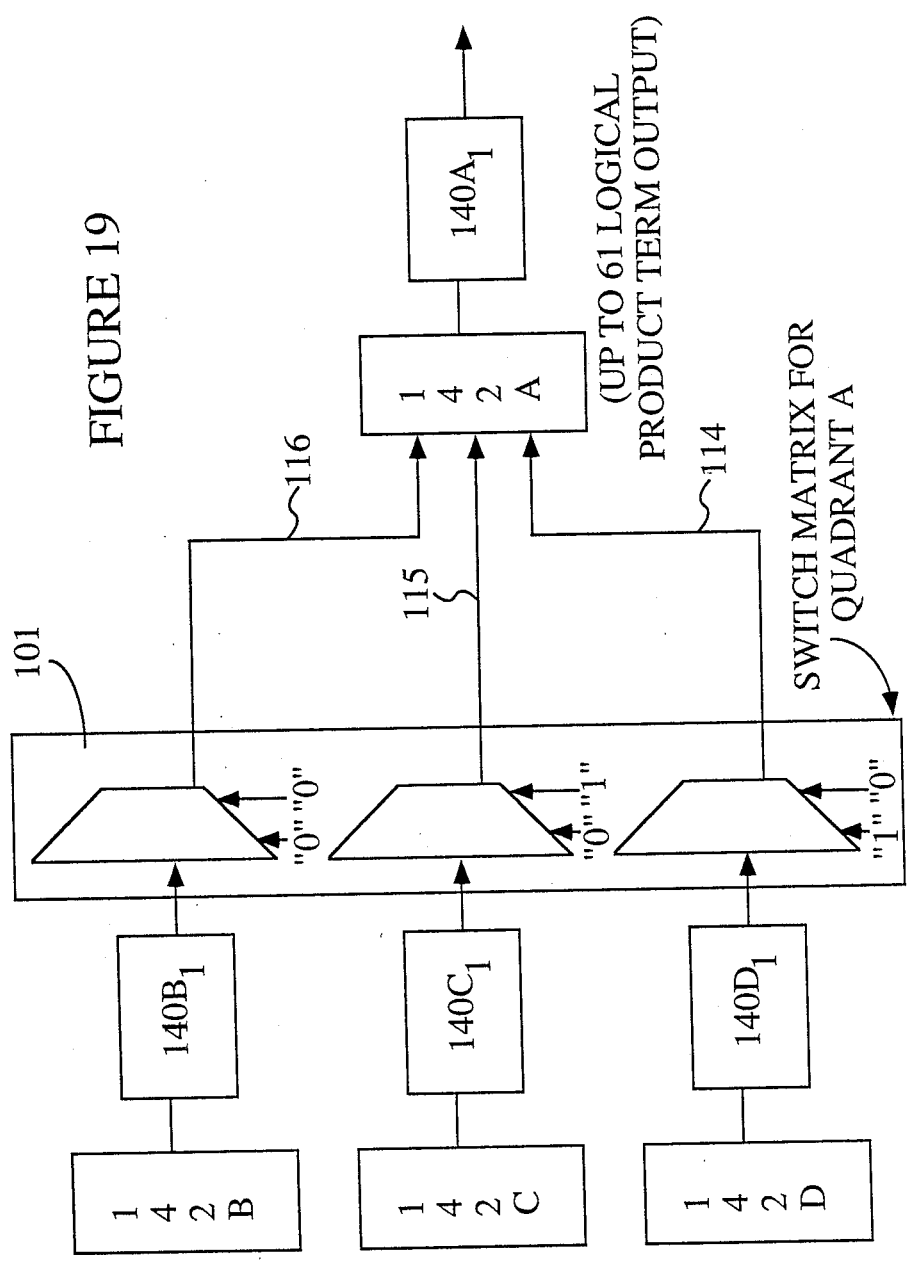

FLEXIBLE, PROGRAMMABLE CELL ARRAY INTERCONNECTED BY A PROGRAMMABLE SWITCH MATRIX

CROSS REFERENCE

This application is a continuation-in-part of commonly assigned U.S. Pat. Application Ser. No. 178,707, entitled "Multiple Array Customizable Logic Array," of Mr. Om Agrawal filed on Apr. 7, 1988, which was a continuation of U.S. Pat. Application Ser. No. 06/717,640, entitled "Multiple Array Customizable Logic Array," of Mr. Om Agrawal, filed on Mar. 29, 1985, which issued as U.S. Pat. No. 4,742,252 on May 3, 1988.

BACKGROUND OF THE INVENTION

1. Field of the Invention

This invention relates to programmable, integrated circuit logic devices arranged in interrelating groups or cells of logic components and interconnectable by a user-programmable switch matrix.

2. Description of the Prior Art

Several integrated circuit packages containing a programmable chip, which permits alternative implementation of logic functions, are available. These integrated circuit packages include a plurality of pins, an architecture for interfacing the pins with the input and output leads of the circuit on the programmable chip, and another architecture for interfacing the pins and auxiliary circuits on the chip which are used to configure the programmable chip into a user selected circuit. Thus, these field programmable logic devices permit the user to program or modify the functions on an integrated circuit chip with readily available equipment so as to configure the logic function performed by the chip to that desired by the user. However, the prior art programmable logic arrays (PLAs), programmable logic devices (PLDs) and programmable gate arrays, impose constraints on the user in exchange for field programmability.

In programmable logic arrays, which are often employed for random logic networks, data routing, code converters, instruction decoders, and other functions, an array of logic AND gates and logic OR gates is provided which can be programmed for a user specified function. Each output function (output signal) of a programmable logic array is the sum (OR gate output signal) of selected products (AND gate output signals) and each product (AND gate output signal) is the product of selected input signals. Programming is accomplished by providing a programmable array or matrix between the circuit input lines and the AND gate input lines and between the output lines of the AND gates and the input lines of the OR gates, respectively. The PLA is programmed by blowing or not blowing fusible links interconnecting the conductors of the arrays.

In another embodiment, the output lines from subgroups of AND gates of the PLA are non-programmably connected to the input lines of an OR gate. A programmable array logic (PAL) device such as this is disclosed in U.S. Pat. No. 4,124,899 and incorporated herein by reference. The PAL design affords a reduction in the size of the integrated circuit chip which allows an increase in production yields and a lowering of production costs over a conventional PLA.

To further enhance the flexibility of a PAL device or a PLA device, each output signal from the OR gate array is processed by a programmable means which lets the user select either a registered output signal or a combinatorial output signal. Further, the output signal can be configured as either an active high or an active low signal. An example of an output macrocell 10, used in the prior art on an output line 11 of either a PLA or a PAL circuit, is shown in FIG. 1 Output line 11 from a programmable logic circuit is connected to a D input terminal of register 12 as well as a first input line 13 of a programmable multiplexer 19. The Q output terminal of register 12 drives a second input line 14 of multiplexer 19. The output signal from multiplexer 19, which is determined by the state of fuse 20 on line 21, drives a first input terminal of an exclusive OR gate 25. The power supply voltage is provided through a resistor 31 to the input select line 21 of multiplexer 19 and to a first end of fuse 20. The second end of fuse 20 is grounded. Accordingly, if fuse 20 is left intact, a logical zero signal is applied to input select line 21. However, if fuse 20 is blown, the signal on the input select line 21 is a logical one. Therefore, multiplexer 19 couples either the signal on line 13 or the signal on line 14 to output line 26.

The output signal from exclusive OR gate 25 is determined by fuse 23. If fuse 23 is left intact, then a logical zero is supplied to the second input terminal of exclusive OR gate 25 and the signal on line 26 is not inverted by gate 25. Conversely, if fuse 23 is blown, a logical one is provided to the second input terminal of exclusive OR gate 25 and exclusive OR gate 25 inverts the signal on line 26. Line 27 is used to tristate exclusive OR gate 25.

Output macrocell 10 also has means to provide a feedback signal to a logic circuit on line 17 of programmable multiplexer 18. Programmable multiplexer 18 has a first input line 22 connected to output line 25 of Exclusive OR gate 25 and a second input line 15 connected to $\overline{Q}$ output terminal of register 12. The signal on input select line 16 of multiplexer 18 is controlled by fuse 20, as previously described for multiplexer 19. Multiplexer 18 has three signal sources: (1) an inverted registered output signal from register 12; (2) an input signal on pin 30; or, (3) a signal from exclusive OR gate 25. If the signal on line 27 tristates exclusive OR gate 25, then an input signal on pin 30 is passed over lines 29, 22 to the first input terminal of multiplexer 18. Alternatively, the output signal of exclusive OR gate 25 is passed over lines 28, 22 to the first input terminal of multiplexer 18. Output line 17 of multiplexer 18 thus provides either an inverted or uninverted registered feedback signal, an inverted or uninverted combinatorial feedback signal, or an input signal to the logic circuit to which output macrocell 10 is connected. Output macrocell 10 is discussed in further detail in U.S. Pat. No. 4,717,912, which is incorporated herein by reference.

A disadvantage of monolithic PAL circuits is that to increase the number of input lines to the programmable AND logic array requires increasing the array size in proportion to the number of input lines. Accordingly, the size of a PAL circuit is limited by both integrated circuit technology and the cost of producing such a circuit. Also, the fuses used to program the logic array can only be programmed once and so the logic array cannot be fully tested prior to programming by the user.

The functionality of a conventional PAL device is determined by the input/output capability, the number of registers and the distribution of products terms of the device A conventional PAL device suitable for both wide gating combinational functions, such as address decoding, multiplexing and demultiplexing, and sequential functions such as wide state machines and shift-register type functions, requires both wide input capability, i.e., a number of input lines, and a reasonably large register capability. Increasing the input capability of a conventional monolithic PAL device results in a larger array size, as described previously, which in turn results in a larger silicon die, higher cost, slower performance, and ineffective array utilization.

Erasable programmable logic devices (EPLDs) overcome the one time programmability limitation of fused logic arrays and use a segmented structure to enhance performance. One prior art EPLD is shown as a block diagram in FIG. 2a. The device has forty-eight input-/output (I/O) pins 40, twelve dedicated input pins 41, and four pins 42 which may be used either as clock input pins or additional dedicated input pins. The signal on each I/O pin 40 is either provided to a macrocell 43 as an input signal or generated by a macrocell 43 as an output signal. Macrocells 43 are divided into three general types, a general macrocell 43, a global macrocell 60, and an enhanced macrocell 61.

General macrocell 43, as illustrated in FIG. 2c, provides an input signal from I/O pin 40 to local bus 44 and programmable AND array 46 through feedback select element 47. Alternatively, a signal generated from the eight product signals on lines 49a–49h from programmable AND array 46 by I/O architecture control cell 48 is passed through buffer 49 to I/O pin 40 and through feedback select element 47 to local bus 44 and programmable AND array 46. Thus, AND array 46 is provided with either local feedback or an input signal on pin 40, but not both. In addition, programmable AND array 46 receives (1) input signals from the macrocells on the local quadrant bus 44, (2) feedback signals from global bus 45 from macrocells $60A_0$–$60A_3$, $60B_0$–$60B_3$, $60C_0$–$60C_3$ and $60D_0$–$60D_3$, and (3) signals on the sixteen dedicated input pins 41, 42 as described previously. Local macrocell programmable AND array 46 is limited to eight product terms and I/O architecture control cell 48 provides a means for generating either combinatorial or registered output signals, as previously described.

A global macrocell 60 is shown in FIG. 2b. The programmable AND array 46 of global macrocell 60 is identical to programmable AND array 46 of general macrocell 43. However, the input signals to programmable AND array 46 of global macrocell 60 include both the signal from I/O pin 40, which is provided directly to global bus 45, and the signal from I/O architecture control cell 48, which is provided to local bus 44. Enhanced macrocells 61 (not shown) are utilized for critical combinatorial logic delay paths since these cells have increased speed performance through the logic array.

In another EPLD (FIG. 3) a programmable logic array 50 is configured as two symmetrical parts 50A, 50B with each half having 14 macrocells 51, three I/O architecture control cells 53 and one buried macrocell 52. Buried macrocell 52 is similar to group I/O architecture control cells 51 except buried macrocell 52 is not connected to an I/O pin 40 and therefore is used only to interface two macrocells with a global bus and a local bus.

In this embodiment, a selected group of macrocells, 51h–51k, 51x–51aa can share a total of sixteen additional product terms from the logic array. However, the sharing must occur between adjacent pairs of macrocells so that the additional product terms are available only to one side of the device at a given time.

The electrical programmable logic devices are implemented using CMOS technology which reduces power consumption over equivalent bipolar devices without sacrificing speed performance. Also, the EPLD technology permits factory testing of all elements within the EPLD, unlike a fuse blown programmable device which can only be tested for certain configurations in the factory. The programmable connections in an EPLD typically use a CMOS floating gate architecture that is erased using a short wavelength ultraviolet (UV) light.

While an EPLD offers advantages over fuse programmable devices, the UV EPLD can be inadvertently erased if the device is left in either sunlight or fluorescent lighting. Further, the number of programmable gates, the utilization of the components in the device, and the flexibility of the device are limited by the geometry of the device. Specifically, while the devices illustrated in FIGS. 2 and 3 utilize a segmented PAL approach, each of the PAL structures is relatively large. The size of the structure results in lower performance in comparison to a smaller structure and also inefficient utilization of the array. In larger arrays, if only one or two input lines of a particular product term are used or if only one or two product terms of a particular output macrocell are used, then the remaining input lines or the remaining product terms are essentially wasted or unused.

The EPLD in FIG. 2 has 48 registers in a 68-pin package and the EPLD in FIG. 3 has 28 registers in a 40-pin package. Therefore, the number of registers in comparison to the number of package pins is limited and consequently the functionality of these devices for registered applications is limited. Hence, both the speed and the functionality of these EPLDs are compromised by the architecture of the devices.

An alternative to a segmented programmable logic array is a programmable gate array wherein configurable logic blocks 70, as shown in FIG. 4a, are interfaced through switch matrices, as shown in FIG. 4b. Each configurable logic block 70 has a combinatorial logic cell 73 with four input lines 70A, 70B, 70C, 70D and two output lines 70G, 70H, a clock input line 70K, a storage element 71, and several programmable multiplexers for signal routing within the logic block. Combinational logic cell 73 uses a table look-up memory to implement Boolean logic functions of up to four variables. The programmable multiplexers utilize volatile memory cells in conjunction with pass transistors to provide configuration signals for the multiplexer. Each switch matrix 72 interfaces four horizontal metal segments with five vertical metal segments. The switches in the switch matrices are pass transistors that are controlled by a configuration bit in a volatile memory cell.

The programmable gate array circuit provides 112 flip-flops in a 68-pin PLCC package and 174 flip-flops in an 84-pin PGA package. Thus, while these devices significantly increase the number of registers over the EPLDs, described above, the devices are inefficient for wide gating applications because each configurable logic block 73 is relatively small. Therefore, an application, which requires wide gating, requires cascading in series of multiple configurable logic blocks which in turn results in reduced performance.

The semiconductor industry is consistently driven to offer higher integration, higher performance silicon devices for increased performance, lower cost system applications. For a high density PAL-like device achieving higher speed is extremely critical. However, a high density PAL device which provides a high speed programmable array and a large register capability is presently unavailable. Further, as described above, the available prior art programmable logic devices fail to achieve an optimum balance of functionality, silicon die size and performance.

SUMMARY OF THE INVENTION

The programmable logic device (PLD) of this invention is a high density segmented PAL-like device which gives an optimum balance between functionality, silicon die size, and performance. The high density programmable logic device has two or more programmable logic circuits (cells) interconnected by a switch matrix. In one embodiment, four logic circuits contained in a single integrated circuit are interconnected by a switch matrix. This segmented logic structure provides high speed performance while maintaining greater fuctionality than was available in prior art programmable logic devices.

The switch matrix has a bank of programmable multiplexers for each programmable logic circuit in the PLD. The input signals to the multiplexers in each bank are selected from input signals on the pins of the integrated circuit package containing the integrated circuit of this invention and output signals from the programmable logic circuits. Hence, the switch matrix functions as both an input means and a feedback means to the various logic circuits. Each of the multiplexers in the switch matrix has configuration architecture cells which provide input select signals to the multiplexer. The input select signals configure the multiplexer so that one of the signals on an input line to the multiplexer is passed through the multiplexer to an output line of the multiplexer.

The functionality and performance of the programmable logic device of this invention is further enhanced by having an input logic cell connected to each dedicated input pin and each input/output (I/O) pin of the PLD's integrated circuit package. Each input logic cell couples a signal from the associated input or I/O pin to the switch matrix and to a programmable feedback logic cell. The input logic cell generates either a combinatorial or a registered/ latched signal in response to a signal on the pin to which it is connected.

For each programmable logic circuit in the PLD, each output line of a selected set of output lines of the programmable logic circuit is coupled to an input/output pin by an output macrocell. A signal from the output macrocell is also coupled to a feedback cell and to the switch matrix. Each output macrocell generates either a combinatorial or a registered/latched signal in response to a signal on the output line of the programmable logic circuit and includes means for controlling the polarity of the output signal from the output macrocell. Further, each output macrocell has a buffer in the output line of the macrocell which may be tristated so that the input/output pin to which the output macrocell is connected functions as an input pin. Alternatively, the buffer may be enabled so that the input/output pin functions as an output pin.

Each feedback macrocell is a programmable multiplexer which in response to an input select signal or input select signals passes one of the signals on the input lines to the programmable multiplexer through the multiplexer to an input line of a programmable logic circuit.

The programmable logic device of this invention is further enhanced in that each programmable logic circuit drives one or more buried state macrocells. Each buried state macrocell couples an output line of the logic circuit to the switch matrix and provides a signal which is fed back to the logic circuit. The buried state macrocells permit greater utilization of the resources of the logic circuit because the buried state macrocells provide a means for processing additional signals without utilizing an input/output pin.

The number of I/O pins, dedicated input pins, input lines to each logic circuit, output lines from each logic circuit, logic circuits, feedback cells, output logic macrocells, buried macrocells have been selected to provide a high speed PLD with a new level of functionality in a small package. The switch matrix further enhances the functionality of the PLD by providing a means for bit rotating between the various logic circuits of the PLD.

BRIEF DESCRIPTION OF THE DRAWINGS

FIG. 18 illustrates the input lines for each multiplexer in the switch matrix.

FIG. 19 illustrates bit rotating with the switch matrix of this invention.

Figure 1:
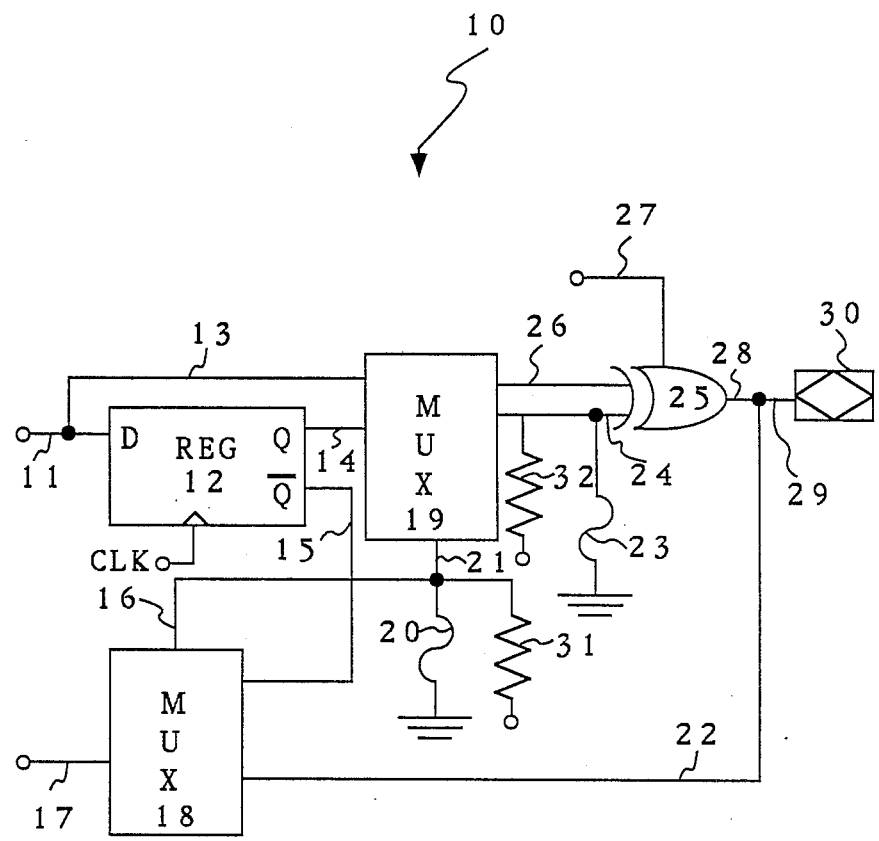
FIG. 1 is a block diagram of a prior art input/output macrocell for use with a PLA or a PAL circuit.

In the drawings, similar items have the same number. Further, a number may represent several similar devices. For example, the base number 140 represents a group of macrocells of this invention. The number 140A represents a specific set of macrocells within the group of macrocells 140 and the number 140A$_0$ represents a specific macrocell in the set of macrocells 140A. Accordingly, a base number is a shorthand notation representing several similar devices, lines, components or other related objects.

DETAILED DESCRIPTION

Figure 5:
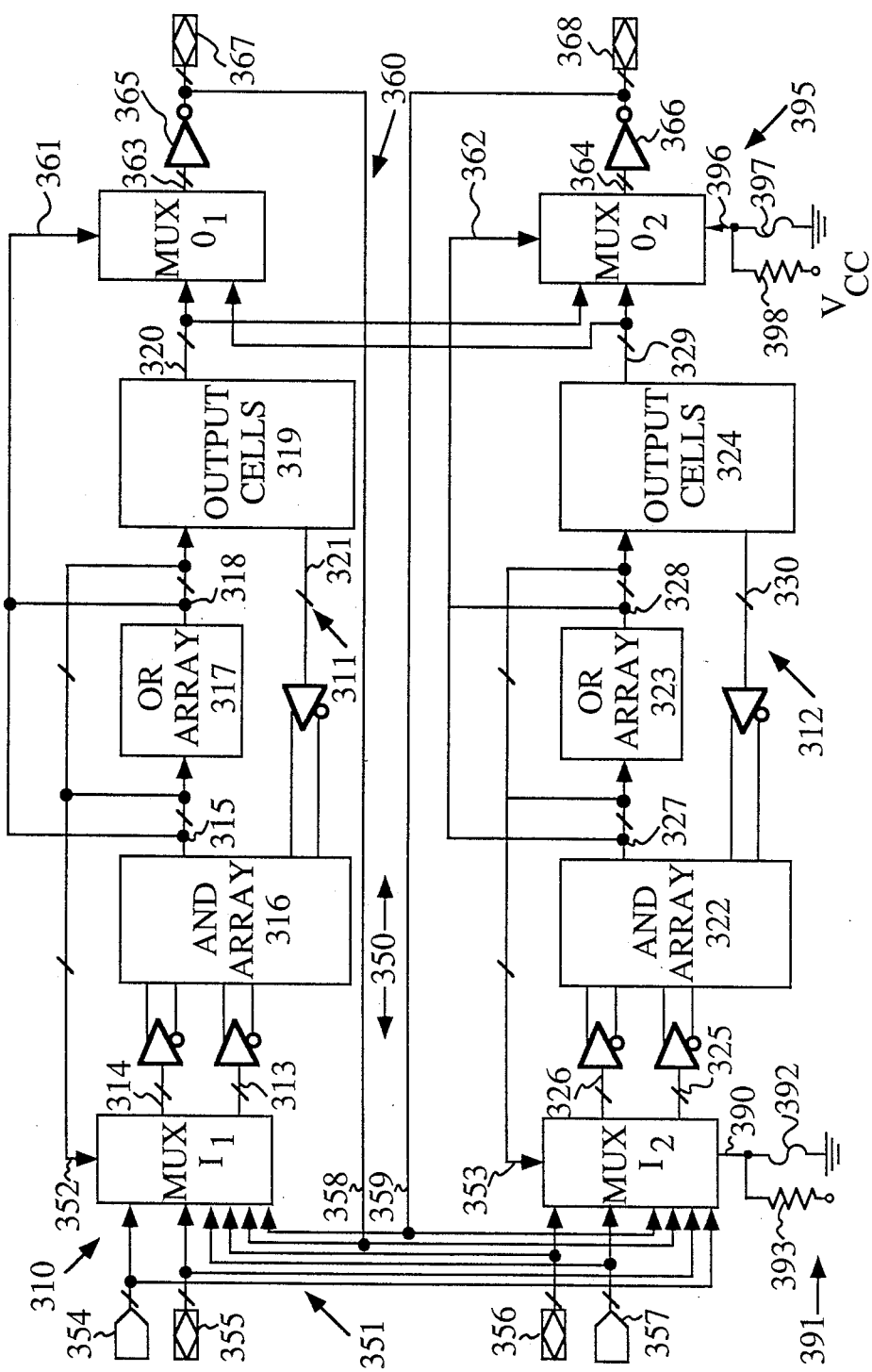
FIG. 5 is a schematic diagram of an integrated circuit according to one preferred embodiment of the present invention.

FIG. 5 shows a diagram of the architecture of a multiple array programmable logic device 310 according to the present invention. The device 310 includes a first programmable array means 311 for receiving a plurality of first input terms (signals) and generating a plurality of first output terms (signals) and a second programmable array means 312 for receiving a plurality of second input terms and generating a plurality of second output terms.

First programmable array means 311 includes an AND array 316 that receives the plurality of first input terms across line 313 and preferably one clock input term across line 314 for sequential state machine functions and generates a plurality of first product terms across line 315 in response to the first input terms and the clock terms as programmed by the user. AND array 316 is preferably a field programmable AND array such as those described in the publication entitled *Programmable Array Logic Handbook*, published by Advanced Micro Devices, Inc. (1988), and available through Advanced Micro Devices, Inc., Sunnyvale, Calif. Of course, other embodiments of the AND array including a fixed AND array may be utilized as desired.

In first programmable array means 311, the first product terms on line 315 are supplied to an OR array 317. The OR array 317 generates a plurality of first sum-of-products terms on line 318 in response to the first product terms on line 315. The OR array may be a fixed OR array or a programmable OR array as described in the above-mentioned *Programmable Array Logic Handbook*.

The first sum-of-products terms on line 318 are supplied to a plurality of output cells 319 which generate output logic terms on line 320 for first programmable array means 311. Further, output cells 319 may generate feedback terms on line 321 which are fed back to the AND array 316 and utilized in the generation of the first product terms 315 as programmed by the user.

Second programmable array means 312 consists of components similar to first programmable array means 311. Thus, second programmable array means 312 includes AND array 322, which may be either fixed or programmable, and OR array 323, either fixed or programmable, and a plurality of output cells 324. Second programmable array means 312 receives as input a plurality of second input terms on line 325 and preferably one clock input term on line 326 for sequential state machine functions. The output signal of AND array 322 of second programmable array means 312 includes a plurality of second product terms 327. The output signal of OR array 323 includes a plurality of second sum-of-products terms on line 328. The plurality of second sum-of-products terms is passed through the output cells 324 and supplied as a plurality of second output terms on line 329. The output cells 324 may generate feedback terms across line 330 for supply back to AND array 322 for use in generation of the second product terms on line 327 as programmed by the user.

It should be appreciated that first programmable array means 311 and second programmable array means 312 may preferably be individually configured to include a programmable AND array with a fixed OR array, a fixed AND array with a programmable OR array, a programmable AND array with a programmable OR array or other programmable array configuration generating sum-of-products terms to facilitate conventional sum-of-products logic design.

Output cells 319 and output cells 324 for first and second programmable arrays means 311, 312, respectively, consist preferably of output cells such as those disclosed in the prior U.S. patent application entitled DYNAMICALLY CONTROLLABLE OUTPUT LOGIC CIRCUIT, Ser. No. 656,109, filed Sept. 28, 1984, or any of the output configurations disclosed in the *Programmable Array Logic Handbook* referred to above.

Device 310 includes a means 350 for selectively interconnecting at least subsets of the plurality of first input terms from lines 313, 314, the plurality of first output terms from lines 320, the plurality of second input terms from lines 325, 326 and the plurality of second output terms from lines 329. Means 350 for selectively interconnecting allows device 310 to be configured so that first programmable array means 311 is connected in series with second programmable array means 312, or first programmable array means 311 is connected in parallel with second programmable array means 312 or any combination of interconnections. A particular embodiment may interconnect subsets of the input and output terms, so that all or any portion of the plurality of first input terms, plurality of first output terms, plurality of second input terms, and plurality of second output terms may be routed as desired to provide the flexibility desired by a manufacturer.

In the embodiment shown in FIG. 5, means 350 for selectively interconnecting includes an input multiplexing means 351 (MUX I$_1$, MUX I$_2$), responsive to an input select signal on lines 352, 353, for selecting and supplying a set of signals as the plurality of first input terms or as the plurality of second input terms, from a plurality of signals. Input multiplexing means 351 (FIG. 5) selects from the plurality of signals including a first set of clock signals supplied from input pins 354, a first set of input signals externally supplied to the chip from a first set of input/output pins 355, a second set of input signals supplied from a second set of input/output pins 356 (these I/O pins are typically driven by an output signal from another device (not shown) which is similar to device 310), a second set of clock signals supplied from input pins 357, and a set of output signals, generated in response to at least a subset of the plurality of first output terms from line 320 and the plurality of second output terms from lines 329, supplied across lines 358 and 359 respectively.

The input select signal on lines 352 and 353 in the preferred embodiment is supplied as at least a subset of the first and second product terms from lines 315 and 327, respectively, or at least a subset of the first and second sum-of-products terms from lines 318 and 328, respectively, or any combination of the product terms and sum-of-products terms generated by first programmable array means 311 and second programmable array means 312.

Also, as shown in FIG. 5, the input select signal may be field programmable. Thus, FIG. 5 shows an input select signal supplied on line 390 to input multiplexer MUX $I_2$ from a fuse programmable signal generator 391. The fuse programmable signal generator 391 includes a fuse 392 connected from line 390 to ground and a resistor 393 connected from line 390 to a power supply voltage $V_{CC}$. Fuse 392 is a field programmable fuse such as those described in the *Programmable Array Logic Handbook*, referred to above.

Input multiplexing means 351 in the preferred embodiment consists of a first input multiplexer MUX $I_1$, responsive to the input select signal on lines 352, for selecting a set of signals for supply as input signals on lines 313, 314, and a second input multiplexer MUX $I_2$, responsive to the input select signal on lines 353 or 390, for selecting a set of signals for supply as input term signals on lines 325, 326. In the embodiment shown, both first input multiplexer MUX $I_1$ and second input multiplexer MUX $I_2$ are supplied the same sets of signals from pins 354, 355, 356 and 357 for selection and supplying as input terms. The first input multiplexer MUX $I_1$ supplies the plurality of first input terms on lines 313, 314. The second input multiplexer MUX $I_2$ supplies the plurality of second input terms on lines 325, 326.

Means 350 for selectively interconnecting also includes an output multiplexing means 360, responsive to an output select signal on lines 361, 362, for selecting and supplying as output signals on lines 363 and 364, respectively, a set of signals selected from the plurality of signals selected from at least a subset of the plurality of first output terms from lines 320 and the plurality of second output terms from lines 329. The output signals on lines 363, 364 are supplied from integrated circuit device 310 externally through output drivers 365, 366 to sets of I/O pins 367, 368.

The output select signals on lines 361 and 362 can be generated from the first set of product terms on lines 315, second set of product terms on lines 327, first set of sum-of-products terms on lines 318, second set of sum-of-products terms on lines 328 or any combination of product terms and sum-of-product terms as suits the user.

Also, as shown in FIG. 5, the output select signal may be fuse programmable. Thus, FIG. 5 shows a fuse programmable signal generator 395 supplying an output select signal on line 396. The fuse programmable signal generator 395 includes a fuse 397 connected from line 396 to ground and a resistor 398 connected from line 396 to power supply voltage $V_{CC}$. Fuse 396 is programmable as described in the above mentioned *Programmable Array Logic Handbook*.

The output multiplexing means 360 in the embodiment shown in FIG. 5 consists of a first output multiplexer MUX $O_1$ and a second output multiplexer MUX $O_2$. First output multiplexer MUX $O_1$, responsive to the output select signal on lines 361, selects a set of signals for supply as output signals on lines 363, while the second output multiplexer MUX $O_2$, responsive to the output select signal on lines 362 or 396, selects a set of signals for supply as output signals on lines 364.

The diagram of FIG. 5 shows four sets of I/O pins, designated 355, 356, 367 and 368. Each of these sets of I/O pins may include any number of I/O pins corresponding to the number of output signals generated on lines 363 and 364 and the number of input signals supplied from the I/O pins 355, 356 as desired. It should be noted, that the four sets of I/O pins, 355, 356, 367 and 368, are not necessarily exclusive. For instance, the set of I/O pins 367 receiving output signals across line 363 from the output multiplexer MUX $O_1$ is also connected to provide input signals to the input multiplexers MUX $I_1$ and MUX $I_2$ across line 358. Thus, an architecture for a device 310 according to the present invention may be laid out in which all or any subset of the I/O pins are configured to receive output signals and/or supply input signals.

Furthermore, in the preferred embodiment, the set of clock input pins 354 and the set of clock input pins 357 may include any number of clock inputs.

In one preferred embodiment, there are two clock input pins in the first set of clock input pins 354, two clock input pins in the second set of clock input pins 357, and forty I/O pins configured to provide sets of I/O pins such as those designated 355, 356, 367 and 368.

Thus it can be seen that device 310 provides total interconnectivity of the available signals and logic terms as input terms or as output terms. This allows the user the ability to configure the device 310 such that the first programmable array means 311 operates in series with the second programmable array means 312, such as by providing the output signals from line 363 as one of the sets of signals across line 358 that is selectable by the second input multiplexer MUX $I_2$ as at least a subset of the plurality of second input terms on line 325, 326. Of course, the second programmable array means 312 may be connected in the same manner with respect to the first programmable array means 311. Alternatively, the first programmable array means 311 and the second programmable array means 312 may be connected in parallel such that each receives the same input signals as input terms on lines 313, 314 and 325, 326, respectively, such as the input signals supplied by the set of input pins 356, and each generates a plurality of output terms across lines 320 and 329, respectively, that are selectively supplied to a set of I/O pins 367, 368.

A wide variety of other interconnection architectures can be made utilizing the means 350 for selectively interconnecting according to the present invention. For instance, a subset of the output signals from lines 363 might be supplied as a part of the set of input signals selectable by second input multiplexer MUX $I_2$ across line 358. Thus, a portion of the logic terms generated by second programmable logic array means 312 would be generated in response to a series connection of first programmable logic array means 311 and second programmable logic array means 312 while others of the logic terms generated by a second programmable array means 312 would be generated in parallel with or independently from logic terms generated by first programmable array means 311. In this embodiment, for instance the I/O pins 367 receiving output terms from the first programmable array means 311 might include a fewer number of pins than I/O pins 368 supplying output signals from the second programmable array means 312. As can be seen, flexibility of the present invention is extremely valuable.

Figure 2A:
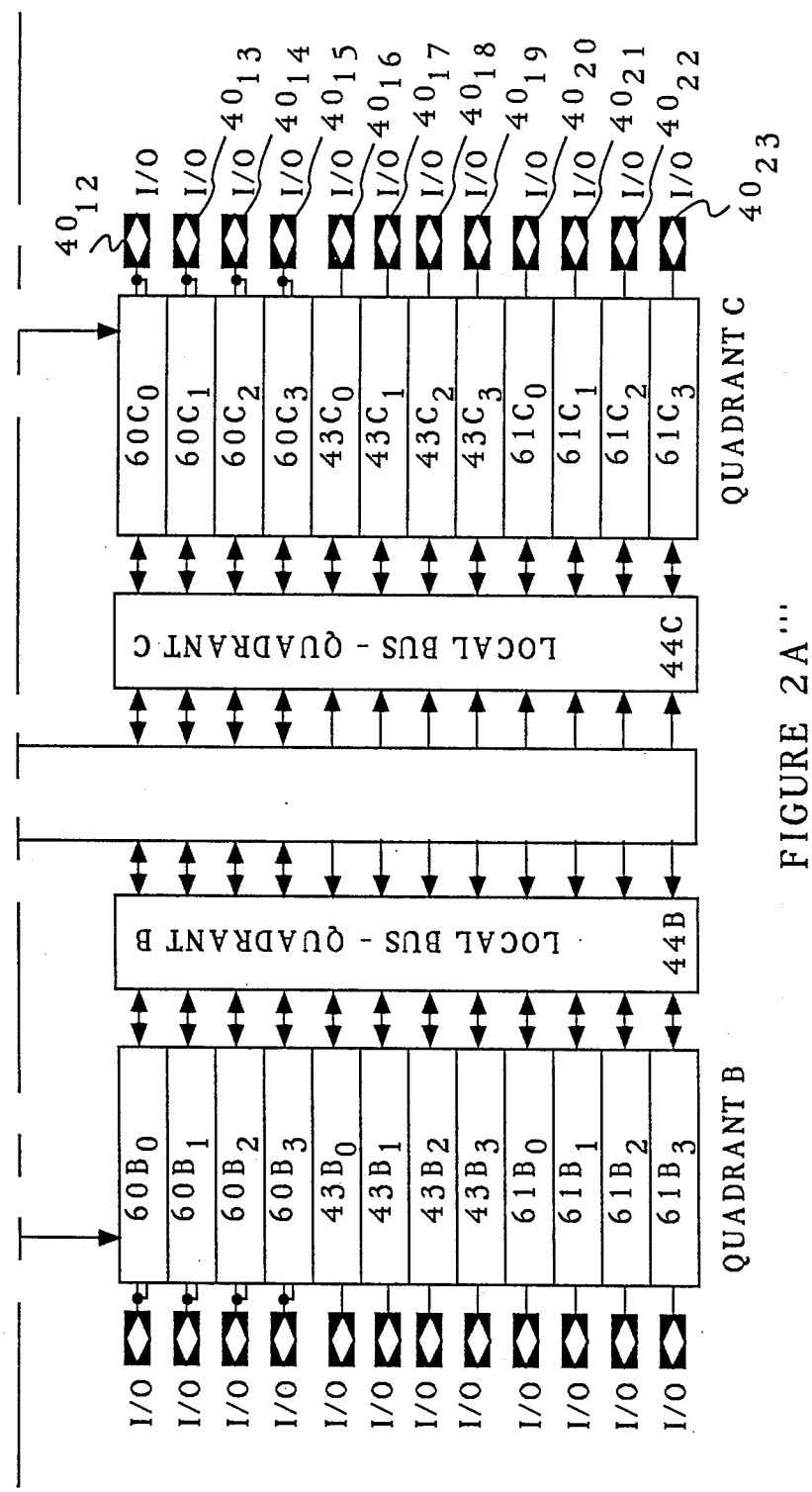
FIGS. 2a, 2b and 2c illustrate a prior art erasable programmable logic device.
Figure 2B:
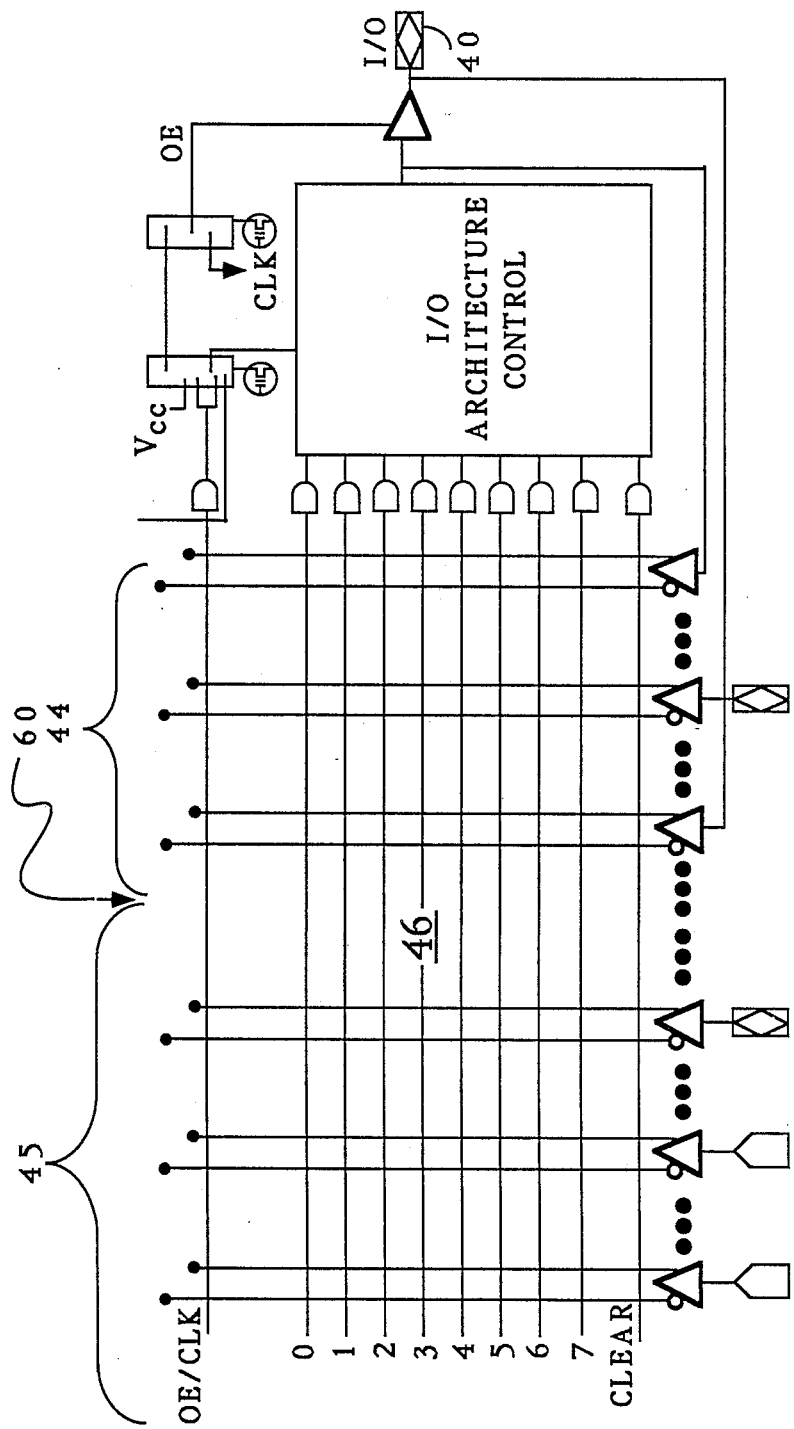
Figure 2C:
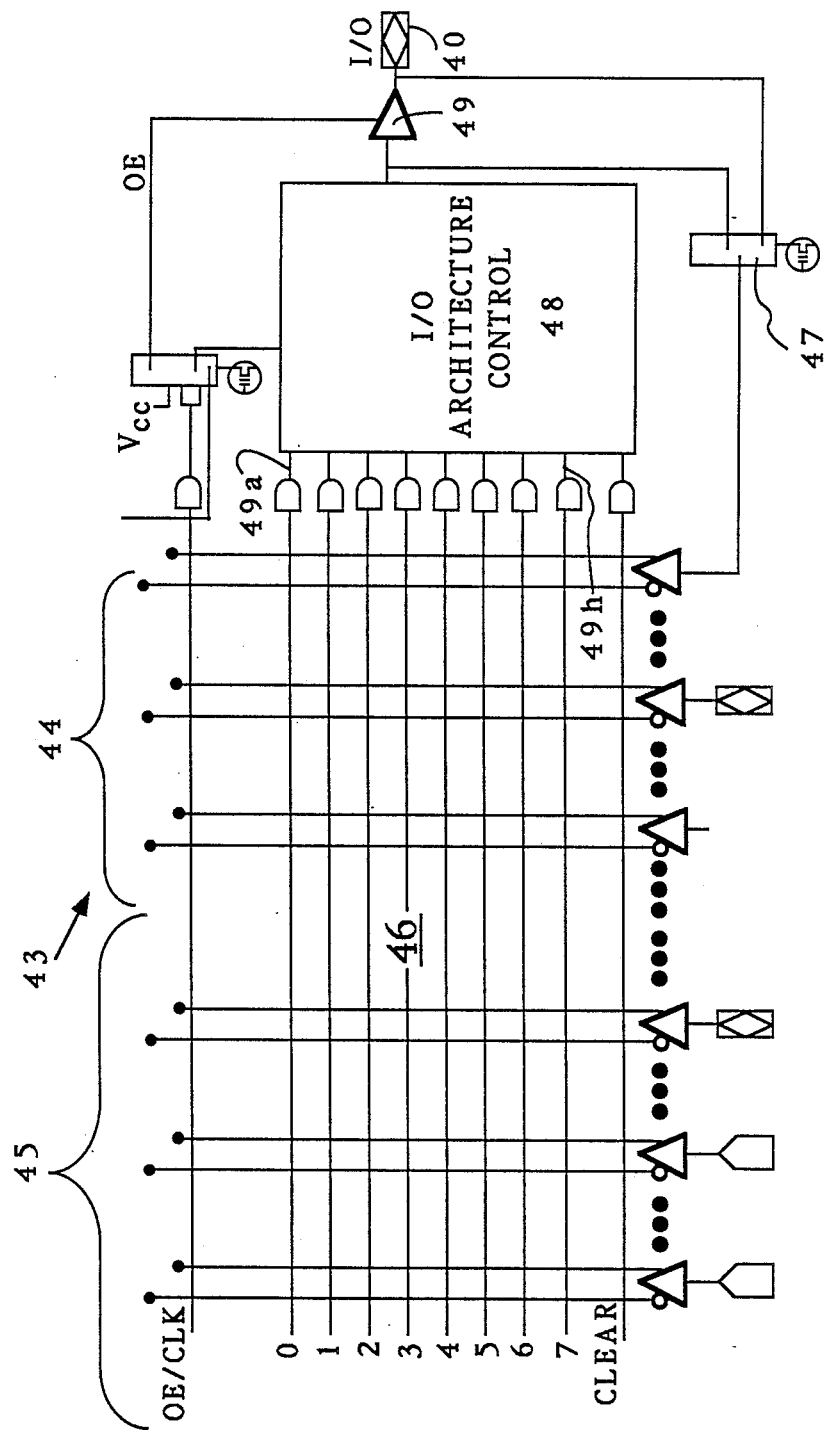
Figure 3A:
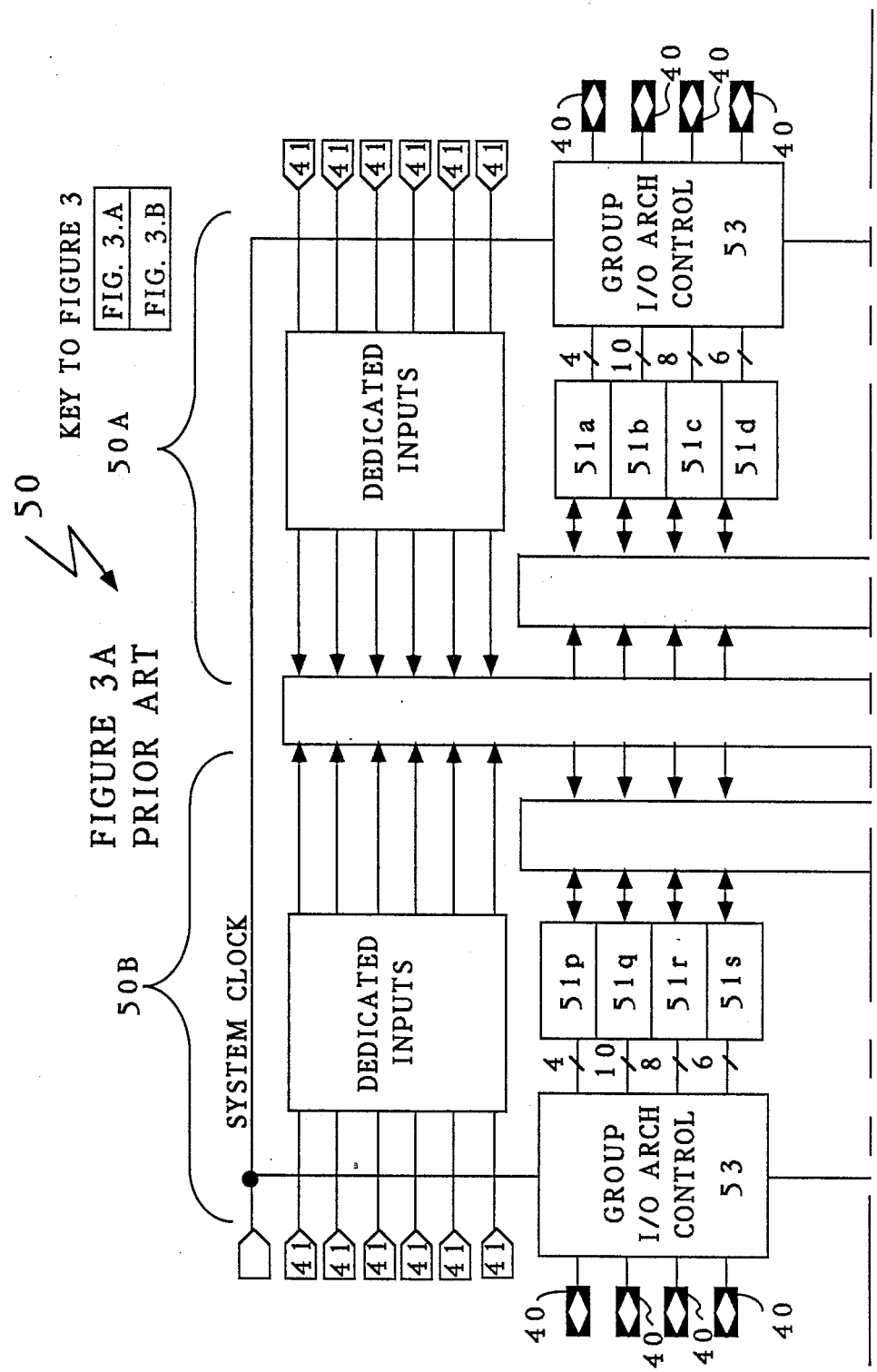
FIG. 3 is a block diagram of another prior art erasable programmable logic device.
Figure 3B:
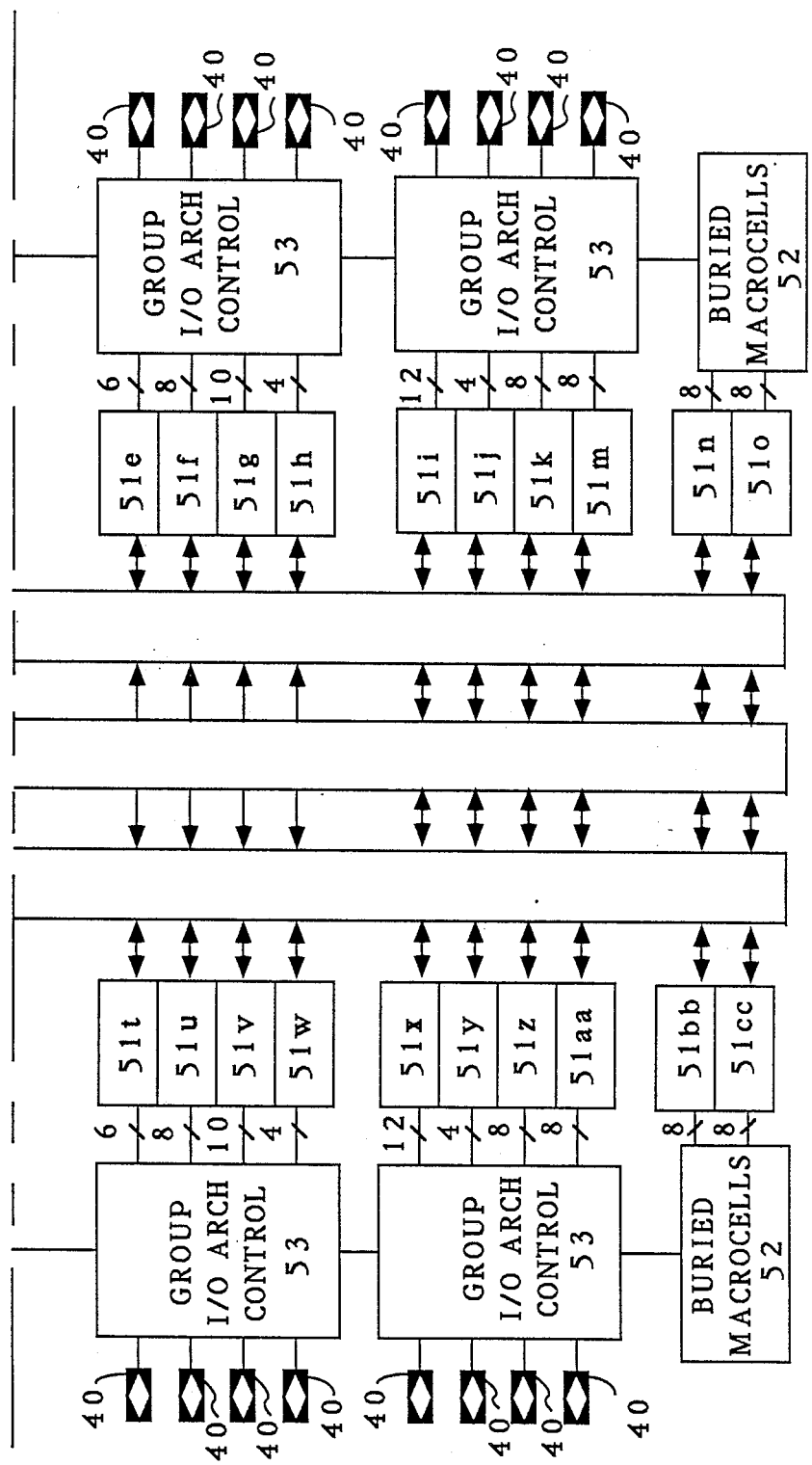
Figure 4A:
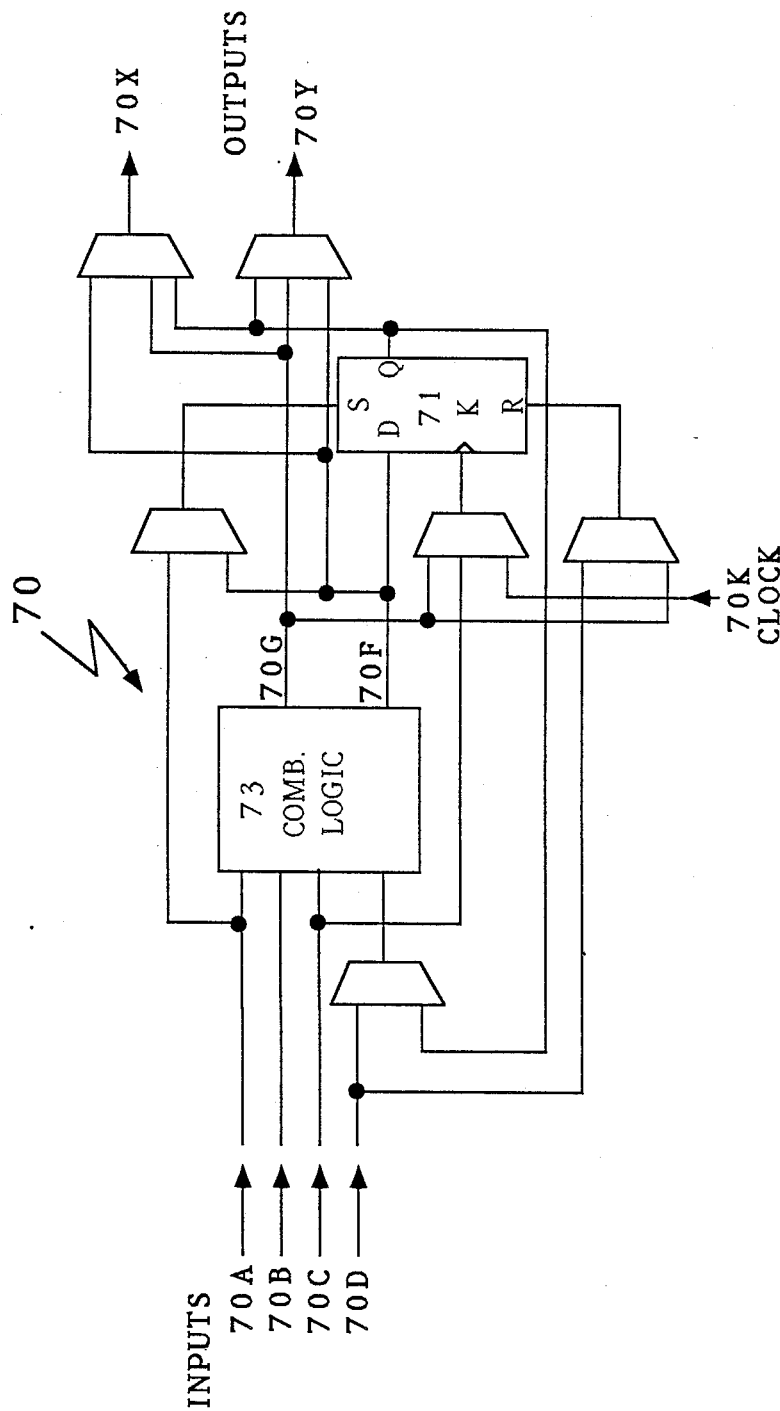
FIGS. 4a and 4b are block diagrams a prior art configurable logic block and a prior art switch matrix.
Figure 4B:
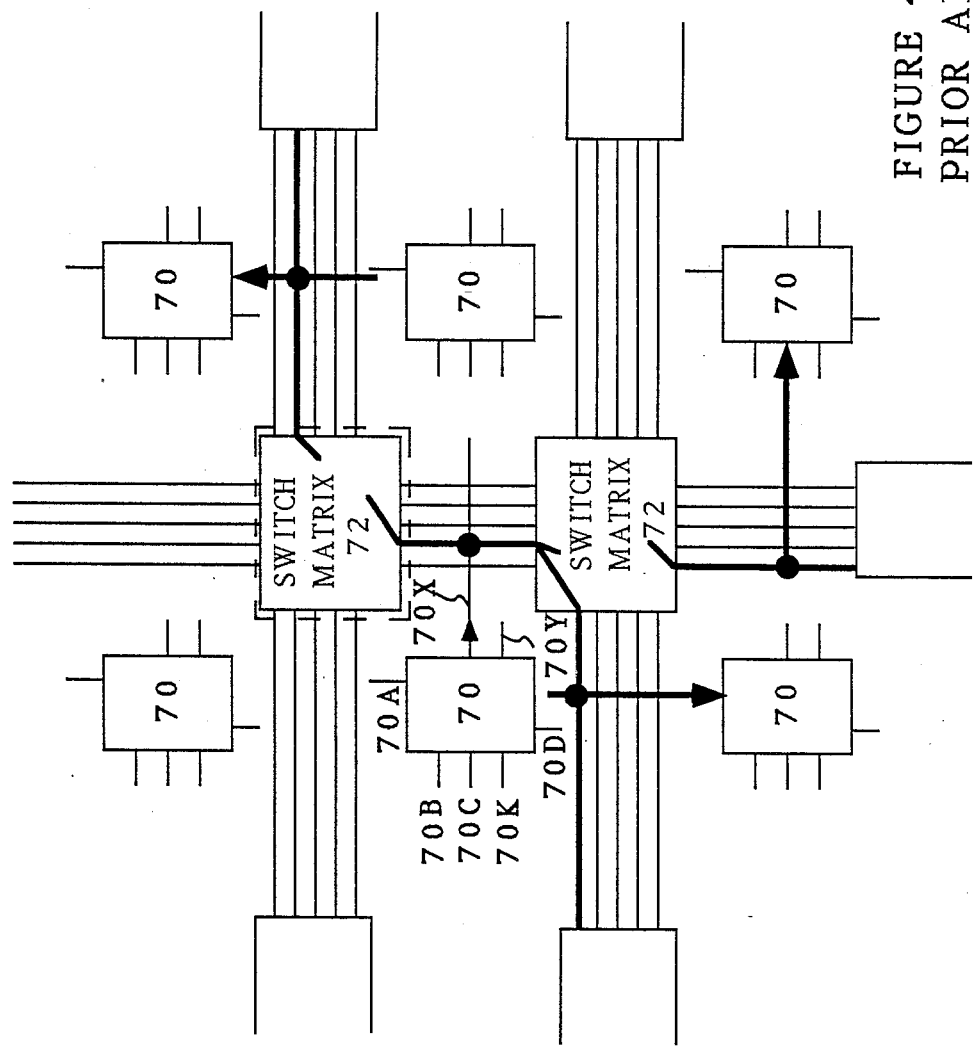

An alternate preferred embodiment of a customizable logic device 100 according to the present invention is discussed in the parent U.S. Pat. No. 4,742,252 (FIG. 2 of U.S. Pat. No. 4,742,252) and incorporated herein by reference.

Figure 6:
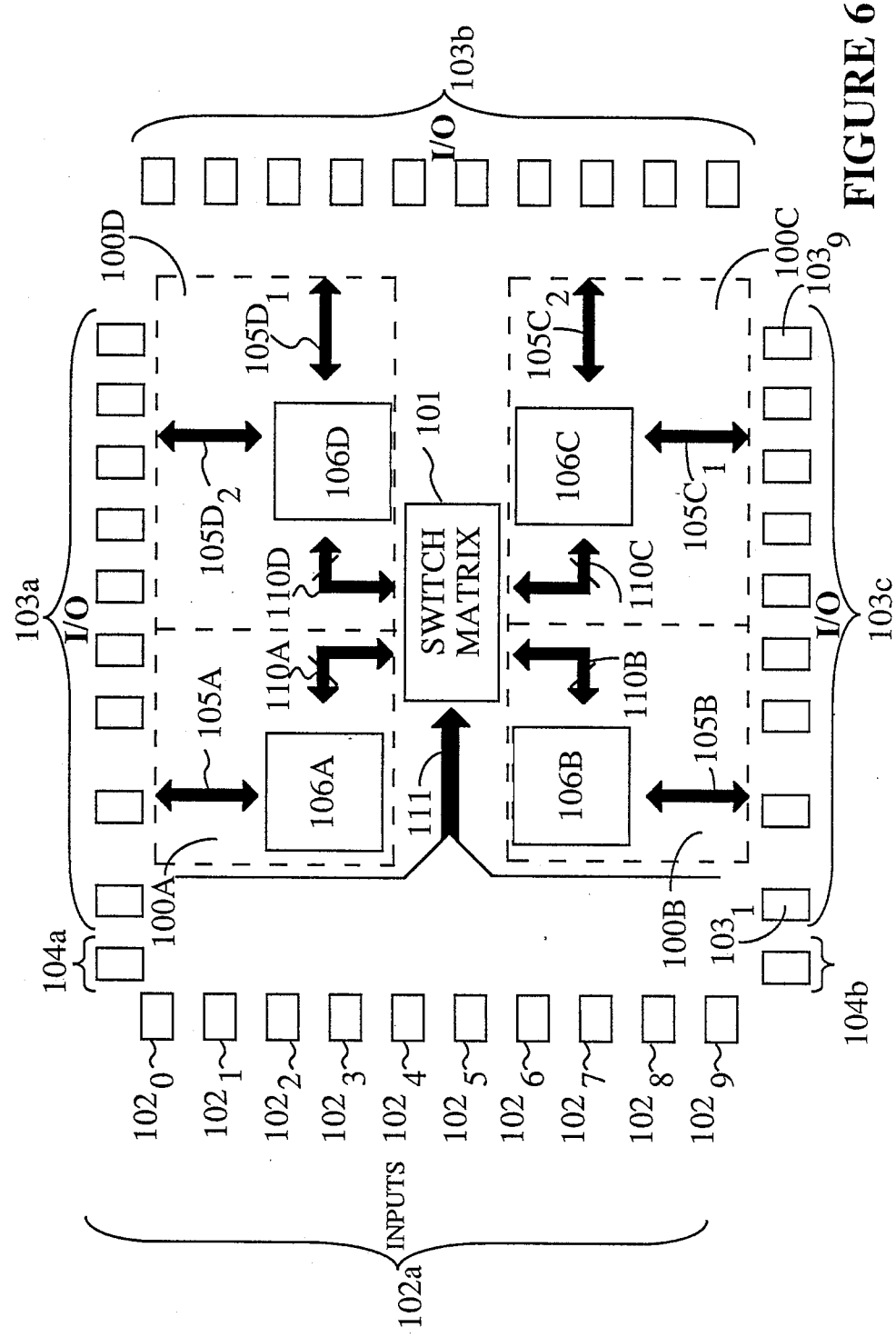
FIG. 6 is a conceptual block diagram of the programmable logic device of this invention.

In FIG. 6, an integrated circuit package containing an integrated circuit chip with four programmable logic quadrants (cells) 100A, 100B, 100C, 100D and a programmable switch matrix 101 is conceptually illustrated. Each logic quadrant 100A, 100B, 100C, 100D, contains a programmable logic circuit 106A, 106B, 106C, 106D and means for coupling 105A, 105B, 105C$_1$, 105C$_2$, 105D$_1$, 105D$_2$ each logic circuit to the integrated circuit package pins. Hence, in this embodiment, as in FIG. 5, a means for coupling input signals and feedback signals, programmable switch matrix 101 (FIG. 6), with multiple programmable logic circuits is provided.

Specifically, a first selected group of integrated circuit package pins 102a are dedicated input pins 102 that are coupled by a first coupling means 111 to switch matrix 101. Coupling means 111 has programmable combinatorial and registered/latched (registered) circuit paths from input pins 102a to switch matrix 101. A second selected group of the package pins 103a, 103b, 103c are bidirectional I/O pins 103, which are coupled to four programmable logic circuits 106A, 106B, 106C, 106D by second coupling means 105A, 105B, 105C$_1$, 105C$_2$, 105D$_1$, 105D$_2$ (105). Each of the second coupling means is programmable such that I/O pin 103 either provides an input signal to a logic quadrant or receives an output signal from a logic quadrant.

Each second coupling means 105 has programmable circuitry such that either a combinatorial input path or a registered/latched input path can be established between a package pin and a logic quadrant. The combinatorial input path passes the input signal to the input line of a logic quadrant, while the registered/latched input path passes the input signal to the input terminal of a programmable storage element, and the programmable storage element, subsequently passes a signal to the input line of a logic quadrant. Similarly, each coupling means 105 includes programmable circuitry so that selected output lines from a logic circuit are coupled to an I/O pin by either a combinatorial output path or a registered/latched output path. A third group of the integrated circuit package pins 104a, 104b are global clock input pins. The global clock input pins provide synchronous clock signals to coupling means 105, 111.

Each of the four logic circuits 106A, 106B, 106C, 106D may be a PLA circuit, a PAL circuit, a NAND-NAND circuit, or a NOR.NOR circuit for example. In one embodiment, circuits 106A, 106B, 106C, 106D are programmable AND/OR logic array based PAL circuits. Each programmable AND/OR array based circuit provides 3,200 (80×40) programmable E$^2$ cells for logic flexibility. Each quadrant has twenty input lines which drive eighty product terms. Seventy-six of the product terms are used for logic functions and the other four are used for control functions, as described more completely below. This segmented structure retains the benefits of a traditional PAL such as the wide input decoding, multiplexing and demultiplexing capability, without increasing the array proportionally to the number of input lines. Further, the array size and the coupling means have been selected so that the programmable logic device of this invention achieves an optimum balance of functionality, silicon die size, and performance.

The segmented structure and performance of the programmable logic device of this invention is further enhanced by a switch matrix 101. Switch matrix 101 is connected to each of the logic circuits 106A, 106B, 106C, and 106D and is coupled by means 111 to dedicated input pins 102a. Switch matrix 101, described more completely below, provides a high speed programmable means for selectively transferring signals between logic circuits 106A-106D for selectively providing input signals to logic circuits 106A-106D, and for selectively feeding signals back to a logic circuit. Hence, switch matrix 101 (FIG. 6) performs a function similar to input multiplexers I$_1$, I$_2$ (FIG. 5). Effectively, the programmable logic device of this invention is an array of four programmable logic devices interconnected by switch matrix 101.

The invention is a high density, programmable cell array of logic devices that is capable of implementing more than 400-10,000 logic gates with relatively low power consumption. The invention permits a worst case input-to-output signal propagation delay time of 25 nsec and permits a maximum external clock frequency of 33 MHz.

Figure 7A:
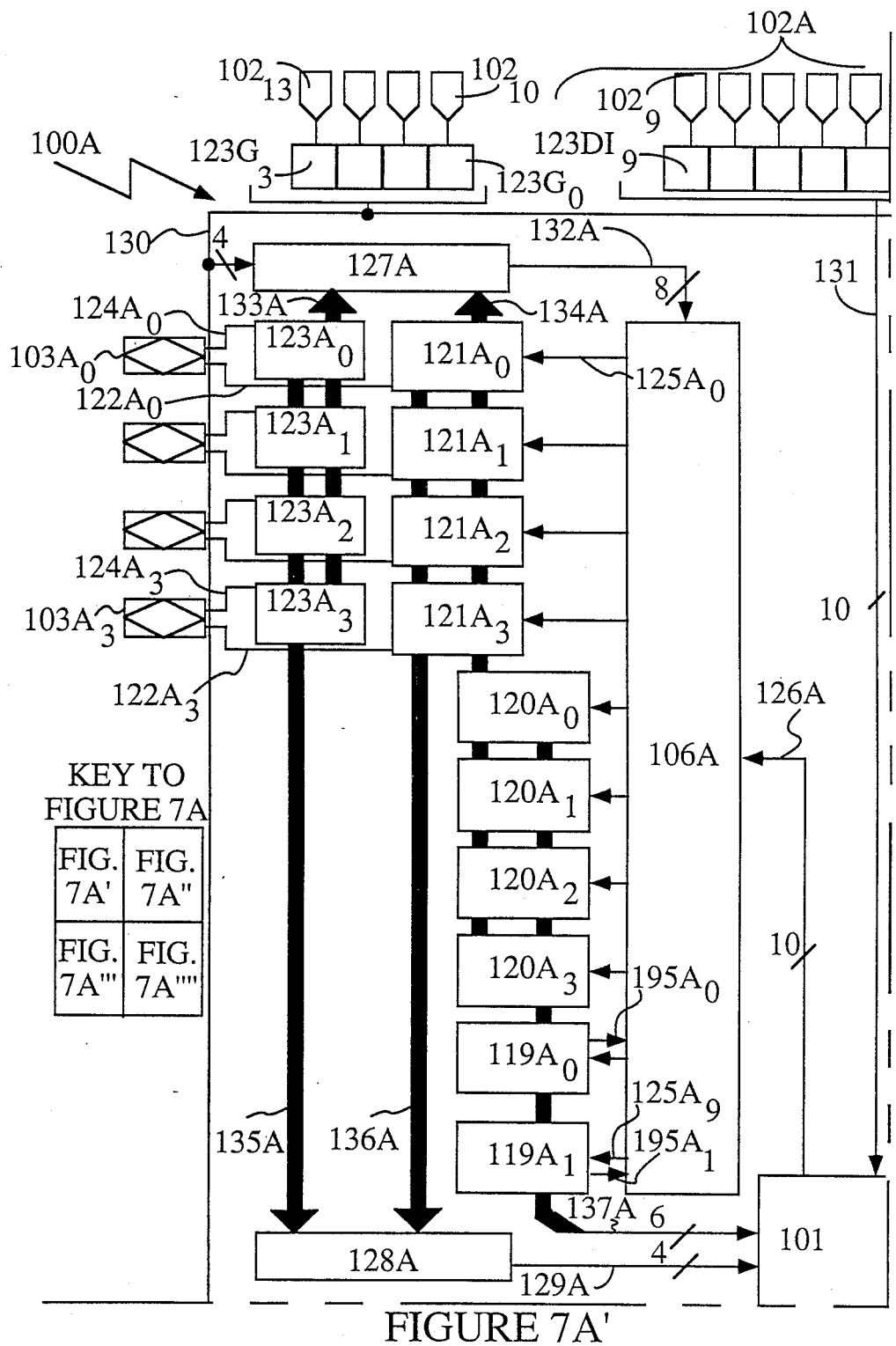
FIGS. 7a and 7b are schematic block diagrams of two embodiments of the programmable logic device of this invention.
Figure 7B:
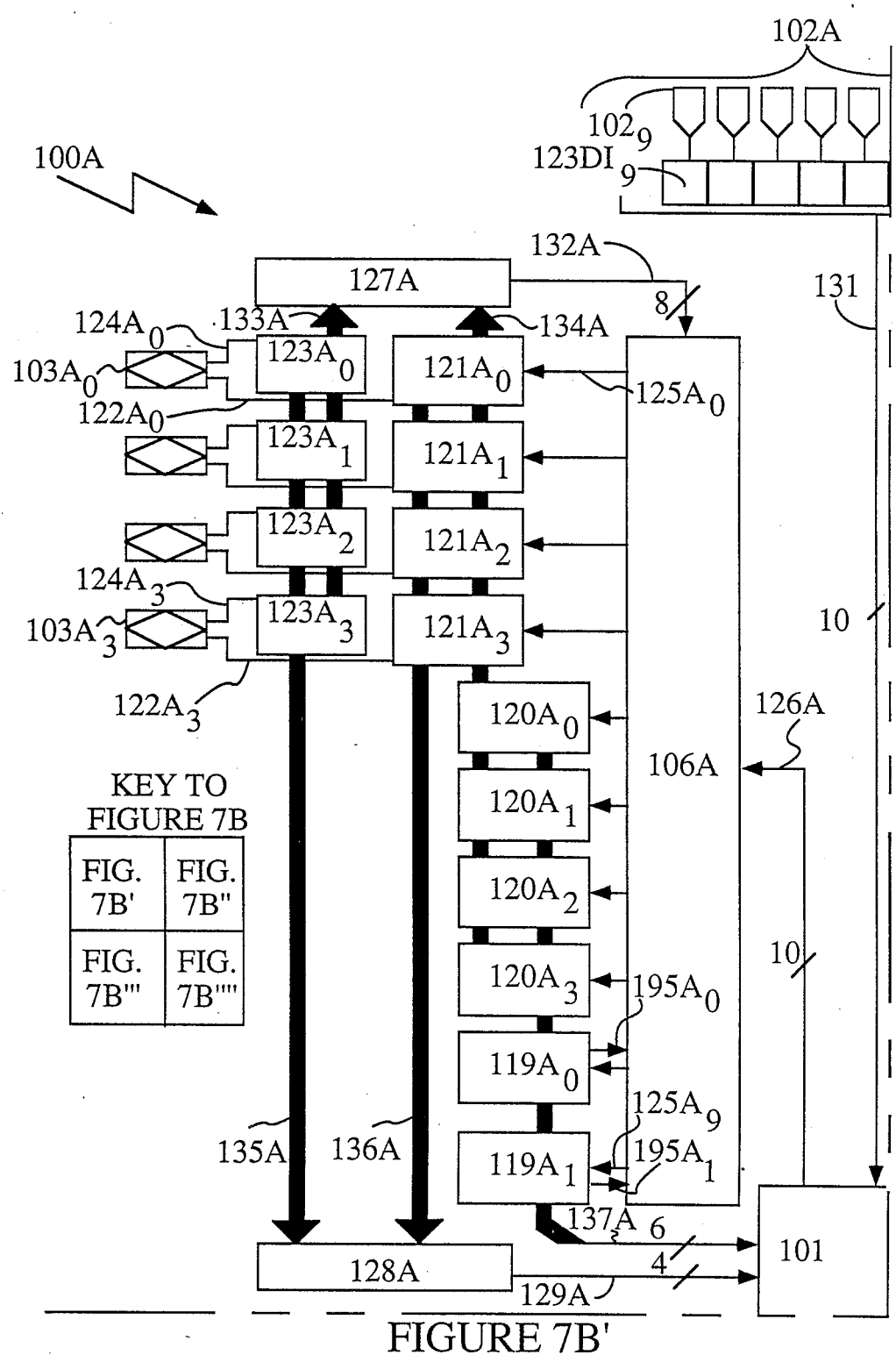

Two embodiments of the present invention are shown in FIGS. 7a and 7b. In these embodiments, quadrant 100A and quadrant 100C are identical, and quadrant 100B and quadrant 100D are identical. Quadrant 100A has four I/O pins 103A$_0$, 103A$_1$, 103A$_2$, 103A$_3$. Each pin 103A is connected to an output line 122A of an output macrocell 121A and to an input line 124A of an input macrocell 123A. A first output line from each input macrocell 123A is part of a bus 133A which feeds feedback cells 127A. A second output line from each input macrocell 123A forms a line in bus 135A to switch matrix input cells 128A.

An output line 125A from logic circuit 106A drives each output macrocell 121A. Each of the four output macrocells 121A$_0$, 121A$_1$, 121A$_2$, 121A$_3$ (121A) is connected by bus 136A to switch matrix input cells 128A and bus 134A connects output macrocells 121A to feedback cells 127A. Quadrant 100A also contains six buried macrocells 120A$_0$-120A$_3$, 119A$_0$, 119A$_1$. Each buried macrocell 120A$_0$-120A$_3$, couples an output line 125A from logic circuit 106A to switch interconnect matrix 101 via bus 137A. Macrocells 120A$_0$-120A$_3$ are coupled to feedback cells 127A by bus 134A. Buried macrocells 119A$_0$, 119A$_1$, couple an output line 125A$_8$, 125A$_9$ to switch matrix 101 and drive an input line 195A$_0$, 195A$_1$ of logic circuit 106A. Four global input pins are coupled to input logic macrocells 123G$_0$-123G$_3$ which in turn are coupled to feedback cells 127A-127D by bus 130.

Feedback cells 127A provide up to eight input signals for logic circuit 106A and ten other input signals are provided by switch matrix 101, as described more completely below. Also, buried macro 119A$_0$, 119A$_1$ drive an input line 195A$_0$, 195A$_1$ to logic circuit 106A. Hence, logic circuit 106A has twenty input lines.

Quadrant 100B (FIG. 7a) has eight I/O pins 103B$_0$-103B$_7$ and each I/O pin 103B is connected to an input macrocell 123B by a line 124B and to an output macrocell 121B by a line 122B. The eight output macrocells 121B$_0$-121B$_7$ are connected by bus 136B to switch matrix input cells 128B and by bus 134B to feedback cells 127B. Similarly, input macrocells 123B$_0$-123B$_7$ are connected by bus 135B to switch matrix input cells 128B and by bus 133B to feedback cells 127B. An output line 125B from logic circuit 106B is connected to an output macrocell 121B. Buried macrocells 119B$_0$, 119B$_1$ are each driven by an output line 125B of logic circuit 106 and in turn supply a signal to switch matrix 101. Also, buried macrocells 119B$_0$, 119B$_1$ are coupled to an input line 195B$_0$, 195B$_1$ of logic circuit 106B.

The integrated circuit package also has ten dedicated input pins $102_0$–$102_9$ which are coupled to switch matrix 101 by input logic macrocells $123D_{10}$–$123D_{19}$ respectively. Finally, two global clock pins 104a, 104b provide clock signals to each of the output, buried and input macrocells.

Figure 8A:
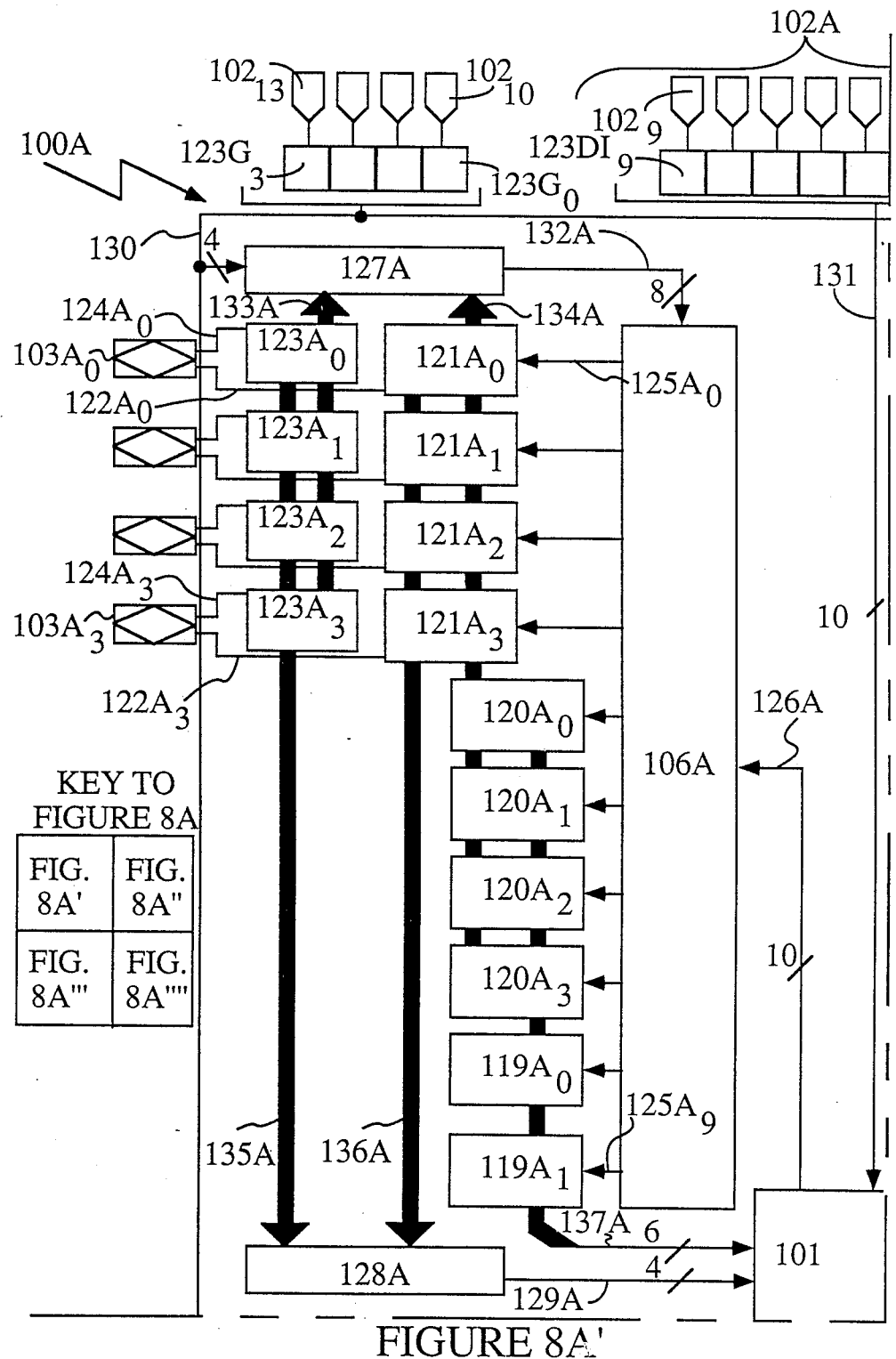
FIGS. 8a and 8b are schematic block diagrams of two other embodiments of the programmable logic device of this invention.
Figure 8B:
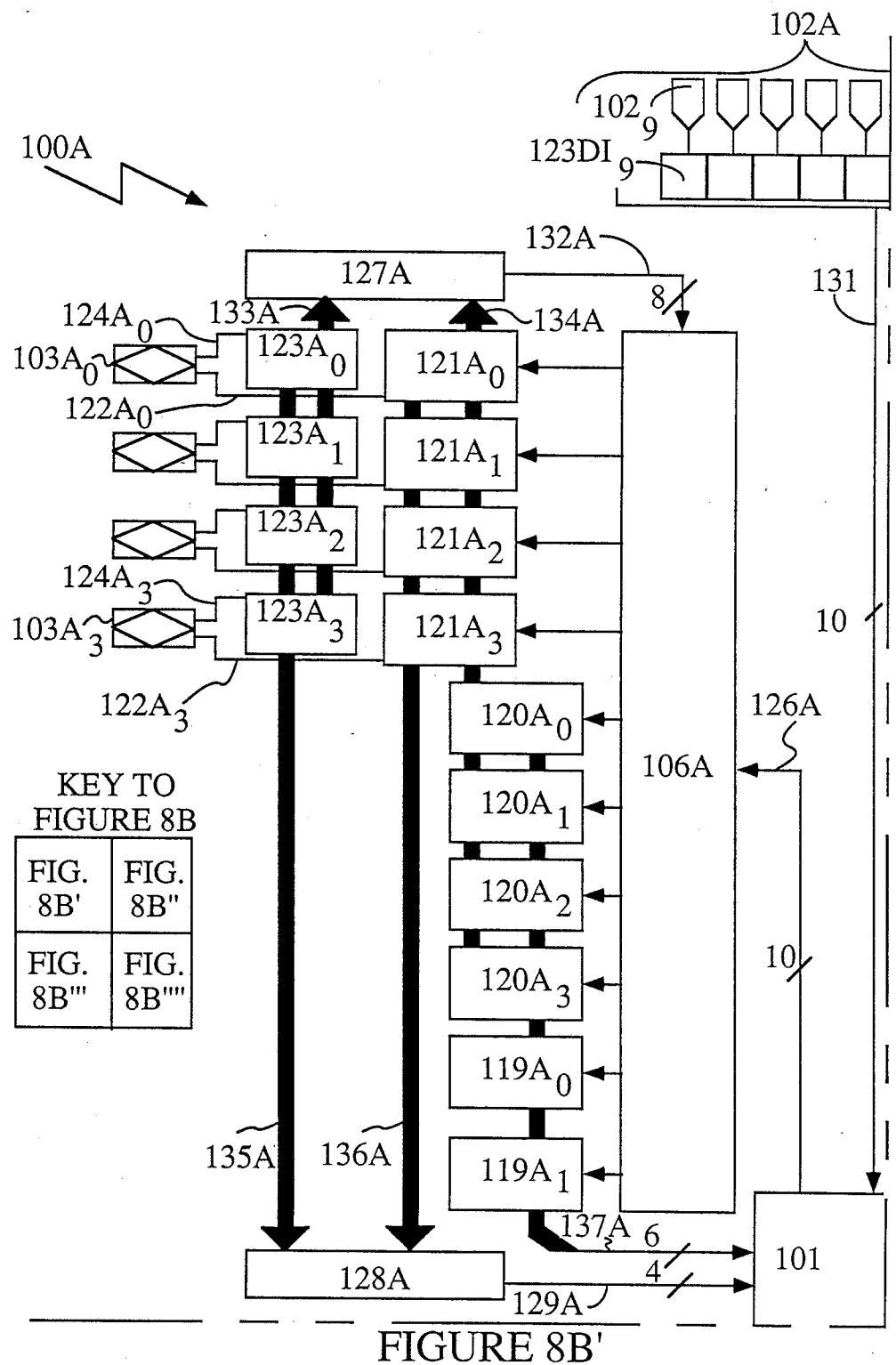

The architecture shown in FIG. 7b is identical to that in FIG. 7a except the four global input pins 102 and the related circuitry are not provided. The block diagrams shown in FIGS. 7a and 7b are illustrative only and are not intended to limit the scope of the invention. In view of the principles disclosed herein, other configurations of the input macrocells, output macrocells, switch matrix input cells, and logic circuits will be apparent to one skilled in the art. For example, FIGS. 8a and 8b illustrate an architecture similar to the architecture of FIGS. 7a and 7b, respectively. In FIGS. 8a and 8b, the total number and type of macrocells in each quadrant is the same as that described above except each quadrant contains two buried macrocells 119 which are not coupled directly to the logic circuit in the quadrant, i.e., the lines 195 in FIGS. 7a and 7b are eliminated. Accordingly, the logic circuit in each quadrant has only eighteen input lines, eight from feedback cells 127 and ten from switch matrix 101 instead of the twenty input lines illustrated in FIGS. 7a and 7b.

An output logic macrocell 121, described more completely below, couples a logic circuit output line 125 with an I/O pin 103, with a feedback cell 127, and a switch matrix input cell 128. Each output logic macrocell 121 can be configured so that in response to a signal on output line 125, macrocell 121 provides either a registered/latched or a combinatorial output signal. The programmable storage element in output logic macrocell 121 can be configured as either a register (flip-flop) or a latch and is clocked/latched with either a synchronous signal from a global clock pin or an asynchronous signal from logic circuit 106. Output logic macrocell 121 also controls the polarity of the output signal and the I/O function of each I/O pin 103.

Buried macrocells 119, 120 are similar to output macrocells 121 except a buried macrocell 120 is not coupled to an I/O pin 103. Rather, a buried macrocell 119, 120 couples a logic circuit output line 125 to switch matrix 101 and in selected instances (buried macrocells 120) to a feedback cell 127. Buried macrocells 119, 120 also can be configured to generate either a combinatorial or a registered/latched feedback signal. The programmable storage element in buried macrocells 119, 120 can also be configured as either a register or a latch and the clock/latch enable (clock/LE) signal can be either synchronous or asynchronous.

Figure 7B:
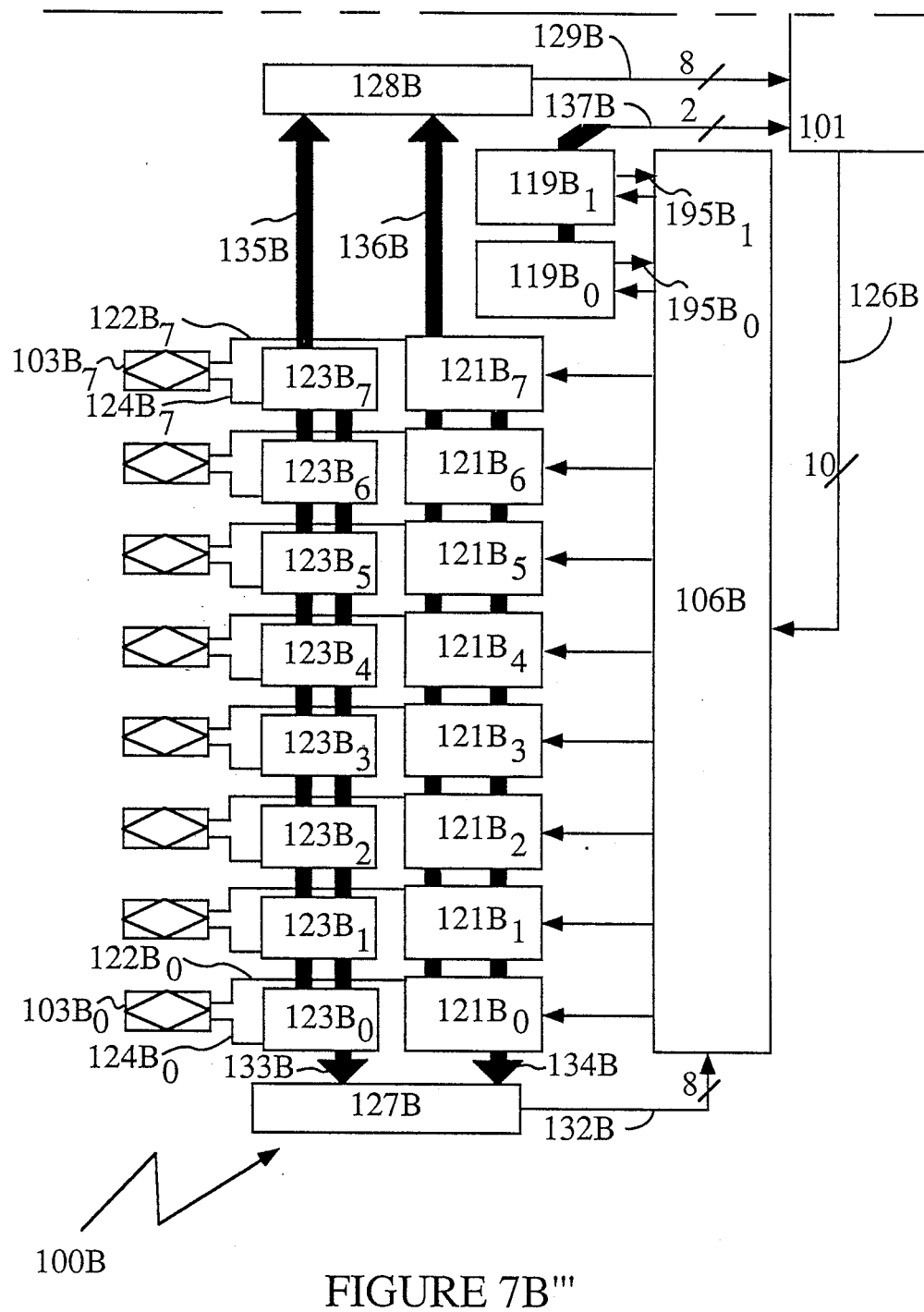

In a preferred embodiment, the integrated circuit, as shown in FIGS. 7 and 8, is a high density, electrically erasable ($E^2$) reprogrammable PLD utilizing 1.5 micron CMOS double metal $E^2$ PROM technology for high performance and logic configurability. Alternatively, the integrated circuit of the invention can be implemented using either erasable programmable ROM technology or bipolar fused technology. The structure in FIGS. 7b and 8b is contained in a single forty pin DIP and the structure in FIGS. 7a and 8a in a forty-four pin PLCC package. The forty-four pin PLCC package with the 24 I/O pins, 14 dedicated input pins, and 2 synchronous clock/latch enable pins utilizes a small amount of board space but yet a significant amount of flexibility and high speed performance is provided in the small package.

Each of the macrocells (FIGS. 7a, 7b, 8a and 8b) contains a programmable storage element which can be configured as a register. Specifically, each storage element is configurable as either a D- or T-type register/latch in a first embodiment and a storage element which is configurable as a D-type, a T-type, a J-K, or a RS register/latch in a second embodiment. Every I/O pin 103 has an input register/latch associated with the pin and every dedicated input pin 102 has an input register/latch associated with the pin. Hence, every possible input pin has a separate input register/latch. The storage elements support the implementation of up to a 39-bit wide counter as well as asynchronous applications such as bus interface, bus arbitration and bus synchronization. Further, this register-intensive architecture can be used to implement a broad range of state machines.

The symmetry of the programmable logic device, as illustrated in FIGS. 7a, 7b, 8a and 8b, is an important aspect of this invention. The symmetry simplifies the development of the silicon die by the silicon chip designer and the design of a system using the PLD of this invention by the system designer. Also, without the inherent symmetry, the development of software tools for the PLD is more difficult.

Figure 9B:
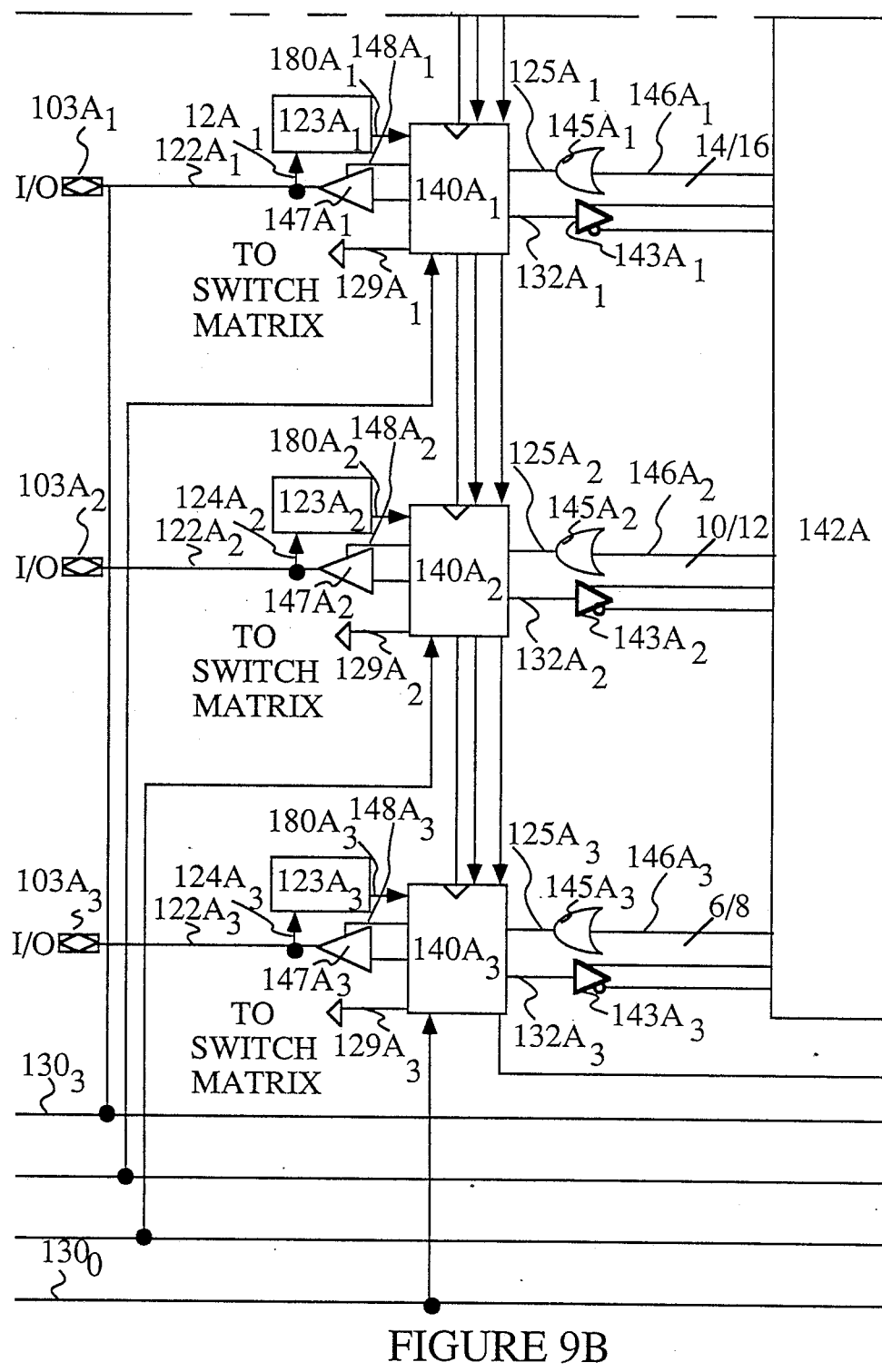
FIG. 9 is a detailed schematic block diagram of logic quadrant 100A of the programmable logic device of this invention illustrated in FIG. 6.
Figure 9C:
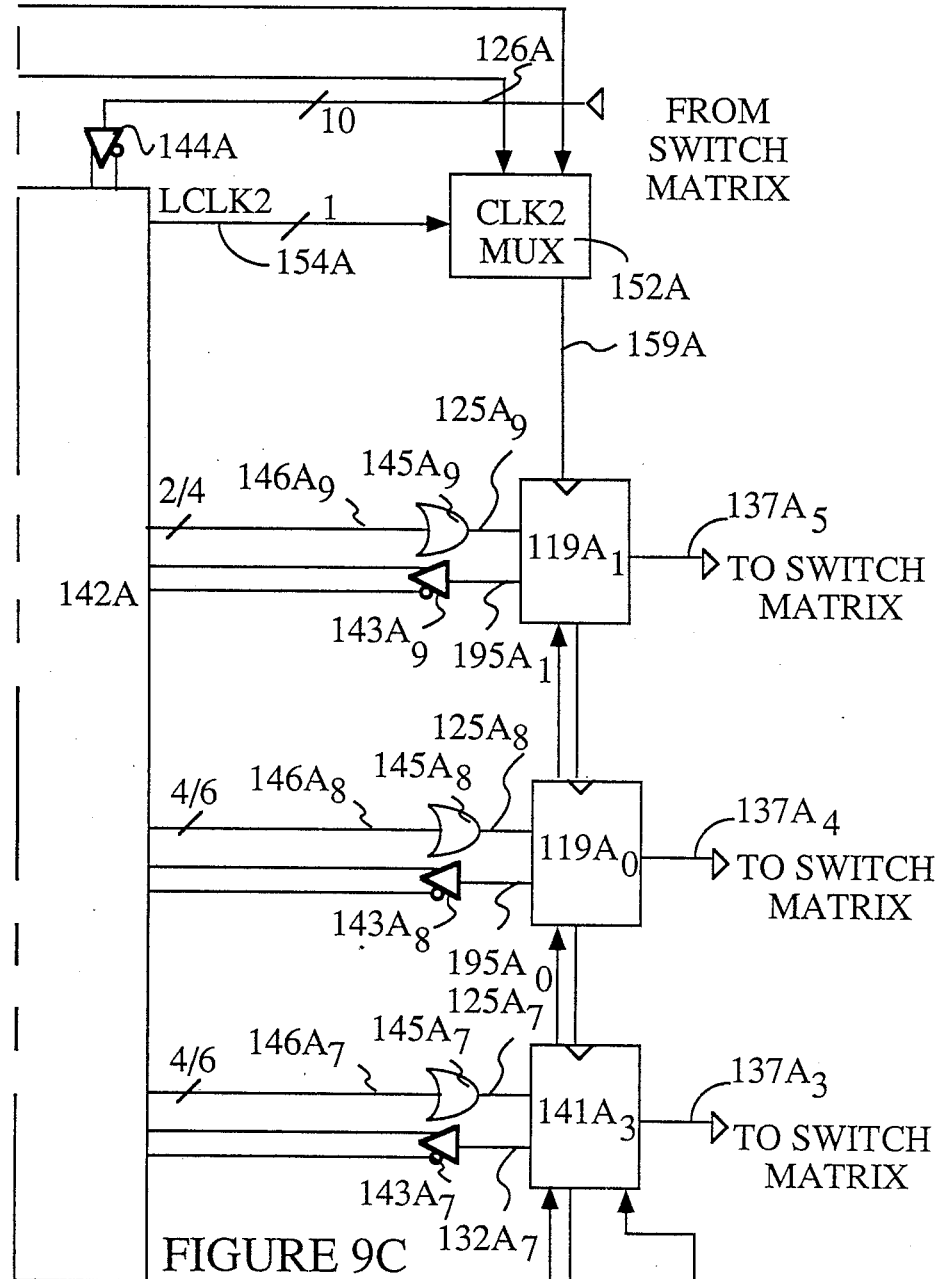
Figure 9D:
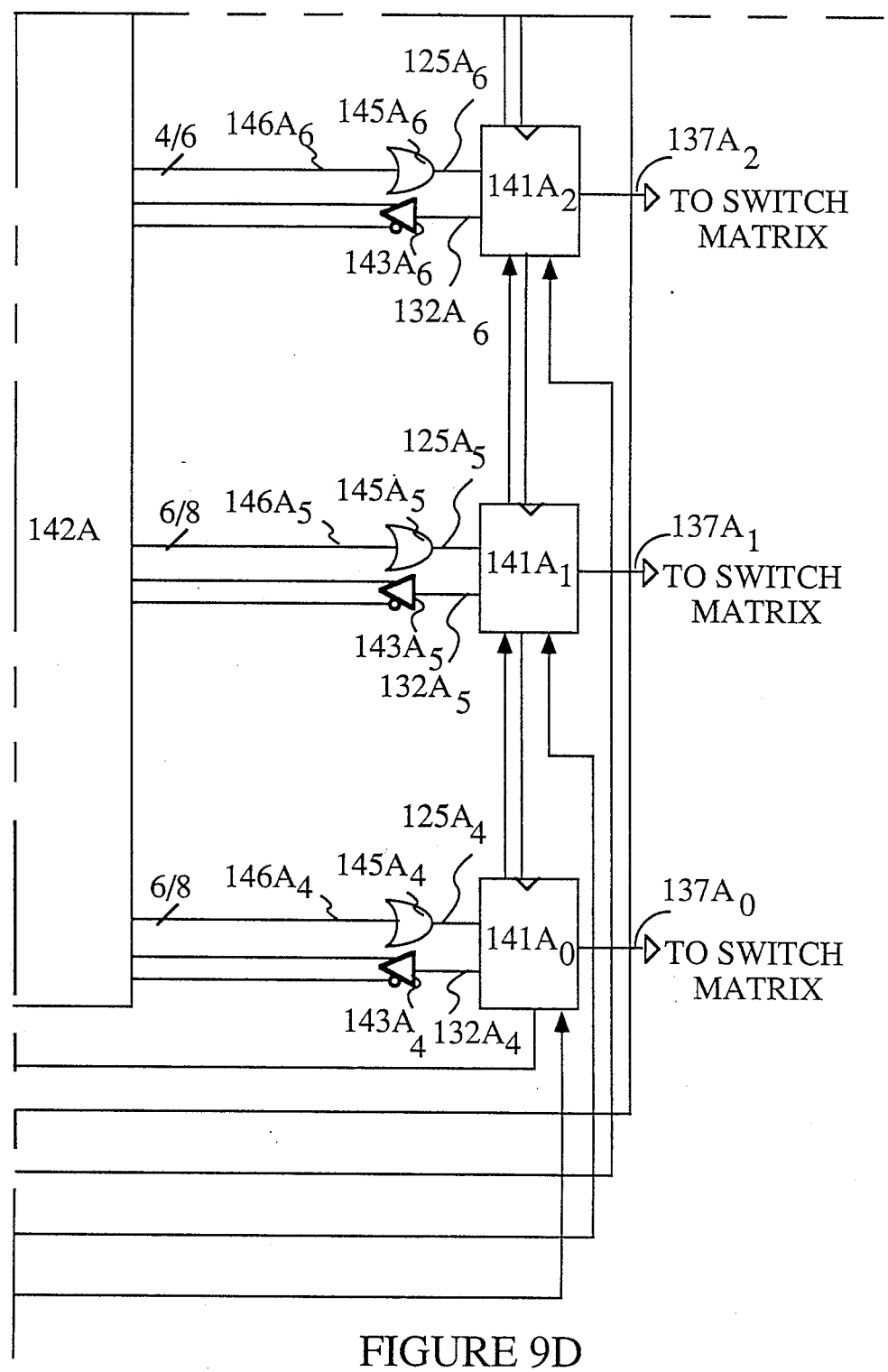
Figure 10A:
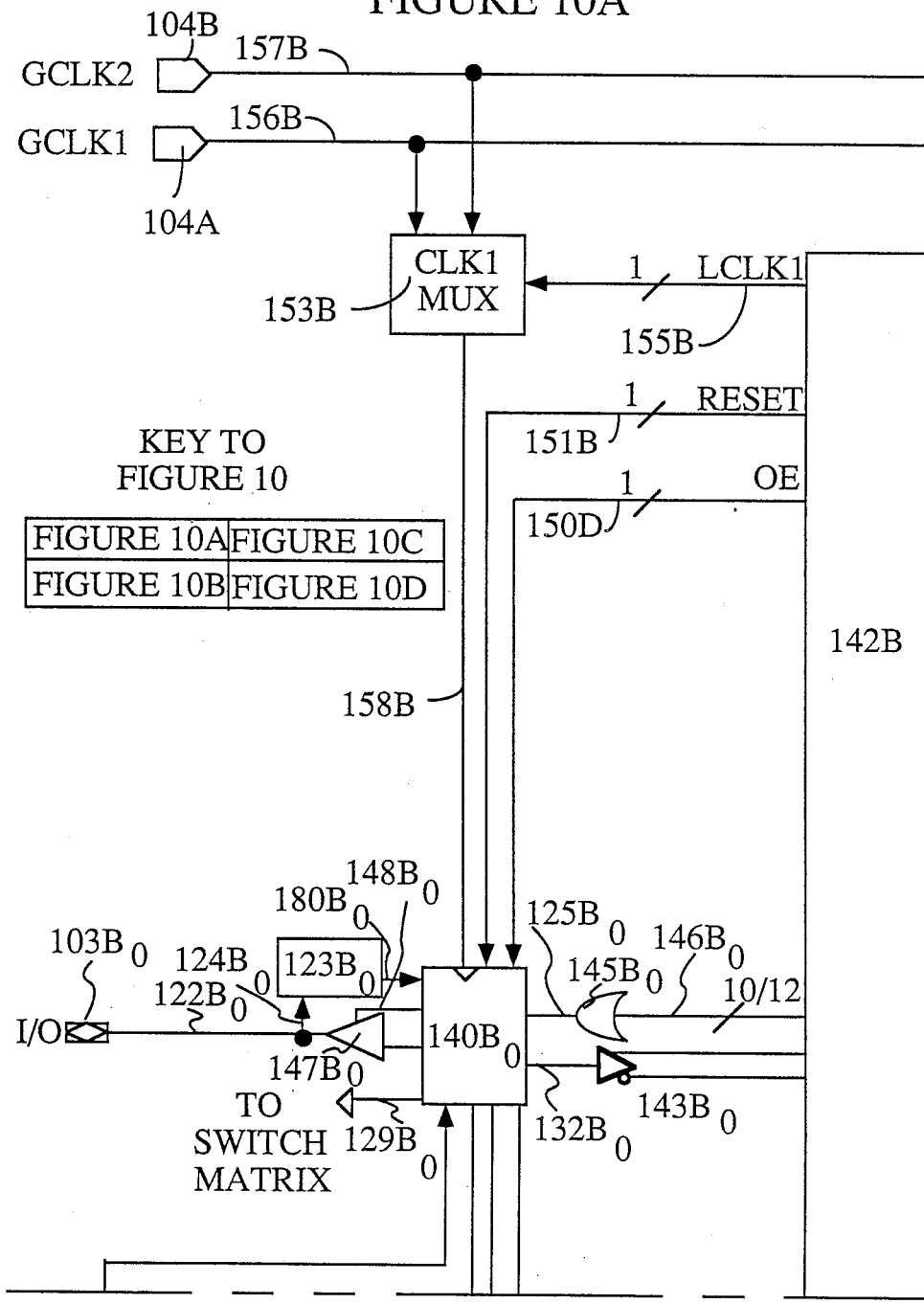
FIG. 10 is a detailed schematic block diagram of logic quadrant 100B of the programmable logic device of this invention illustrated in FIG. 6.
Figure 10B:
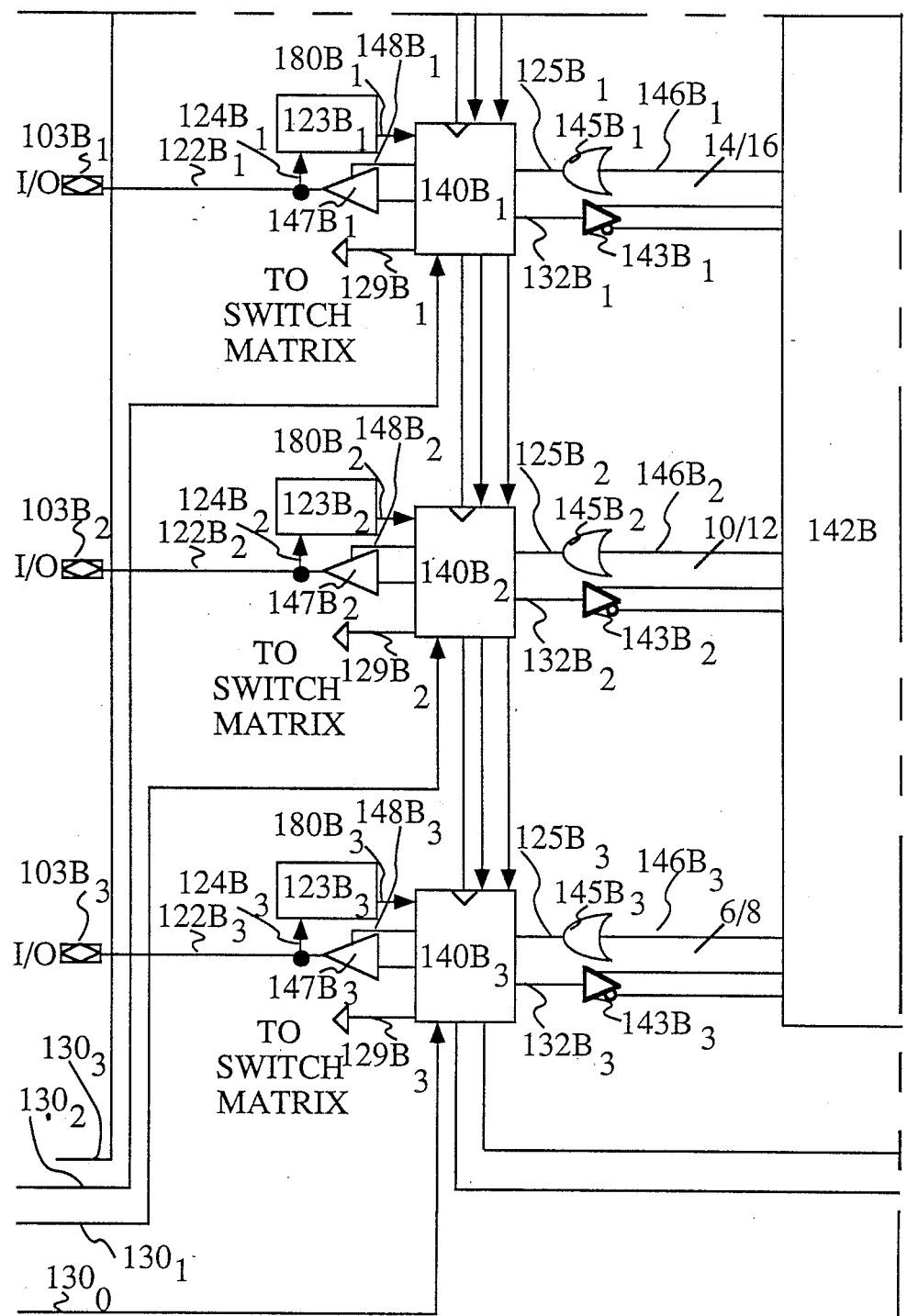
Figure 10C:
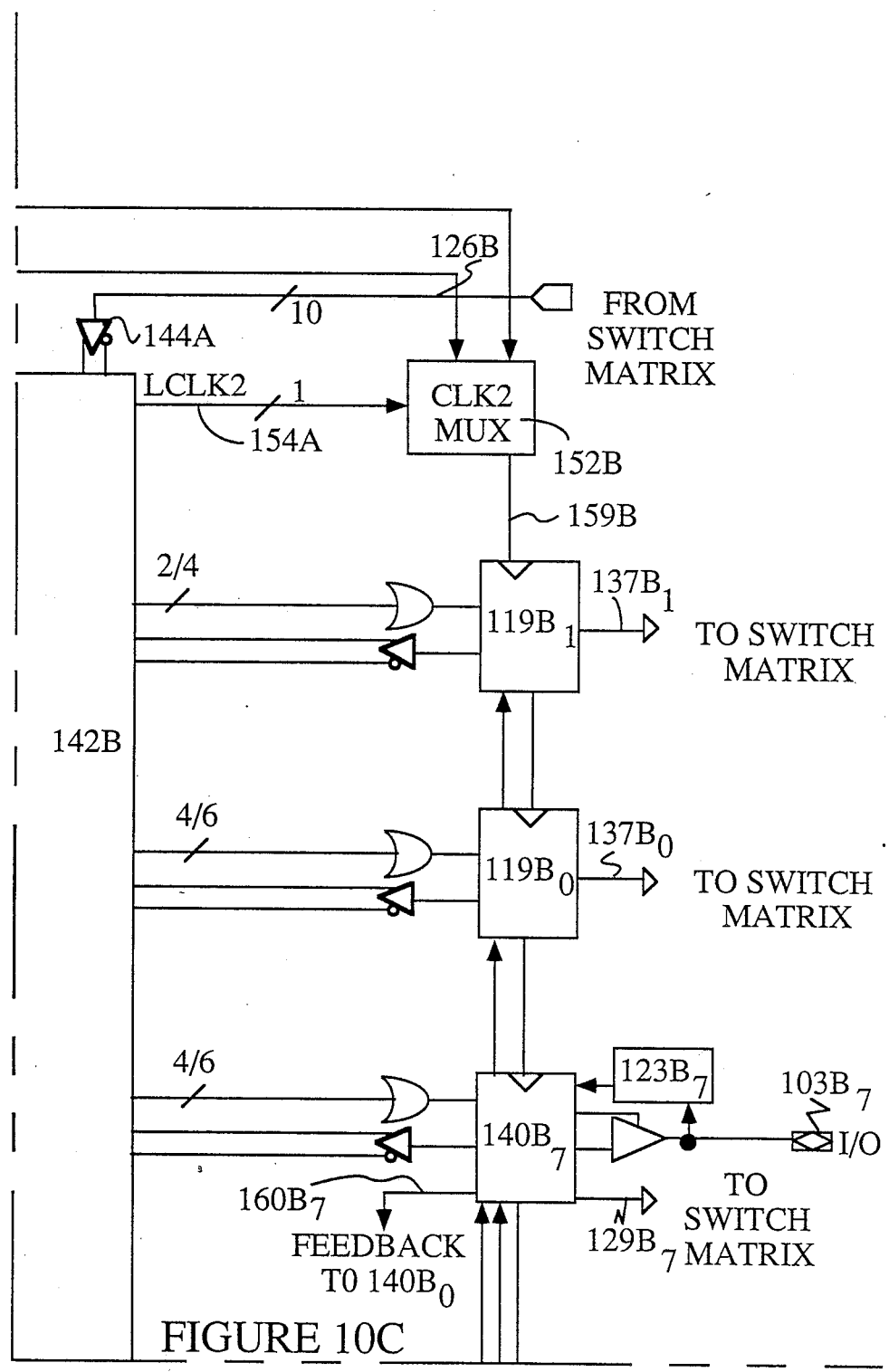
Figure 10D:
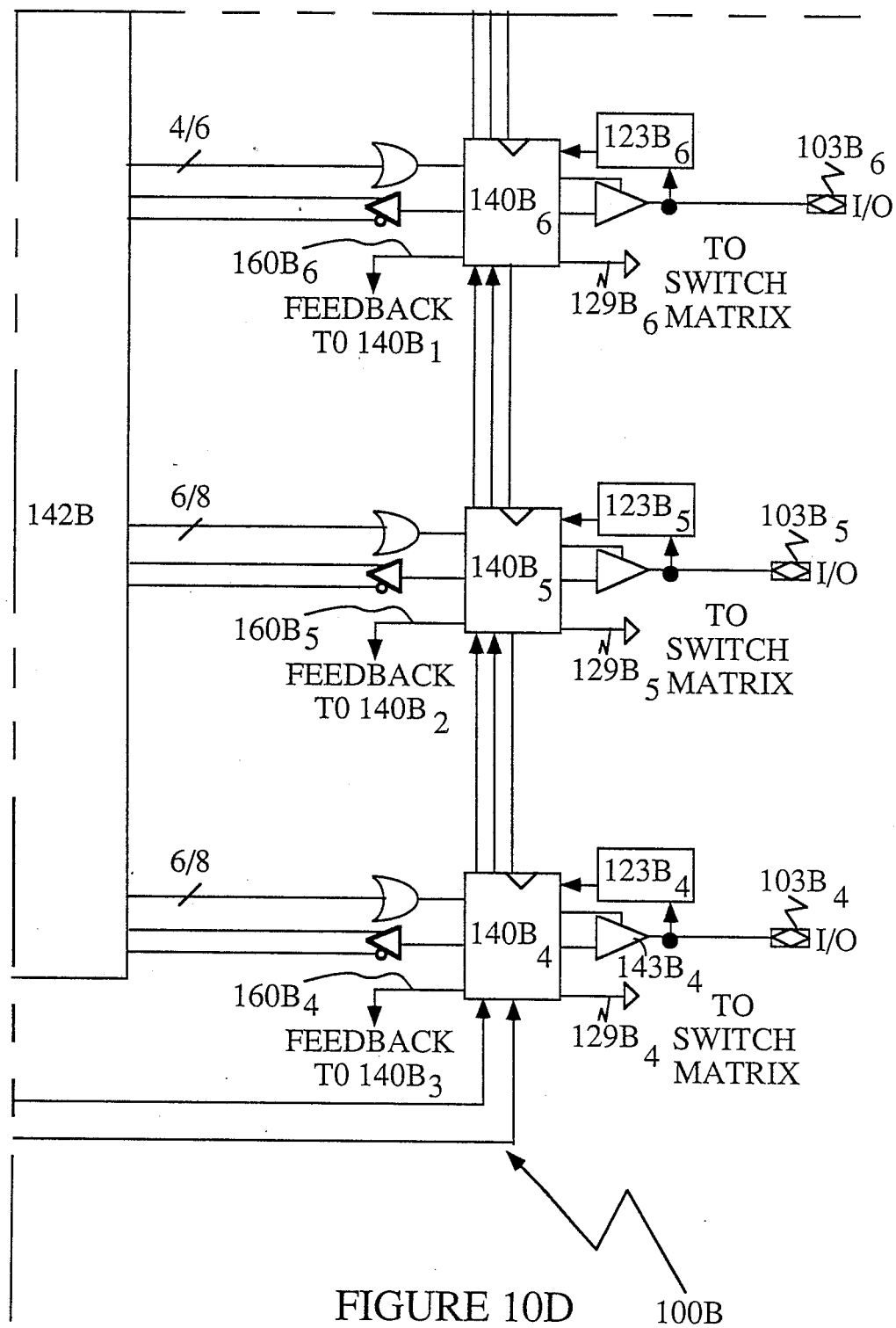

A preferred embodiment of quadrant 100A (FIG. 7a) is illustrated in FIG. 9. In this embodiment, buried macrocells $119A_0$–$119A_1$ (FIG. 9) are the same as buried macrocells $119A_0$–$119A_1$ (FIGS. 7a and 7b), but logic macrocells $140A_0$–$140A_3$ (FIG. 9) include output macrocell 121A, feedback cell 127A and switch matrix cell 128A (FIGS. 7a and 7b) and logic macrocells $141A_0$–$141A_3$ include buried macrocell 120A, feedback cell 127A and switch matrix cell 128A. Further, logic circuit 106A is a programmable AND/OR logic array. While the invention is described in terms of a programmable AND/OR array, the programmable AND/OR array is implemented in a preferred embodiment as a NOR.NOR array that is functionally equivalent to the programmable AND/OR array described herein. As discussed more completely below, logic circuit 106A may also be a programmable OR array/fixed AND array, a PLA (programmable AND array and a programmable OR array), a NOR.NOR array, or a NAND.NAND array, for example. Accordingly, the use of a programmable AND/OR logic array is illustrative only and is not intended to limit the scope of the invention.

Each logic macrocell 140A (FIG. 9) drives an output buffer 147A of output macrocell 121A (FIG. 7a) which is illustrated separately from logic macrocell 140A. Each output buffer 147A has a control line 148A which is also driven by logic macrocell 140A. If I/O pin 103A is configured as an input pin, then logic macrocell 140A is programmed so that output buffer 147 is tristate and input logic macrocell 123A passes a signal from I/O pin 103A to logic macrocell 140A which in turn transfers the signal to input line 132A of programmable AND array 142A. Input line 132A drives a buffer 143A which provides both the signal on line 132A and the complement of the signal on line 132A to programmable AND array 142A.

One of the product lines 151A from programmable AND array 142A (FIG. 9) functions as a programmable common reset line for each of the output macrocells and buried macrocells in quadrant 100A. Another product line 150A provides a programmable common output enable signal to logic macrocells 140A. As described below, the signal on line 150A is one of three signals which can be used to control output buffer 147A.

Global clock/latch enable (clock/LE) pin lines 156A, 157A are tied to programmable clock multiplexers 152A and 153A and an output line 158A from clock one multiplexer 153A is coupled to logic macrocells 140A$_0$–140A$_3$ while clock two multiplexer 152A is coupled to each buried state macrocell 141A$_0$–141A$_3$, 119A$_0$, 119A$_1$ by line 159A. A product line 155A from AND array 142A is coupled to clock one multiplexer 153A and product line 154A is coupled to clock two multiplexer 152A. Product lines 154A, 155A provide a programmable asynchronous clock/latch enable signal to multiplexers 152A, 153A, respectively.

Another novel feature of the programmable logic device of this invention is illustrated in FIG. 9. Above the product line bus 146A to each OR gate 145A are two numbers, for example, above line 146A$_0$ are the numbers 10/12 and above line 146A$_1$ are the numbers 14/16. The numbers 10/12 above line 146A$_0$ mean that OR gate 145A$_0$ can sum either ten product terms or twelve product terms. Similarly, OR gate 145A$_1$ can sum either fourteen product terms or sixteen product terms. As described more completely below, to provide the variable sum of product terms capability, adjacent pairs of OR gates in the programmable AND/OR array share two product lines from programmable AND array 142A. While in the preferred embodiment two product lines are shared, alternative embodiments could have more than two product lines. While only quadrant 100A has been discussed above, recall quadrant 100C is identical to quadrant 100A and so FIG. 9 is also representative of an embodiment of quadrant 100C.

An embodiment of quadrants 100B and 100D, used with the embodiment of quadrants 100A and 100C shown in FIG. 9, is shown in FIG. 10. The programmable AND logic array 142B in quadrant 100B is identical to the programmable AND logic array 142A. Quadrant 100B has eight logic macrocells 140B$_0$–140B$_7$ and two buried state macrocells 119B$_0$, 119B$_1$ Each logic macrocell 140B (FIG. 10) is similar to logic macrocells 140A (FIG. 9) except logic macrocells 140B$_4$–140B$_7$ have one additional output line 160B$_4$–160B$_7$, respectively and logic macrocells 140B$_0$–140B$_3$ have an additional input line (not shown), as described below. Output line 160B provides feedback to a companion macrocell 140B and provides further utilization of the components within the programmable logic device. For example, if output buffer 143B$_4$ for logic macrocell 140B$_4$ is tristate so that I/O pin 103B$_4$ is used as an input pin, then logic macrocell 140B$_4$ is functional not only as a feedback cell to programmable AND array 142B and to switch matrix 101 but also as a feedback cell to macrocell 140B$_3$.

Dedicated input pins 102 provide signals over lines 130$_0$–130$_3$ (FIG. 10) to logic macrocells 140B$_3$–140B$_0$ respectively. Hence, in quadrants 100B, 100D only four logic macrocells 140B receive a dedicated input signal and not eight macrocells as in quadrants 100A and 100C (FIG. 9). This feature provides further flexibility to the user and promotes efficient use of the components in the programmable logic device of this invention as well as achieving an optimum balance between functionality and speed of the device.

Figure 11A:
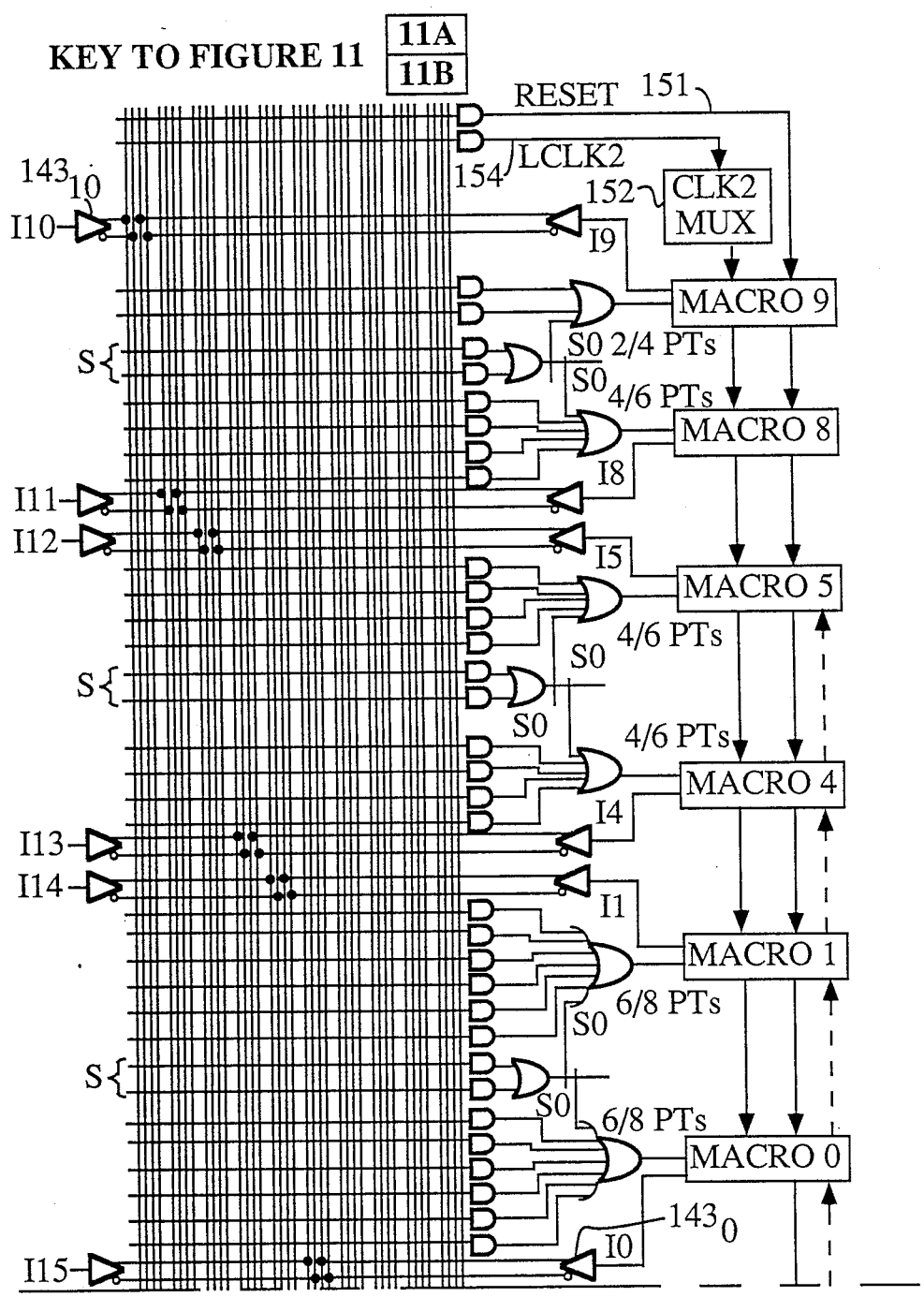
FIG. 11 is a schematic diagram of the programmable array logic circuit used in each quadrant of the programmable logic device of this invention.
Figure 11B:
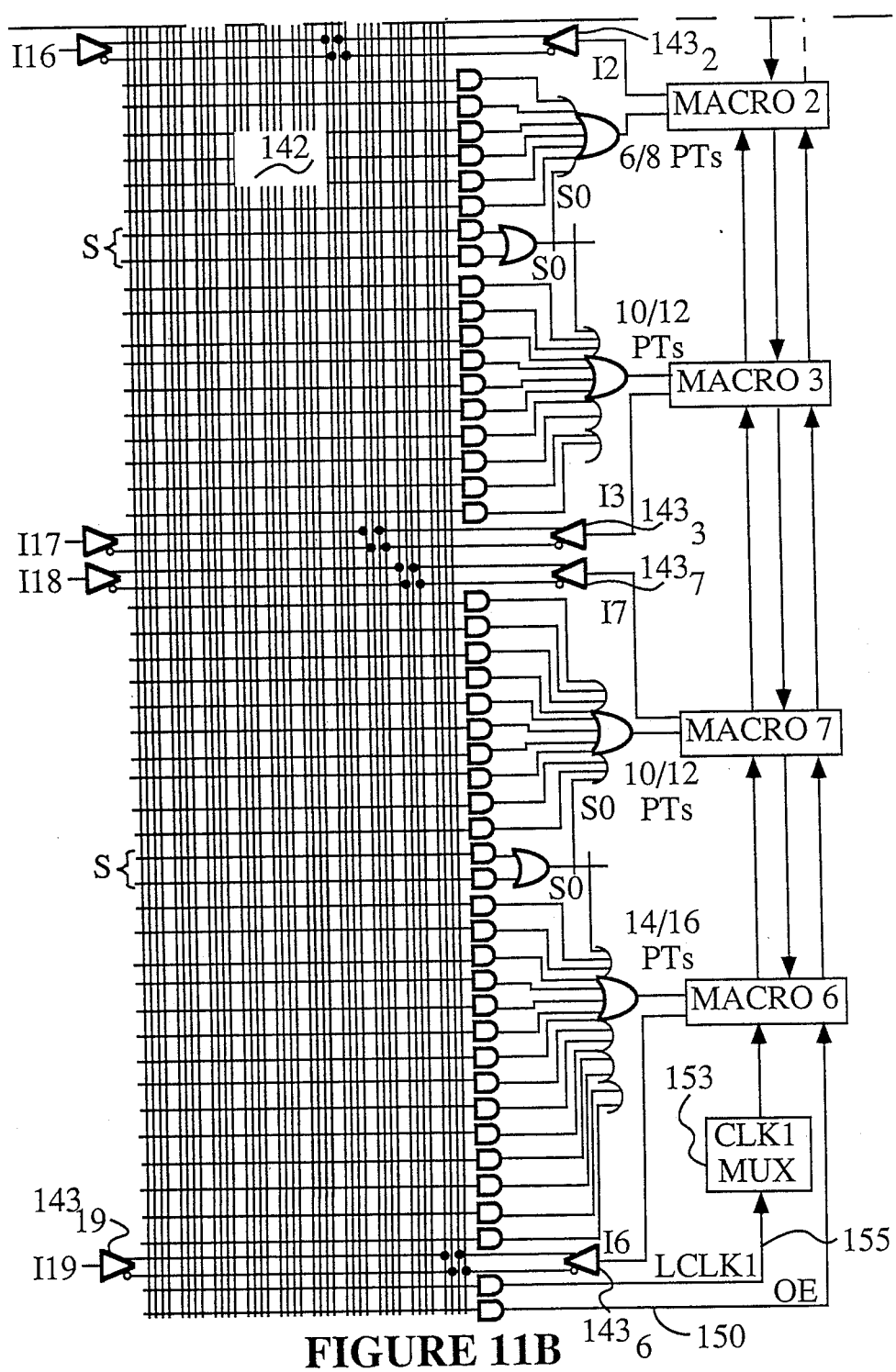

A schematic diagram of one embodiment of programmable AND/OR logic array, logic circuit 106, (FIGS. 7a and 7b) of this invention is illustrated in FIG. 11. Each programmable AND array 142 has 20 input lines I0–I19 (line I0–I19 are indicated as lines 132 and lines 195 in FIGS. 7a and 7b). Since each input line I0–I19 is coupled to a buffer 143, which drives both a true line and a complement line to programmable AND array 142, the array effectively has 40 input lines. Eight of the twenty input lines are derived from feedback cells. Ten input lines are derived from switch matrix 101 and two input lines are derived from buried macrocells 119.

Ideally, each pin of the programmable logic device would be an I/O pin, which could be configured as either an input pin or an output pin based upon the application of the programmable logic device. Unfortunately, such flexibility increases the size of programmable AND/OR logic array 106 because each pin, which can function as an output pin, must be driven by an output line of the array. Hence, to achieve an optimum balance between performance and silicon die size, the dedicated pin and I/O pin configuration, illustrated in FIGS. 9 and 10, was selected.

As previously described, product line 155 (FIG. 11) provides an asynchronous clock/latch signal to clock one multiplexer 153 and product line 154 is coupled to clock two multiplexer 152. Product line 150 provides a common output enable signal to the macrocells and product line 151 a common reset signal. The macrocells in each quadrant are illustrated generally in FIG. 11 as "MACRO 0" through "MACRO 9".

The logic functions within a quadrant are implemented by programming architecture cells. Initially, the AND gates are connected to both the true and the complement signal of every input signal. Specifically, the horizontal and vertical lines (FIG. 11) are connected at each intersection by a programmable cell. By selective programming of the input lines, i.e., opening selected connections at the intersections of the horizontal and vertical lines, connection is established between either the "true" or "complement" input lines and the AND gates. In one embodiment, when both architecture cells to the true and complement input lines are left unprogrammed, the AND gate generates a logical false output signal. In this embodiment, an AND gate with all of its input cells programmed assumes the logical true state.

The seventy-six logical product terms of each array are provided to a fixed OR array in a variable distribution pattern as illustrated in FIG. 11. Ten of the seventy-six product terms are used as "shared product terms" between adjacent pairs of macrocells. Hence, the OR gate driving each macrocell has access to an additional two product terms. The product term sharing between pairs of output macrocells is a "true" sharing which is achieved by having a separate architecture cell S0 (product term sharing cell) with each logic macrocell as illustrated in FIG. 11. This dedicated architecture cell facilitates the routing of the two common product terms to the macrocell in that the two product terms can be shared between two macrocells, routed to only one macrocell or left unconnected. Specifically, if the product term sharing cell S0 provides a logic zero the two extra product terms are unused, but if cell S0 provides a logical one then the extra product terms are used. The true product sharing between adjacent macrocells provides better logic flexibility and allows the system designer to tailor the internal logic resources for specific applications.

As illustrated in FIG. 11, each pair of macrocells, 0/1, 2/3, 4/5, 6/7 and 8/9, in a quadrant shares two of the 76 product (horizontal) lines, labeled S in FIG. 11.

Figure 12A:
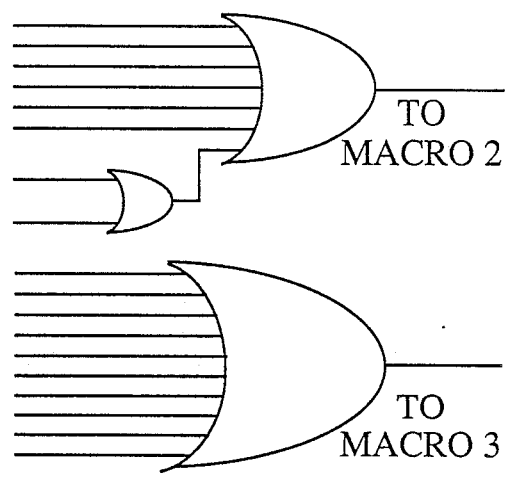
FIGS. 12a, 12b, 12c and 12d illustrate the product term sharing of this invention.
Figure 12B:
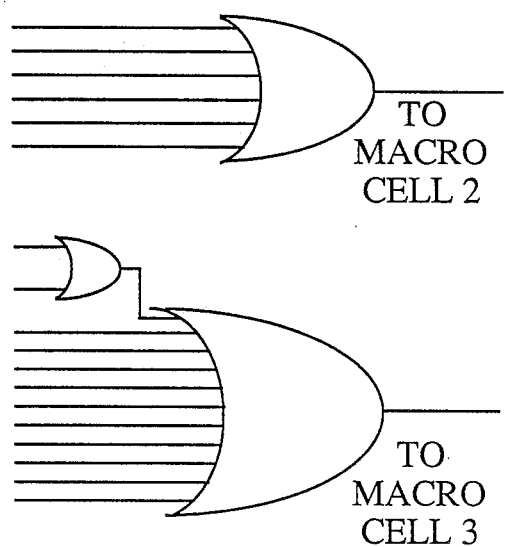
Figure 12C:
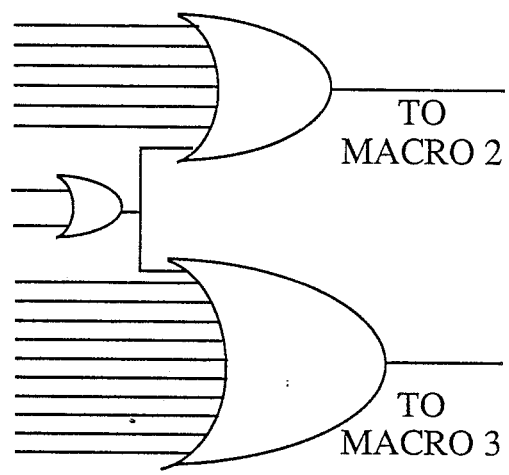
Figure 12D:
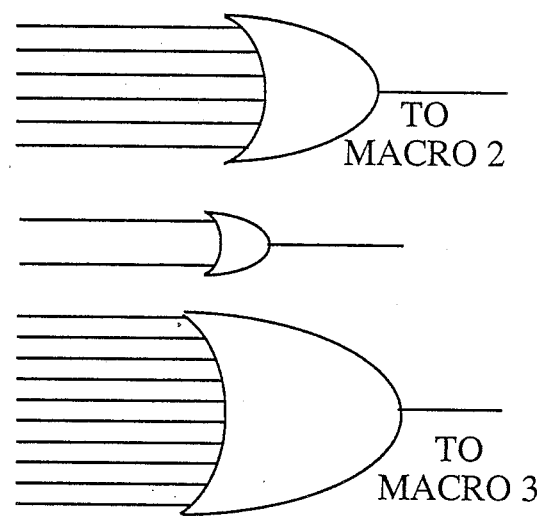

For example, the input signals for macrocells, MACRO 2 and MACRO 3 are sums of 6 and 10 logical function lines or product terms, respectively, and this pair of macrocells also share the sum of two additional product terms S (FIG. 11). This sum of two product terms may be added to the OR gate input signals for macrocell MACRO 2 but not for macrocell MACRO 3 (FIG. 12A and Situation 1 in Table I); or this sum may be added to the OR gate input signals for macrocell MACRO 3 but not for macrocell MACRO 2 (FIG. 12B and Situation 2 in Table I); or this sum may be added to the OR gate input signals for each of macrocells MACRO 2 and MACRO 3 (FIG. 12C and Situation 3 in Table I); or the sum may be deleted from the OR gate input signals for both macrocell MACRO 2 and macrocell MACRO 3 (FIG. 12D and Situation 4 in Table I). In these four situations, the number of OR gate input signals received by the OR gate associated with macrocell MACRO 2 and macrocell MACRO 3 become, respectively, 8, 6, 8 and 6 for macrocell MACRO 2 and 10, 12, 12 and 10 for macrocell MACRO 3. The other four pairs of macrocells are analyzed similarly. Table I collects the results for all five pairs of macrocells in any quadrant.

TABLE I

Maximum Sum of Products for each Macrocell

| Situation | Macrocell No. (FIG. 11) | | | | | | | | | |
|---|---|---|---|---|---|---|---|---|---|---|
| | 0 | 1 | 2 | 3 | 4 | 5 | 6 | 7 | 8 | 9 |
| 1 | 6 | 8 | 8 | 10 | 4 | 6 | 14 | 12 | 4 | 4 |
| 2 | 8 | 6 | 6 | 12 | 6 | 4 | 16 | 10 | 6 | 2 |
| 3 | 8 | 8 | 8 | 12 | 6 | 6 | 16 | 12 | 6 | 4 |
| 4 | 6 | 6 | 6 | 10 | 4 | 4 | 14 | 10 | 4 | 2 |

In Table I, the vertical lines separate the various pairs of macrocells for each situation. Further, the configuration of each pair of macrocells is independent of the configuration of any other pair of macrocells.

As previously described, an input logic macrocell 123 (FIG. 13) is associated with every dedicated input pin 10 and every I/O pin 103 of the integrated circuit package of this invention. The embodiment illustrated in FIG. 7b, has thirty-four input logic macrocells 123 (10 dedicated input pins +24 I/O pins) and the embodiment illustrated in FIG. 7a has thirty-eight input logic macrocells 123 (10 dedicated input pins +4 global input pins +24 I/O pins). Each input logic macrocell 123, in one embodiment, has a clock/latch enable multiplexer 183, a programmable edge-trigger register or transparent latch 184 (utilized as a storage element), and a bypass multiplexer 185 which is used to select either combinatorial or registered/latched signals for output line 180.

More specifically, input line 124 is connected to an input terminal of programmable storage element 184 and to a first input terminal of bypass multiplexer 185. The clock terminal of programmable storage element 184 is connected to the output terminal of the clock-/latch enable selection multiplexer 183. Clock/latch enable (clock/LE) line 158 from clock one multiplexer 153 (not shown) is connected to a first input terminal of multiplexer 183 and clock/LE line 159 from clock two multiplexer 152 (not shown) is connected to a second input terminal of multiplexer 183. An output terminal of programmable storage element 184 is connected to a second input terminal of multiplexer 185 and line 180 is connected to the output terminal of multiplexer 185. Finally, a reset terminal (not shown) of programmable storage element 184 is connected to a power-up reset circuit (not shown) so that storage element 184 is set to a known state upon power-up. To improve clarity in the drawings, reset line from the power-up reset circuit is not shown connected to any input logic macrocell.

Clock/latch enable configuration cell 186 selects either the clock/LE signal on line 158 or the clock/LE signal on line 159 for passing through multiplexer 183 to output line 182 and consequently to the clock input terminal of programmable storage element 184. As previously described, the clock/LE lines carry either a synchronous global clock signal or an asynchronous clock/LE signal derived from a signal on a product line of programmable AND array 142 (not shown). If configuration cell 186 applies a logical zero signal as the input select signal to multiplexer 183, the signal on line 159 is passed to register 184 and conversely, if the clock/LE configuration cell 186 provides a logical one signal as the input select signal to multiplexer 183 the signal on line 158 is passed through multiplexer 183 to line 182 and consequently clock/latch programmable storage element 184. When a programmable multiplexer, such as multiplexer 183, is described herein as passing a signal from one input line I to the output line 0, this necessarily implies that the line I is connected to line 0 and all other input lines to the multiplexer are disconnected from output line 0.

Register/latch configuration architecture cell 187 configures register 184 as either an edge-triggered input register or a level sensitive latch. Specifically, if cell 187 provides a logical zero signal as the function select signal to storage element 184, the element functions as a level sensitive latch. If configuration cell 187 provides a logical one signal as the function select signal to storage element 184, the element functions as an edge-triggered register.

In another embodiment (not shown), programmable storage element 184 has two register/latch configuration architecture cells and storage element 184 functions as one of a D-type register/latch, a T-type register/-latch, a J-K register/latch and a RS register/latch.

Bypass multiplexer configuration cell 188 selects either the combinatorial input path from input line 124 or the registered/latched input path signal on line 181. If cell 188 is programmed to provide a logical zero as the input select signal, the output signal on line 180 is a registered/latched signal, and if cell 188 is programmed to provide a logical one signal as the input select signal, the output signal from multiplexer 185 is a combinatorial signal.

Figure 13:
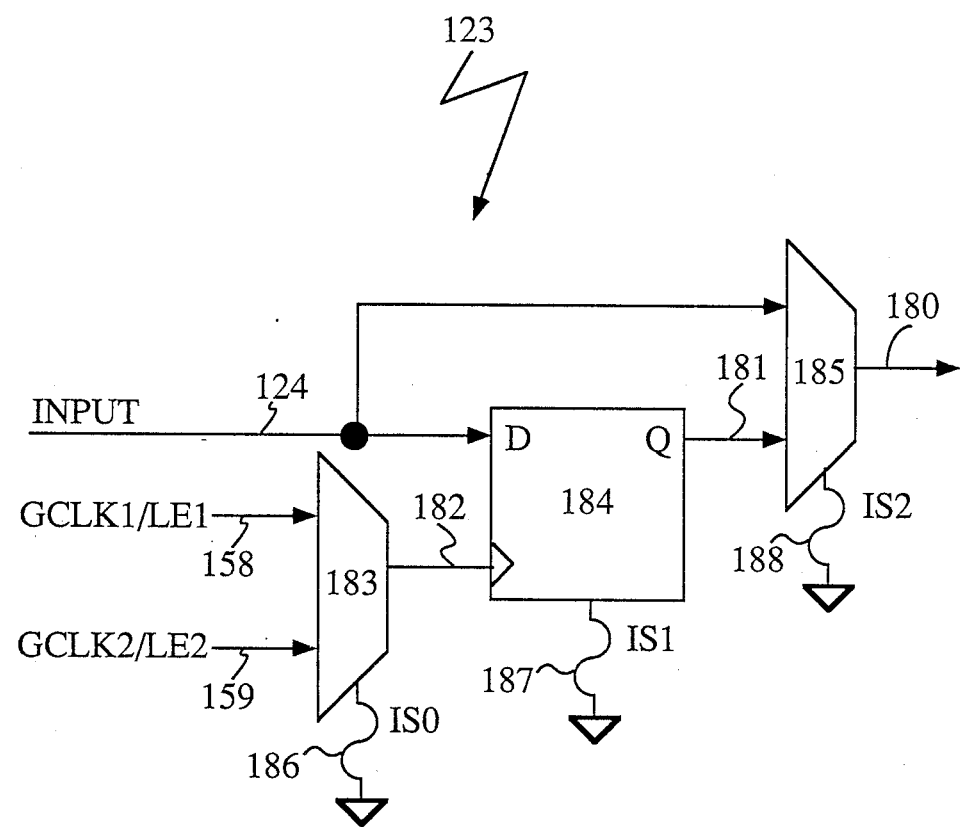
FIG. 13 is a schematic diagram of an input logic macrocell of this invention.

The input logic macrocells (ILM) 123 of this invention are grouped on a bank basis, i.e. more than one input logic macrocell is configured by programming cells 186, 187, and 188 (FIG. 13). Specifically, input logic macrocells 123 associated with dedicated input pins 102 are grouped in either banks of two or a bank of one and the input logic macrocells 123 associated with I/O pins 103 are grouped in banks of four. The embodiment shown in FIG. 7a, which has thirty-eight input logic macrocells, requires a total of forty-two architecture configuration cells and the embodiment shown in FIG. 7b, which has thirty-four input logic macrocells, requires thirty-three input architecture configuration cells. The specific bank groupings for FIGS. 7a and 7b are shown in Table II.

TABLE II

Banking of ILM architecture control cells

| | FIG. 7a<br>Input Pin | | FIG. 7b<br>Input Pin |
|---|---|---|---|
| ILM BANK 0 | $102_0$, $102_1$ | ILM BANK 0 | $102_0$, $102_1$ |
| ILM BANK 1 | $102_2$, $102_3$ | ILM BANK 1 | $102_2$, $102_3$ |
| ILM BANK 2 | $102_4$, $102_5$ | ILM BANK 2 | $102_4$, $102_5$ |
| ILM BANK 3 | $102_6$, $102_7$ | ILM BANK 3 | $102_6$, $102_7$ |
| ILM BANK 4 | $102_8$, $102_9$ | ILM BANK 4 | $102_8$, $102_9$ |
| ILM BANK 5 | $102_{10}$ | ILM BANK 5 | $103A_0$–$103A_3$ |
| ILM BANK 6 | $102_{11}$ | ILM BANK 6 | $103B_0$–$103B_3$ |
| ILM BANK 7 | $102_{12}$, $102_{13}$ | ILM BANK 7 | $103B_4$–$103B_7$ |
| ILM BANK 8 | $103A_0$–$103A_3$ | ILM BANK 8 | $103C_0$–$103C_3$ |
| ILM BANK 9 | $103B_0$–$103B_3$ | ILM BANK 9 | $103D_0$–$103D_3$ |
| ILM BANK 10 | $103B_4$–$103B_7$ | ILM BANK 10 | $103D_4$–$103D_7$ |
| ILM BANK 11 | $103C_0$–$103C_3$ | | |
| ILM BANK 12 | $103D_0$–$103D_3$ | | |
| ILM BANK 13 | $103D_4$–$103D_7$ | | |

Figure 14A:
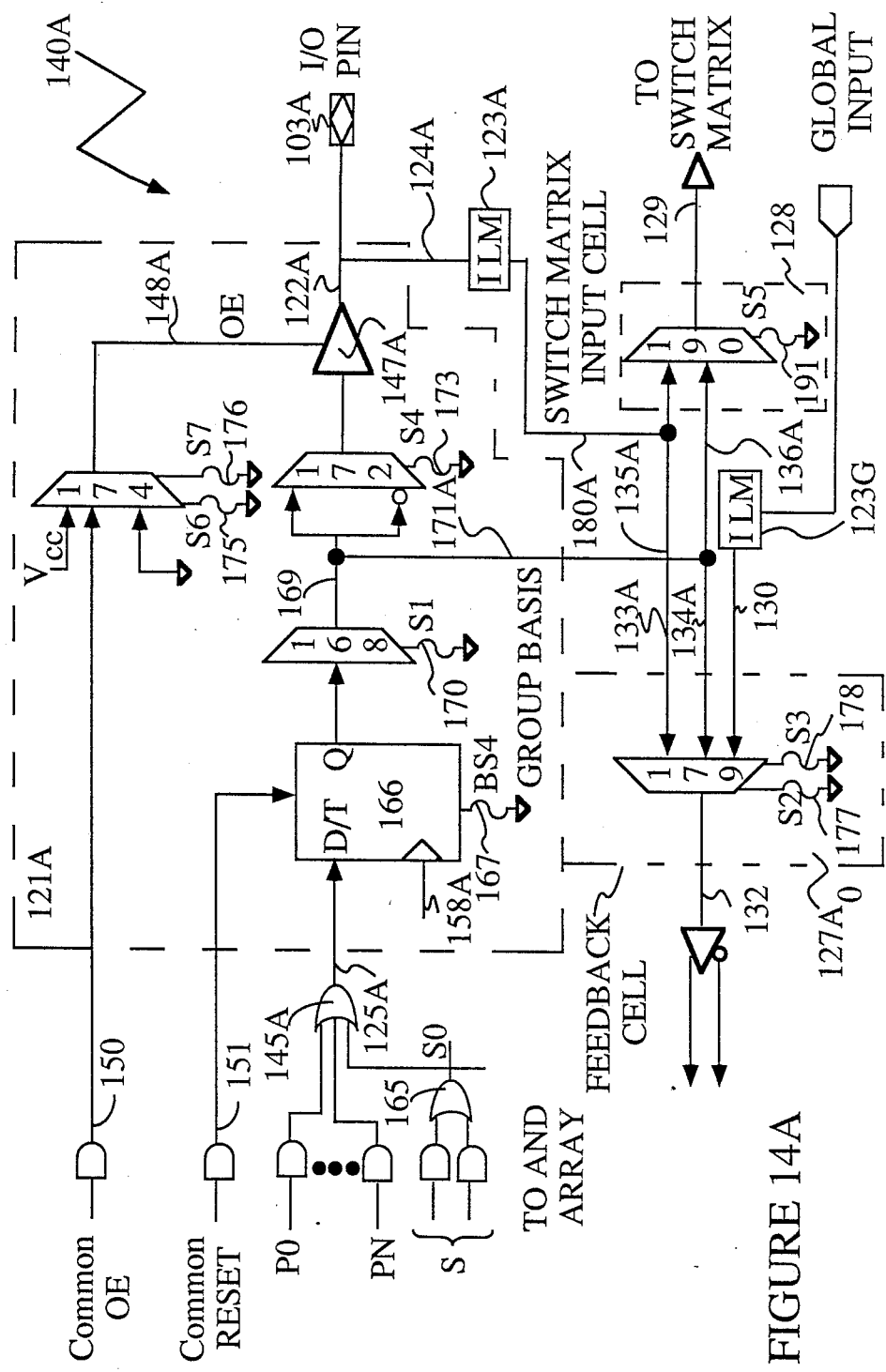
FIGS. 14a, 14b and 14c are schematic diagrams of logic macrocell 140 comprised of output logic macrocell 121, feedback cell 127, and switch matrix input cell 128 of this invention.
Figure 14B:
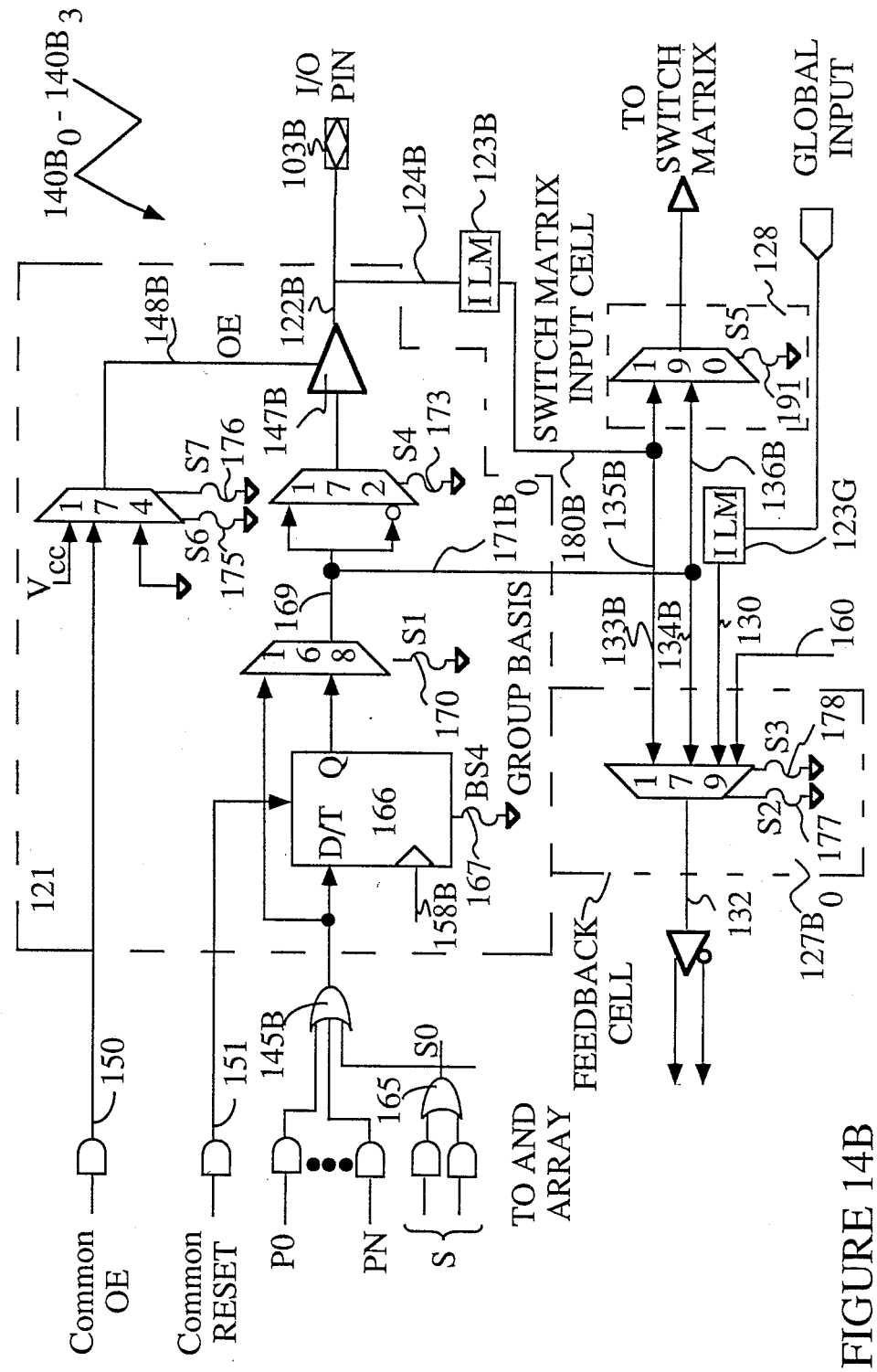
Figure 14C:
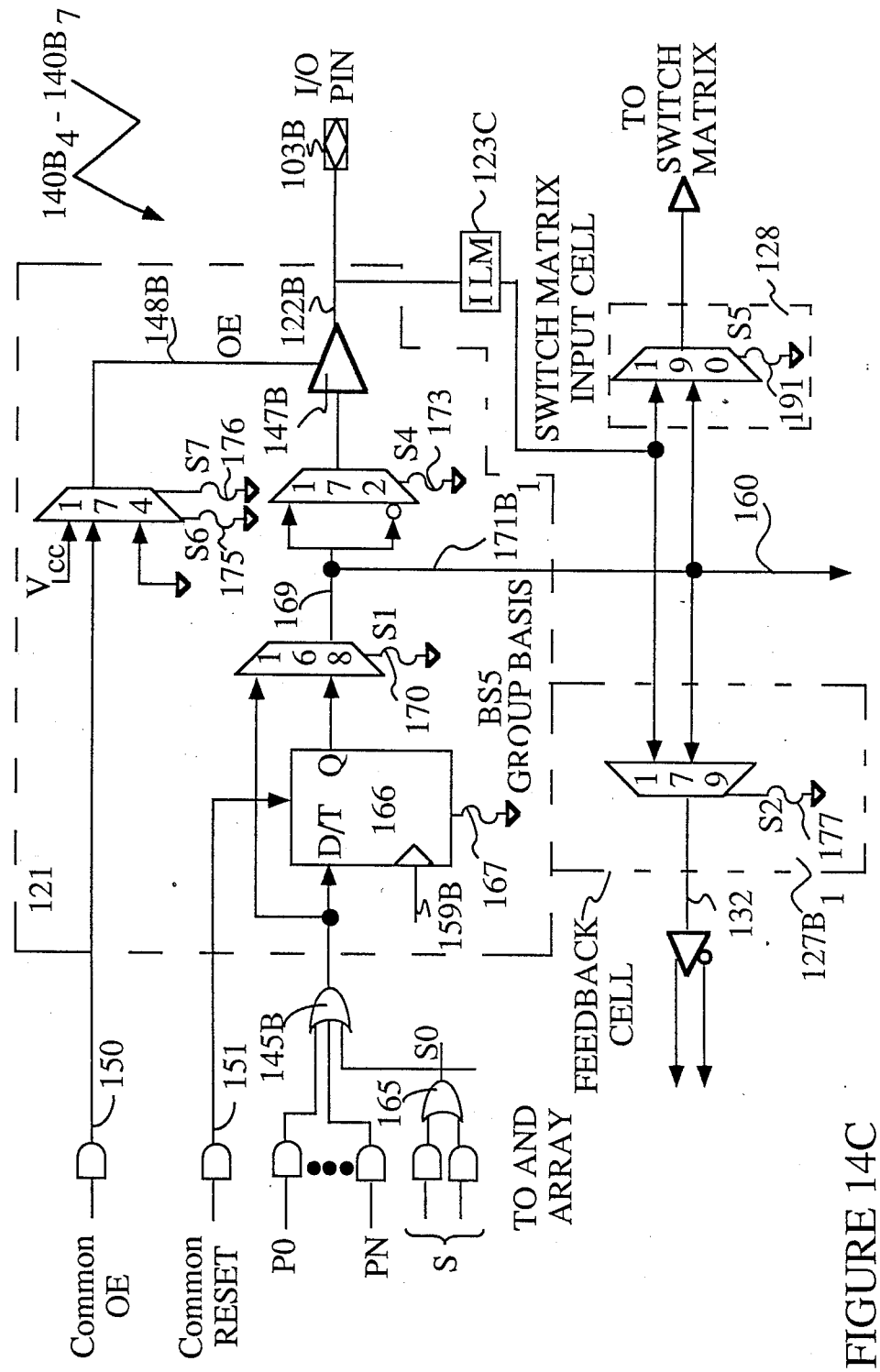

Logic macrocell 140, as implemented in one embodiment of this invention, is illustrated in FIGS. 14a, 14b and 14c. FIG. 14a illustrates macrocell $140A_0$–$140A_3$ in FIG. 9. FIG. 14b illustrates macrocells $140B_0$–$140B_3$ in FIG. 10. FIG. 14c illustrates macrocells $140B_4$–$140B_7$ in FIG. 10. As previously described, each logic macrocell 140 contains a basic output logic macrocell 121, a feedback cell 127, and a switch matrix cell 128. Also, for completeness, input logic macrocell 123 is illustrated as a block connected to cell 140 in FIGS. 14a, 14b and 14c.

In basic output logic macrocell 121, a selected number of product terms PO-PN are non-programmably connected to the input terminals of OR gate 145 and the output terminal of OR gate 165 is programmably connected to an input terminal of OR gate 145, as described above. Output line 125 from OR gate 145 is connected, in one embodiment, to input terminal D/T of programmable storage element 166, which functions as either a D-type register or a T-type register, as well as a first input terminal of a first programmable multiplexer 168. Register 166 has a reset terminal tied to common product line 151 and a clock/LE terminal coupled to either global clock/LE one input line 158 or global clock/LE two input line 159. Output terminal Q of programmable storage element 166 is coupled to a second input terminal of multiplexer 168.

The function of storage element 166 is determined by D/T-type configuration architecture cell 167. In one embodiment, a bank of macrocells 140 has a single D/T-type configuration architecture cell 167 so that the D/T-type configuration architecture cell selects the storage element architecture for the entire bank of macrocells. Specifically, macrocells $140A_0$–$140A_3$ (FIG. 9) are a first bank, the programmable storage elements in buried macrocells $141A_0$–$141A_3$ (FIG. 9) and buried macrocells $119A_0$, $119A_1$, as described below, are a second bank, macrocells $140B_0$–$140B_3$ (FIG. 10) are a third bank, and macrocells $140B_4$–$140B_7$ (FIG. 10) and the programmable storage elements, also as described below, in buried macrocells $119B_0$, $119B_1$ are a fourth bank.

If the D/T-type architecture cell is configured so that a logical zero is supplied as the function select signal to the configuration terminal of storage element 166, the element functions as a level sensitive latch, and if the cell is configured such that a logical one is applied to the configuration terminal of storage element 166, the element 166 functions as a D-type register.

In yet another embodiment (not shown), programmable storage element 166 functions as a T-type register, a D-type register, a J-K flip-flop, an RS flip-flop, or a transparent latch. Since storage element 166 functions in one of four modes, two architecture cells are required. Also, an additional input line or lines may be required to support the function of the J-K flip-flop or the RS flip-flop. Storage element 166 operates as a T-type register when both cells provide a logical zero; as a D-type register when the first cell provides a logical one and the second cell provides a logical zero; as a J-K flip-flop when the first cell provides a logical zero and the second cell provides a logical one; and as RS flip-flop when both cells provide a logical one. In this embodiment, two configuration cells are also used to configure the registers in a bank of output macrocells.

Multiplexer 168 (FIGS. 14a, 14b, and 14c) provides either a combinatorial signal or a registered/latched output signal on output line 169. The output signal from multiplexer 168 is determined by S1 configuration architecture cell 170. If S1 cell 170 is configured as a logical zero for the input select signal, the output signal from multiplexer 168 is registered and conversely, if S1 cell 170 is configured as a logical one for the input select signal, the output signal from multiplexer 168 is combinatorial.

The output signal from multiplexer 168 on line 169 is provided to line 171, to a first input terminal of multiplexer 172, and to an inverter on a second input terminal of multiplexer 172. Polarity control architecture cell 173 for multiplexer 172 determines the output polarity of the signal from macrocell 121 on line 122. If polarity control architecture cell 173 is programmed to provide a logical zero as the input select signal to multiplexer 172, the output polarity is active low, and conversely if polarity control architecture cell 173 is programmed to provide a logical one, the output polarity is active high.

The output signal from multiplexer 172 is supplied to an input terminal of a buffer 147 which drives I/O pin 103 of the integrated circuit package. Buffer 147 is controlled by a signal on I/O enable control line 148, which is the output line from an I/O enable control multiplexer 174. I/O enable control multiplexer 174 has a first input terminal connected to a positive power supply voltage, a second input terminal connected to product line 150 from the local programmable AND array and a third input terminal coupled to ground. Multiplexer 174 has two architecture cells 175, 176 which can be programmed so that the output signal of multiplexer 174 is permanently a logical zero, which tristates output buffer 147 so that I/O pin 103 functions only as an input pin, is permanently a logical one, which enables buffer 147 so that I/O pin 103 functions only as an output pin, or is a logical level which is determined by the signal on product line 150. Specifically, if cell 175 and cell 176 both provide a logical zero as the input select signals to multiplexer 174, output buffer 147 is permanently disabled, while if cell 175 provides a logical zero and cell 176 provides a logical one, output buffer 147 is permanently enabled. If cell 175 provides a logical one, buffer 147 is controlled by the signal level on product line 150, irrespective of the logical level from cell 176.

Output logic macrocell 121 is coupled by line 171 to input line 136 of switch matrix input cell 128 and to input line 134 of feedback cell 127. As illustrated in FIGS. 14a, 14b, and 14c, switch matrix cell 128 is identical for each embodiment of global output logic macrocell 140. However, the configuration of feedback cell 127 and output logic macrocell 121 are quadrant dependent and further the configuration is dependent upon the location within the quadrant for quadrants 100B, 100D.

Each quadrant has eight feedback cells. In quadrants 100A and 100C, four of the feedback cells are identical to cell 127A$_0$ (FIG. 14a) and four are associated with buried macrocells, discussed below. In quadrants 100B and 100D, four of the feedback cells are identical to feedback cell 127B$_0$ (FIG. 14b) and the other four feedback cells are identical to feedback cell 127B$_1$ (FIG. 14c).

Each feedback cell 127 is a programmable multiplexer having N input lines, a single output line and M programmable architectural configuration cells where N and M are selected integers. Specifically, M is the largest power to which 2 can be raised to obtain either a number equal to N or a number such that $2^M$-N is a positive minimum. For example, when two input lines are used, only one architectural cell is necessary, i.e. $2^1=2$. When three or four input lines are used two architectural cells are necessary, and when five to eight input lines are used, three architectural cells are required. Note that the same relationship applies for the number of architectural cells required to configure a programmable storage element where N in this case is the number of programmable functions for the storage element.

The logical output signals from the architectural configuration cells for feedback cell 127 determine which of the signals is passed through feedback cell 127 to output line 132. The potential feedback signal sources, as shown in FIGS. 14a, 14b, and 14c, are: (1) a registered or combinatorial output signal from input logical macrocell 123; (2) a registered or combinatorial output signal from input logic macrocell 123G; (3) the output signal on line 171 from output logic macrocell 121, which is in the same macrocell 140 as feedback cell 127; or (4) the output signal from an output macrocell 121 in a macrocell in the same quadrant as the feedback cell 127. The feedback cells and the sources of feedback data are organized to provide maximum flexibility for the circuit of this invention.

Feedback cell 127A$_0$ (FIG. 14a) provides either a signal from input logic macrocell 123, a signal from input logic macrocell 123G, or a signal on line 171A from output logic macrocell 121A. When both S2 and S3 cells 177, 178 are programmed to provide a logical zero as the input select signals to feedback cell multiplexer 179, the signal from input logic macrocell 123G is provided to input line 132 of the programmable AND array. When S2 cell 177 provides a logical zero to multiplexer 179, and S3 cell 178 provides a logical one signal to multiplexer 179, the signal from input logic macrocell 123, which is coupled to local I/O pin 103, is provided to input line 132 of programmable AND array. Finally, if S2 cell 177 provides a logical one to multiplexer 179 the signal on line 171A is fed back to input line 132 of the programmable AND array. Notice, that if output buffer 147 is enabled so that I/O pin 103 is an output pin, then input logic macrocell 123 provides either a combinatorial or a registered/latched signal of the output signal of macrocell 121A to feedback cell 179. Thus, in this configuration, the signal on line 133A to multiplexer 179 is a function of the signal on line 134A to multiplexer 179.

The feedback cells (FIGS. 14b and 14c) for quadrants 100B also provide eight feedback input lines to programmable AND array 142B (FIG. 10). The feedback cells for quadrant 100D are identical to those shown in FIGS. 14b and 14c for quadrant 100B. Feedback cells 127B$_0$, 127B$_1$, as illustrated in FIGS. 14b and 14c, are designed to permit use of output macrocell 121 as a buried state macrocell when output buffer 147B is disabled by the signal from I/O enable control multiplexer 174. Specifically, the output signal from macrocell 121 on line 171B$_1$ (FIG. 14c) is provided as a feedback signal to feedback cell 127B$_0$ (FIG. 14b) or, as illustrated in FIG. 10, the output signal from macrocell 140B$_0$ is a feedback signal to macrocell 140B$_7$; the output signal of macrocell 140B$_6$ is a feedback signal to macrocell 140B$_1$; the output signal of macrocell 140B$_5$ is a feedback signal to macrocell 140B$_2$; and the output signal of macrocell 140B$_4$ is a feedback signal to macrocell 140B$_3$. This pairing of macrocells results in a more uniform product term distribution and better utilization of internal logic resources.

Feedback cell 127B$_0$ has input signals from four sources: an input signal on line 133B from logic macrocell 123B from I/O pin 103B, an input signal on line 130 from global input logic macrocell 123G on dedicated input pin 102, an input signal from line 134B which is connected to line 171 of the same output logic macrocell as feedback cell 127B$_1$, and an input signal from line 160 which is connected to line 171B$_1$ of a companion global output macrocell, as described above.

The feedback source selection for feedback cell 127B$_0$ is controlled by S2 and S3 feedback configuration cells 177, 178. When both cells 177, 178 provide a logical zero to multiplexer 179, multiplexer 179 passes the signal from global input pin 102 to line 132. When cell 177 provides a logical zero and cell 178 provides a logical one, multiplexer 179 passes the signal from the local I/O pin 103.

Unlike the quadrant A and C feedback cells, feedback cell 127B$_0$ is sensitive to the logical level from cell 178 when cell 177 provides a logical one to multiplexer 179. Specifically, when cell 177 provides a logical one and cell 178 a logical zero, the signal on line 160 is passed through multiplexer 179 and when cells 177, 178 both provide a logical one, the signal on line 134B is passed through multiplexer 179.

The feedback cell 127B$_1$ (FIG. 14c) receives input signals from either input logic macrocell 123 on local I/O pin 103B or line 171B$_1$. Feedback source selection is controlled by the feedback configuration cell 177. When cell 177 is a logical zero, the signal from input logic macro 123 is fed back to the programmable AND array and when cell 177 is a logical one the signal from the output logic macrocell 121 is fed back to the array.

The configurations discussed for the feedback cells are illustrative only and are not intended to limit the scope of the invention. Further, alternative programmable multiplexer configurations are possible, e.g., replacing the 4:1 multiplexer in FIG. 14b with two 2:1 multiplexers. A first 2:1 multiplexer would, for example, select a signal from the input lines and a second 2:1 multiplexer would select a signal from one of the macrocell feedback paths. However, using two 2:1 multiplexers will require a larger logic array because the number of input lines to the array is increased. Thus, while such an embodiment offers somewhat more flexibility, the flexibility is obtained only at the expense of performance and cost because the larger array size reduces the speed of the device and requires a larger silicon die. The embodiment, illustrated in FIGS. 14b, achieves an optimum balance between functionality, silicon die size and performance.

Figure 15A:
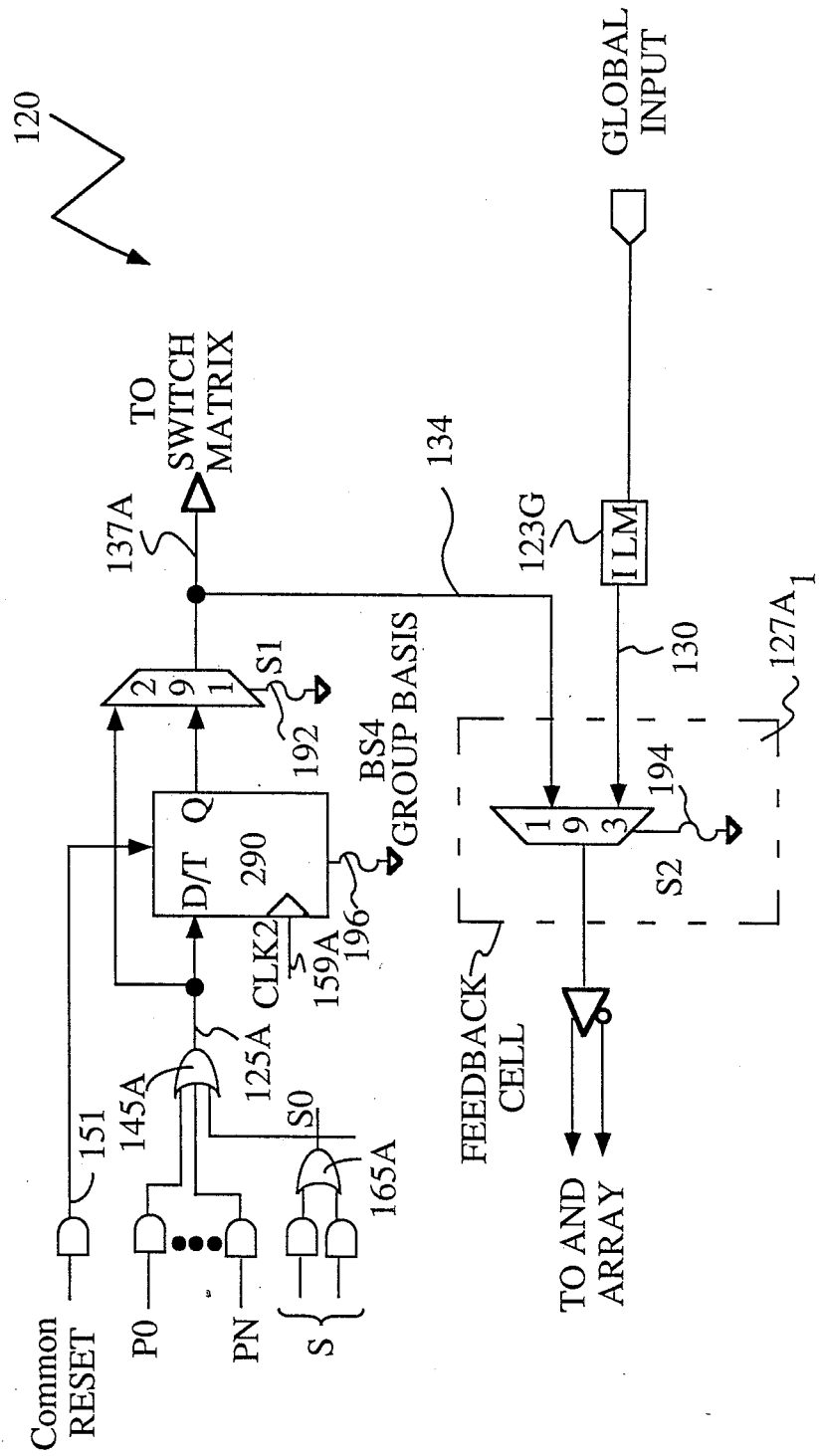
FIGS. 15a and 15b are a schematic diagram of the buried logic macrocells 120, 119 of this invention.
Figure 15B:
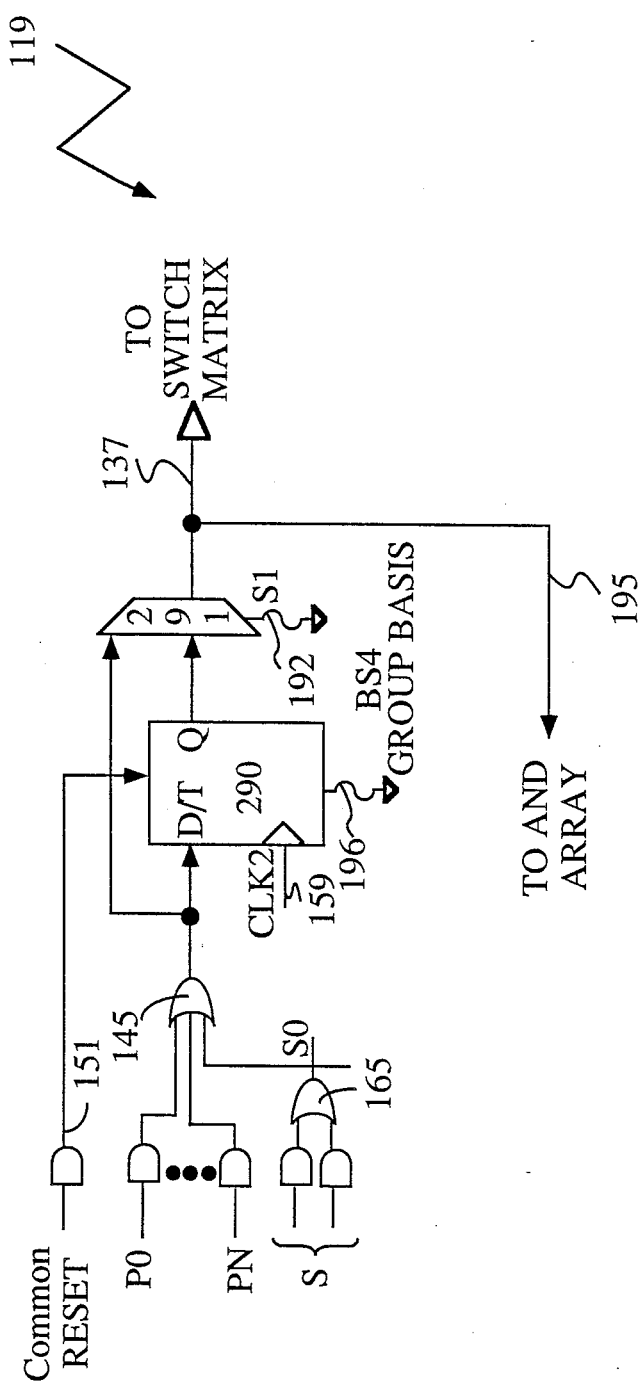

Buried macrocells 119, 120 (FIGS. 7a and 7b) are shown in FIG. 15b and 15a respectively. In buried cell 120, a selected number of product terms PO-PN from programmable AND array 142A are non-programmably connected to the input terminal of OR gate 145A and another input terminal of OR gate 145A is programmably connected to the output terminal of OR gate 165A so that OR gate 145A selectively receives the sum of the two shared product terms S which are input lines to OR gate 165A. The output line 125A from OR gate 145A is connected, in one embodiment, to the input terminal D/T of programmable storage element 290 as well as a first input terminal of a first programmable multiplexer 291.

Storage element 290 has a reset terminal tied to product line 151 and a clock/LE terminal coupled to global clock/LE two input line 159A. Output terminal Q of storage element 290 is connected to a second input terminal of multiplexer 291 and the output line 137A from multiplexer 291 couples the buried macrocell to switch matrix 101. The output line 137A is also tied to feedback cell 127A$_1$ by line 134, as is described more completely below.

The function of programmable storage element 290 is determined by architecture control cell 196. If cell 196 provides a logical zero signal as the function select signal to the configuration terminal of storage element 290, the element functions as a T-type register and if the cell is configured so that a logical one signal is applied to the configuration terminal of storage element 290, the element functions as an edge-triggered D-type register.

In one embodiment, architecture control cell 196 determines the function of the bank of registers contained in all of the buried macrocells in quadrant 100A. Also, as previously described for programmable storage element 166 in output macrocell 121, programmable storage element 290, in another embodiment (not shown), functions as one of a D-type register, a T-type register, a J-K flip-flop, a RS flip-flop, or a transparent latch.

Multiplexer 291 provides either a combinatorial signal or a registered output signal on output line 137 as determined by the input select signal provided by multiplexer architecture cell 192. If cell 192 is configured to provide a logical zero, the output signal from multiplexer 291 is registered and conversely, if cell 192 is configured to provide a logical one signal to multiplexer 291 the output signal from the multiplexer is combinatorial.

A comparison of the buried macrocell 120 (FIG. 15a) with output macrocell 121 (FIG. 14) shows that buried macrocell 120 does not have a controllable output buffer or a means for determining the output polarity. However, these functions are effectively implemented using switch matrix 101 and feedback cell 127A$_1$ so that their incorporation into the buried cell 120 would only add redundant capability.

The feedback cell in FIG. 15b is identical to that in FIG. 15a, except output line 137 is not coupled to a separate feedback cell. Rather buried macrocell 119 provides feedback directly on line 195 to the programmable AND array.

Feedback cell 127A$_1$ (FIG. 15a) represents a fourth embodiment of the feedback cell of this invention. Feedback cell 127A$_1$ contains programmable multiplexer 193 which is equivalent to those described previously with respect to cells 127A$_0$, 127B$_0$, 127B$_1$ in FIGS. 14a, 14b and 14c. Multiplexer 193 has two input lines 134, 130 which provide signals from the buried macrocell and the global input pin respectively.

As shown in FIGS. 14a, 14b and 14c, switch matrix cells 128 are identical in all quadrants of the programmable logic device of this invention. Quadrant 100A has four switch matrix cells, which are represented by switch matrix cell 127A in FIG. 7. Quadrant 100B has eight switch matrix input cells 128, four as shown in FIG. 14a and four as shown in FIG. 14b.

Each switch matrix input cell 128 (FIG. 14a–14c) has two input lines to a programmable multiplexer 190, a first coupled to input logic macrocell 123 and a second coupled to output line 171 of output logic macrocell 121. The output signal of multiplexer 190 on line 129 is controlled by switch matrix architecture cell 191.

The source of the input signal on line 171 to switch matrix cell 128 from output macrocell 121 is prior to multiplexer 172 which determines the output signal polarity for output macrocell 121. Thus, when pin 103 is used as an input pin, i.e. buffer 147 is tristate, the signal from output logic macrocell 121 can only be inverted after going through switch matrix 101 and to programmable AND array 142, where buffer 143 provides both a true and complement signal, as previously described. However, if buffer 147 is enabled then either the output signal from output macrocell 121 to pin 103 or the signal on line 171 can be provided to switch matrix 101.

In each switch matrix cell 128, if configuration cell 191 provides a logical zero signal as the input select signal to multiplexer 190, the signal on line 171 from output logic macro 121 is provided to switch matrix 101 and conversely, if multiplexer architecture control cell 191 provides a logical one signal to multiplexer 190, a signal derived from input pin 103 is provided to switch matrix 101.

Figure 16:
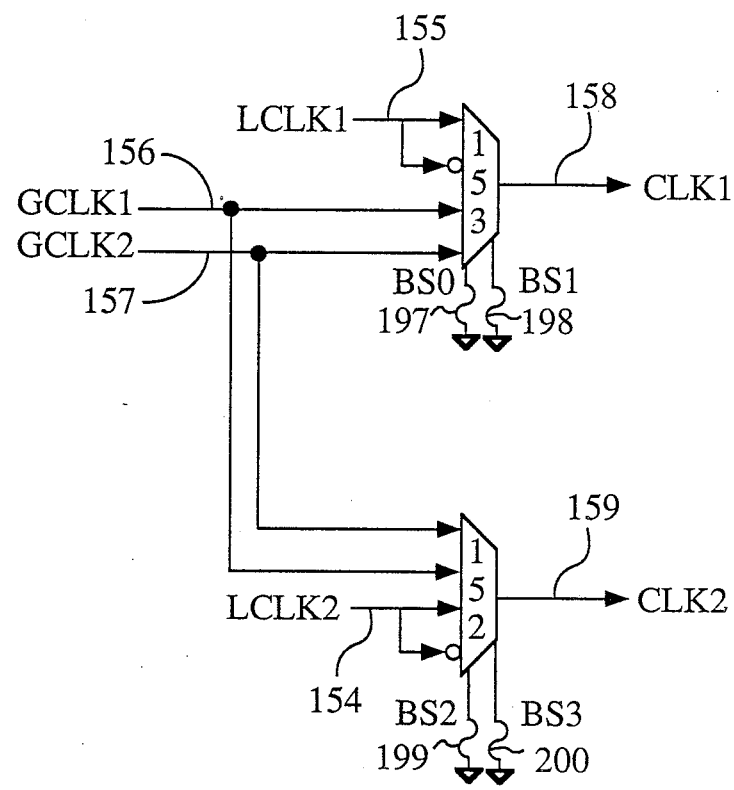
FIG. 16 is a schematic diagram of the programmable clock multiplexers of this invention.
Figure 17:
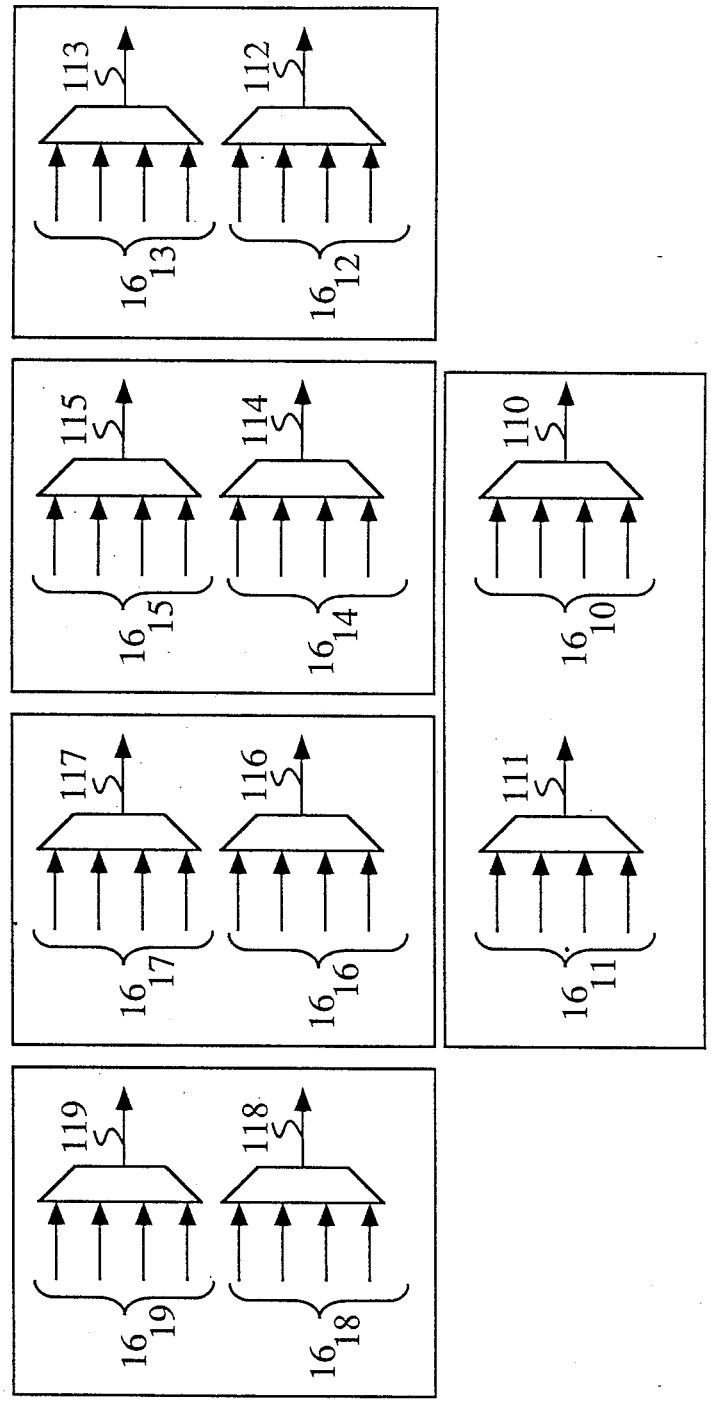
FIG. 17 is a schematic diagram of the switch matrix multiplexers arrangement for each quadrant of this invention.

Each quadrant of the programmable logic device has a clock 1 multiplexer 153 and a clock 2 multiplexer 152 (FIG. 16). Hence, the programmable logic device has a total of eight clock multiplexers. As illustrated in FIG. 16, each of the multiplexers is a programmable 4:1 multiplexer. Multiplexer 153, as previously described, has a first input line 155 which is a product line from the programmable AND array 142 in the quadrant containing multiplexer 153. Product line 155 is also connected to the inverter on the second terminal of multiplexer 153. Lines 156, 157 from the global clock/latch enable input pins are connected to the third and fourth input terminals respectively of multiplexer 153. The output terminal of multiplexer 153 is connected to clock/latch enable (clock/LE) one line 158. Multiplexer 152 is similarly connected using clock/LE lines 156, 157 and the product line 154 from programmable AND array 142. Thus, as previously described, each multiplexer has two synchronous clock/LE sources and a true and complement of the asynchronous clock/LE source.

Each multiplexer 152, 153 has two clock/LE architecture selection cells 197, 198, 199, 200 and each multiplexer is configured as shown in Table III. In an alternative embodiment, if only a single global clock/LE signal is required or if no clock signals are required for an application utilizing the programmable logic device of this invention, the global clock/LE pins may be configured as dedicated input pin or pins.

TABLE III

| Cell 197 (Cell 199) | Cell 198 (Cell 200) | Clock Selection |
| --- | --- | --- |
| 0 | 0 | Product line trailing edge |
| 0 | 1 | Product line raising edge |
| 1 | 0 | Global clock 2 |
| 1 | 1 | Global clock 1 |

Switch matrix 101 provides a means for selecting ten input signals, i.e. ten bits of information, for the logic circuit in each quadrant. The switch matrix can route signals from one quadrant to another quadrant, signals from the dedicated input pins to a quadrant or quadrants and a signal from a quadrant back to that quadrant. The flexibility provided by the ten bit switch matrix in conjunction with the segmented structure of the programmable logic device of this invention provides enhanced capability over prior art programmable logic devices. The signal transfer through this switch matrix is very rapid and the ten bit flexibility provides numerous combinations of input signals to each segment, i.e. quadrant, of the device.

In one embodiment, the switch matrix is implemented using programmable multiplexers. Multiple configurations of switch matrix 101 are feasible using programmable multiplexers. The number of multiplexers and size of each multiplexer is a tradeoff between the size of the die and silicon utilization. A preferred embodiment is described here and in view of this discussion other embodiments will be apparent to those skilled in the art.

Since the logic circuit in each quadrant has ten input lines from switch matrix 101, ten programmable multiplexers, one for each input bit, are used for each quadrant. Thus, switch matrix 101 consists of four banks of ten programmable multiplexers. The ten bits for each quadrant are selected using ten 4:1 programmable multiplexers (FIGS. 17 and 18a–18d). Each 4:1 programmable multiplexer is controlled by two switch matrix architectural cells SM0 and SM1. Hence, there are a total of 20 switch matrix architecture cells for each quadrant.

The input lines to the 4:1 multiplexers for each quadrant are from ten dedicated input pins and ten output lines from each of the three other quadrants for a total of forty input lines or four for each of the ten multiplexers. For example, in quadrant 100A, the input lines from the three other quadrants are from quadrants 100B, 100C, and 100D. The configuration of input lines for each quadrant to the switch matrix provide a broad range of flexible options for programmable AND array input signals (FIG. 17 and FIGS. 18a–18d). Some of the options are ten dedicated input signals from dedicated input pins $102_0$–$102_9$; ten inputs from other quadrants; or any combination of ten input signals, e.g., for quadrant 100A two signals from dedicated inputs, three signals from quadrant 100B, two signals from quadrant 100C, and three signals from quadrant 100D.

The output signal for each programmable multiplexer for the combinations of the multiplexer configuration cells is shown in Table IV for the 4:1 programmable multiplexers. The first two columns in Table IV represent the logical output signals, the input select signals, of the configuration cells and the third, fourth, fifth and sixth columns represent the signals on the input lines for quadrant 100A, quadrant 100B, quadrant 100C, and quadrant 100D, respectively. For example, as shown by the first row in Table IV, when any 4:1 programmable multiplexer in the switch matrix for quadrant 100A has both configuration cells providing a logical zero signal, the signal on the line from quadrant 100B is passed through the multiplexer. Similarly, for quadrant 100B, any of the switch matrix 4:1 programmable multiplexers having both configuration cells providing a logical zero pass the signal on the line from quadrant 100C through the multiplexer. In the last row of Table IV, "102" represents the signal on a dedicated input pin. When one of the programmable multiplexers in switch matrix 101 is described as passing a signal from an input line through the multiplexer, this means that the input line of the multiplexer carrying the signal is connected to the output line of the multiplexer and all other input lines of the multiplexer are disconnected from the multiplexer output line.

TABLE IV

| SM1 | SM0 | INPUT SIGNAL FOR QUADRANT 100 A | INPUT SIGNAL FOR QUADRANT 100 B | INPUT SIGNAL FOR QUADRANT 100 C | INPUT SIGNAL FOR QUADRANT 100 D |
| --- | --- | --- | --- | --- | --- |
| 0 | 0 | 100 B | 100 C | 100 B | 100 C |
| 0 | 1 | 100 D | 100 D | 100 D | 100 C |
| 1 | 0 | 100 C | 100 A | 100 A | 100 B |
| 1 | 1 | 102 | 102 | 102 | 100 A |
|   |   |     |     |     | 102 |

Switch matrix 101 increases the logic flexibility of the programmable logic device. As previously described, the product terms in the programmable AND/OR array are distributed in a variable distribution in each quadrant and each output macrocell can share two additional product terms. Hence, each individual macrocell has a fixed number of product terms. However, this does not limit the number of product terms which can be combined in the programmable logic device because the macrocell output signals from different quadrants can be routed through the switch matrix and the same macrocell outputs of different quadrants can be routed to different array inputs in a single quadrant. For example, by selecting the macrocell from each quadrant with the maximum number of product terms, i.e. macrocell which has sixteen product terms and routing output from macrocell $140B_1$ in quadrant 100B, macrocell $140C_1$ in quadrant 100C, and macrocell $140D_1$ in quadrant 100D to the input lines of programmable AND array 142A in quadrant 100A to generate a logical output signal with up to sixty-one product terms on macrocell $140A_1$ of quadrant 100A (FIG. 19). In FIG. 19, the numbers in quotation marks are the logical signals from SM0, SM1 cells, respectively.

Note that three of the product lines of the sixteen product terms in macrocell $140A_1$ of quadrant 100A are required to route the output signals from quadrants 100B, 100C and 100D and so that only sixty-one product terms are summed rather than sixty-four product terms. More generally, if one has a maximum of K sum/product terms associated with a macrocell and the four quadrants are replaced by N sectors with $N \geq 2$, a total of N.K-(N-1) product terms are generated in the analog of FIG. 19. This method of bit rotating products through the switch matrix results in significantly increased logic capability for the programmed logic device with a minimum delay time.

Switch interconnect matrix 101 is arranged so that each signal passing through this matrix passes through the same number of components within the switch matrix. This insures that the time delays for all signals passing through switch matrix 101 are substantially the same and allows resynchronization, if desired, of groups of contemporaneous signals passing through switch matrix 101.

To achieve maximum speed through switch matrix 101, the matrix has been purposely implemented with a somewhat reduced functionality. The switch matrix can be implemented as a full cross-point switch to achieve enhanced functionality. In this embodiment (not shown), the input lines to the full cross-point switch matrix are ten lines from each of the quadrants and ten lines from the dedicated input pins for a total of fifty input lines. The cross-point switch matrix has forty output lines. Each input line to the cross-point switch matrix is programmably connected to each output line of the cross-point switch matrix. Thus, each of the ten output lines from the cross-point switch matrix to a quadrant can be connected to any of the fifty input lines to the full cross-point switch matrix. The enhanced functionality of the full cross-point switch matrix results in diminished speed performance and increased die size.

Switch matrix 101 was selected to provide a balance between functionality, speed performance and die size. Switch matrix 101 is structured as a single, centralized switch to achieve the uniform, fixed delay time for all signal paths through switch matrix 101, as described above. However, switch matrix 101 may also be implemented as multiple decentralized switches. In view of the description of switch matrix 101 of this invention and the full cross-point switch matrix, other switch matrices, having varying degrees of functionality, speed and die size, could be designed and implemented by those skilled in the art.

Figure 20A:
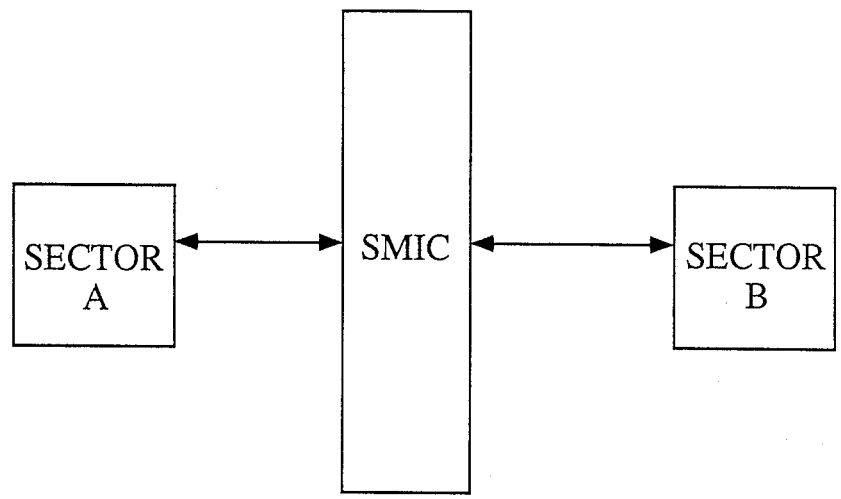
FIG. 20 conceptually illustrates alternative embodiments of this invention.
Figure 20B:
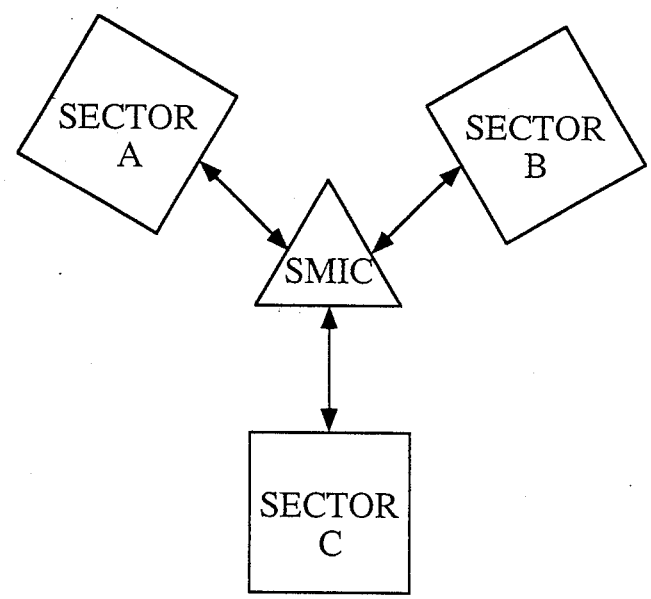
Figure 20C:
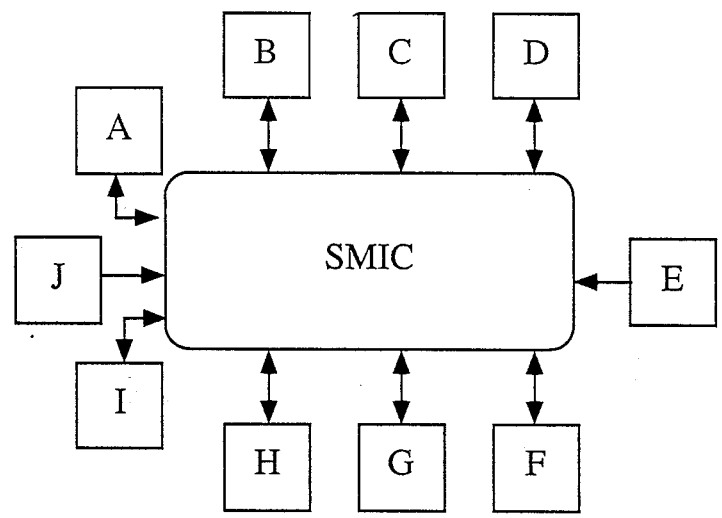
Figure 20D:
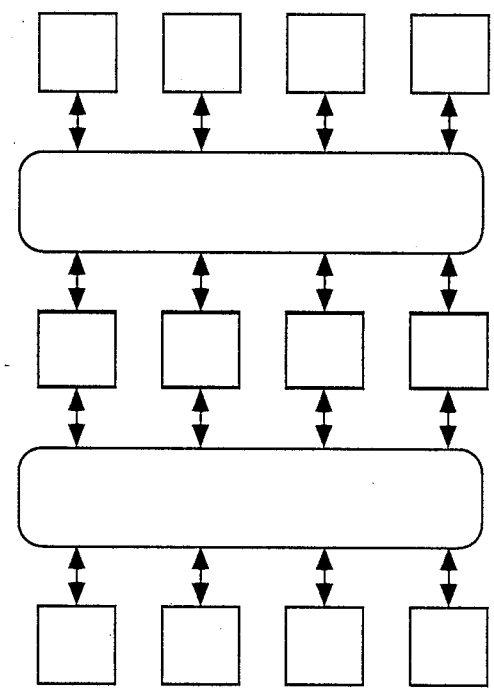

The programmable cell array (PCA) of this invention is not limited to a quadrant arrangement. Many other configurations will work as well. The configuration selected is a function of silicon die size, cost and performance requirements. FIGS. 20A and 20B schematically illustrate a PCA having two or three sectors, respectively, and an interconnecting switch matrix. The sectors A, B and C, which correspond to the quadrants A, B, C and D discussed above, may be identical, or they may have different numbers of BSMs and OLMs and may differ in other features as well. Another alternative is schematically illustrated in FIG. 20C, in which a number N of sectors are positioned around a control switch matrix; in FIG. 20C, N=10. In a fourth alternative, illustrated in FIG. 20D, two or more switch matrices are positioned between consecutive "rows" of sectors, with each two consecutive "rows" of such sectors communicating through the adjacent switch matrix that lies between them. These alternatives, and many others not set forth here, all rely on the notion of two (or more) sectors communicating with each other through an adjacent switch matrix. This is a central feature of the invention.

In the preceding discussion, for ease of expression, only fuses have been illustrated as programmable architectural cells. The fuses in these applications may be replaced by EPROM cells or by EEPROM cells in accordance with the invention.

The preceding discussion has described a programmable AND/OR array as an assembly of AND gates to form products of logical variables, followed by an assembly of OR gates to form sums of such product terms. However, using logical transforms known to those skilled in the art, in a preferred embodiment the programmable AND, fixed OR array (AND/OR array) is replaced by a programmable NOR, fixed NOR array. The use of NOR logic provides enhanced speed over the equivalent programmable AND/OR array, but the logic functions of the two arrays are equivalent.

The AND/OR array also may include inverters that form complements ($\overline{A}$) of the input signals (A). The AND/OR array may also be arranged as an assembly of OR gates to form sums of logical variables, followed by an assembly of AND gates to form products of such sums, by utilizing the DeMorgan theorems $$\overline{A \cdot B} = \overline{A} + \overline{B},$$

$$\overline{A + B} = \overline{A} \cdot \overline{B}$$

in a manner well known to those of ordinary skill in the art. For example, the sum of logical product terms $A \cdot B + C \cdot D + E \cdot F \cdot G$ may be written as the complement of the product of sums of complemented variables, viz $$A \cdot B + C \cdot D + E \cdot F \cdot G = \overline{(\overline{A} + \overline{B}) \cdot (\overline{C} + \overline{D}) \cdot (\overline{E} + \overline{F} + \overline{G})}$$

For ease of reference, a logical sum of logical products and a logical product of logical sums are collectively referred to herein as "logical sum/product terms."

The gate configuration illustrated in FIG. 11 is expressed in the PAL mode, where the AND gates are normally programmable and the OR gates are normally fixed. Using the DeMorgan theorems applied above and incorporating signal inverters in the signal paths, one can also express the gate configuration in terms of programmable OR gates and fixed AND gates. More generally, one may configure the gates in a PLA mode, wherein both AND gates and OR gates are programmable.

To simplify testing of the programmable logic device, the device has pre-load circuitry that provides an easy method for testing the logic functionality. The pre-load circuitry allows any arbitrary state value to be loaded into the output macrocells. A typical functional test sequence would verify all possible state transitions for the device. Such a test sequence requires the ability to set the state registers into arbitrary present state values and to set the device into an arbitrary present input value. Once the device is so configured, the state machine is clocked into a new state or next state which is then checked to validate the transition from the present state. In this way, any particular state transition can be checked. Since the pre-load circuitry allows the programmable logic device to go directly to any desired state, test sequences may be greatly shortened. Also, all possible values can be tested, thus greatly reducing test time and development costs and guaranteeing proper end system operation.

Since the programmable logic device can have up to twenty-four buried state macrocells a mechanism is provided for observing the contents of these buried state registers on the I/O pins for testability. This observability mode is entered by applying a super voltage to certain pins. Once this mode is entered, the combinatorial output data is suppressed from appearing on the I/O pins and this allows observation of the contents of output registers on the output pins associated with the output logic macrocells. This configuration permits easy debugging and tracing of the buried state registers. Finally, all of the programmable logic device output registers and input registers/latches have been designed to be reset during device power-up. Following the power-up, all registers including the input register/latches are cleared setting the outputs to a state determined by the output select multiplexer. This feature is especially valuable in simplifying state machine testing.

While the present invention has been described in terms of an embodiment having programmable multiplexers with a specific number of input lines and a specific number of architectural configuration cells, these embodiments are illustrative only and not intended to limit the scope of the invention. Following the principles of this invention, one skilled in the art could implement various configurations of lines to the multiplexers and add or subtract configuration cells as previously described to achieve a flexibility not present in the prior art programmable devices.

We claim:

1. A semiconductor integrated circuit comprising:
   first logic circuit means, having a first multiplicity of input lines and a first multiplicity of output lines, for providing a first output signal on at least one of said first multiplicity of output lines in response to selected input signals on said first multiplicity of input lines, said first output signal being a logic function of the selected input signals on said first multiplicity of input lines;
   second logic circuit means, having a second multiplicity of input lines and a second multiplicity of output lines, for providing a second output signal on at least one of said second multiplicity of output lines in response to selected input signals on said second multiplicity of input lines, said second output signal being a logic function of selected input signals on said second multiplicity of input lines;
   programmable switch means for selectively interconnecting said first logic circuit means and said second logic circuit means wherein said programmable switch means selectively couples at least one output line from said first multiplicity of output lines to at least one of said first multiplicity of input lines or one of said second multiplicity of input lines, and further wherein said programmable switch means selectively couples at least one output line from said second multiplicity of output lines to at least one of said first multiplicity of input lines or one of said second multiplicity of input lines.

2. A semiconductor integrated circuit, as in claim 1, wherein:
   said programmable switch means comprises a multiplicity of multiplexing means, each of said multiplexing means having a multiplicity of input lines and an output line, and each of said multiplexing means in response to an input select signal, passing therethrough a signal on a selected input line to the output line; and
   means for providing an input select signal to each of the multiplicity of multiplexing means.

3. A semiconductor integrated circuit, as in claim 1, wherein:
   the first logic circuit means comprises a first programmable logic circuit means and the second logic circuit means comprises a second programmable logic circuit means.

4. An integrated circuit comprising:
   an array of programmable logic devices having a predetermined number of input/output terminals;
   programmed switch interconnection means, operatively connected to each programmable logic device in the array, for selectively passing a signal from one programmable logic device to another programmable logic device, wherein programmable logic device comprises:
   programmable array means for receiving a plurality of input signals and generating a plurality of output signals;
   programmable input logic cells, each being coupled to an input/output terminal, having an output line coupled to the programmable switch interconnection means, and being positioned to receive a signal from the input/output terminal and to pass the signal to the switch interconnection means;
   programmable feedback logic cells, each being coupled to the output line of an input logic cell and to the programmable array means, and each feedback logic cell being positioned to receive signal from the input logic cell and to selectively feed the signal to the programmable array means as one of the programmable array means input signals; and
   programmable output logic cells, each being coupled to the programmable array means, to a feedback logic cell, to an input/output terminals, and to the programmable switch interconnection means, and each programmable output logic cell being positioned to receive one of said plurality of output signals from the programmable array means and to selectively pass this output signal to the input/output terminal, to the feedback logic cell, and to the programmable switch interconnection means.

5. An integrated circuit as in claim 4 wherein each logic device further comprises:
   buried state cells, each being coupled to the programmable switch interconnect means and to the programmable array means, and each buried state cell being positioned to receive one of said plurality of output signals from said programmable array means and to feed the output signal to the programmable array means as one of the plurality of programmable array means input signals and to feed the output signal to said programmable switch interconnection means.

6. An integrated circuit as in claim 4 wherein each input logic cell further comprises:
   a first signal source;
   a second signal source;
   first programmable means, operatively connected to said first signal source and to said second signal source and having an output line, for coupling therethrough said first signal or said second signal to the output line of said first programmable means;
   programmable storage means having an input terminal operatively coupled to said input/output pin, a clock/latch enable terminal connected to said output line of said first programmable means, and an output terminal; and
   second programmable means, operatively connected to said input/output pin, to said output terminal of said programmable storage means and to the output line of the input logic cell, for coupling therethrough a signal from said pin or a signal from said programmable storage means to the output line of the input logic cell.

7. An integrated circuit as in claim 4 wherein each output logic cell further comprises:
   programmable storage means having an input terminal coupled to said programmable array means and an output terminal;
   first programmable means, operatively connected to the programmable array means and to said output terminal of said programmable storage means, and having an output line, for coupling therethrough to the output line of said first programmable means a signal from said programmable array means or a signal from said programmable storage means;
   second programmable means having an input terminal connected to said first programmable means output line, a signal inverting input terminal connected to said first programmable means output line, and an output line, said second programmable means for coupling therethrough to the output line of said second programmable means one of a signal on the output line of said first programmable means and an inverse signal of the signal on the output line of said first programmable means;
   means for selectively providing an enable signal; and
   means, responsive to the signal from said second programmable means and to the enable signal for selectively providing said signal from said second programmable means to said pin, wherein said providing means passes said signal from said second programmable means therethrough only upon receiving said enable signal.

8. An input structure between a circuit input line and a pin of an integrated circuit package containing said circuit comprising:
   a first signal source;
   a second signal source;
   first programmable means, operatively connected to said first signal source and to said second signal source and having an output line, for coupling therethrough said first signal or said second signal to said output line of said first programmable means;
   programmable storage means having an input terminal coupled to said pin, an output terminal, and a clock/latch enable terminal connected to said output line of said first programmable means; and
   second programmable means, operatively connected to said pin and to said output terminal of said programmable storage means, for coupling therethrough a signal from said pin or a signal from said programmable storage means to said circuit input line.

9. An output structure between a circuit output line and a pin of an integrated circuit package containing said circuit comprising:
   first programmable storage means having an input terminal coupled to said circuit output line and an output terminal;
   first programmable means, operatively connected to said circuit output line and to said output terminal of said first programmable storage means, and having an output line, said first programmable means for coupling therethrough to the output line of said first programmable means a signal from said circuit output line or a signal from said first programmable storage means;
   second programmable means having an input terminal connected to said first programmable means output line, a signal inverting input terminal connected to said first programmable means output line, and an output line, said second programmable means for coupling therethrough to the output line of said second programmable means on of a signal on the output line of said first programmable means and an inverse signal of the signal on the output line of said first programmable means;
   third programmable means for selectively providing an enable signal; and
   means, responsive to the signal from said second programmable means and to the enable signal for selectively providing said signal from said second programmable means to said pin, wherein said providing means passes said signal from said second programmable means therethrough only upon receiving said enable signal.

10. An output structure as in claim 9, said circuit further having an input line, and said output structure further comprising:
    first signal source;
    second signal source;
    fourth programmable means, operatively connected to said first signal source and to said second signal source and having an output line, for coupling therethrough said first signal or said second signal to said output line of said fourth programmable means;
    second programmable storage means having an input terminal coupled to said pin, a clock/latch enable terminal connected to said output line of said fourth programmable means and an output terminal; and
    fifth programmable means, operatively connected to said pin, to said output terminal of said second programmable storage means and to said circuit input line for coupling therethrough a signal from said pin or a signal from said programmable storage means to said circuit input line.

11. An output structure as in claim 10, further comprising:
    a sixth programmable means, having a first input terminal responsive to a signal from said fifth programmable means, a second input terminal responsive to a signal from said first programmable means and being operatively connected to said circuit input line, for coupling therethrough a signal from said fifth programmable means or a signal from said first programmable means to said circuit input line wherein the signal path through the sixth programmable means comprises the operative connection of the fifth programmable circuit means to the circuit input line.

12. A programmable integrated circuit structure for interfacing first and second logic circuits, the first logic circuit having lines communicating therewith, the second logic circuit having lines communicating therewith, comprising:
    means for providing (a) a first selective state of connection between one of the lines of the first logic circuit and another of the lines of the first logic circuit, and disconnection between said one of the lines of the first logic circuit and one of the lines of the second logic circuit, and (b) a second selective state of disconnection between said one of the lines of the first logic circuit and said another of the lines of the first logic circuit, and connection between said one of the lines of the first logic circuit and said one of the lines of the second logic circuit; and additional means for providing selective states of connection to and disconnection from one of the lines of the first logic circuit and one of the lines of the second logic circuit.

13. The programmable integrated circuit structure of claim 12 wherein said first-mentioned means comprise multiplexing means.

14. The programmable integrated circuit structure of claim 13 wherein said additional means comprise second multiplexing means.

15. The programmable integrated circuit structure of claim 13 and further comprising a control line operatively connected with the first-mentioned multiplexing means for so that in response to a first signal applied to said control line, the first selective state is provided, and that in response to a second signal applied to said control line, said second selective state is provided.

16. The programmable integrated circuit structure of claim 15, wherein the time delay of a signal through the first multiplexing means is substantially equal to the time delay of a signal through the second multiplexing means.

17. The programmable integrated circuit structure of claim 15 having a multiplicity of first-mentioned multiplexing means for interfacing two or more logic circuits, each logic circuit having lines communicating therewith.

18. The programmable integrated circuit structure of claim 17 wherein one programmable multiplexing means provides a state of connection between an output line from a first logic circuit and an input line of another logic circuit and another programmable multiplexing means provides a state of connection between an output line from a second logic circuit and an input line of said another logic circuit so that said another logic circuit receives the signals from the first and second logic circuit and forms a signal representing a combination of the signals from the first and second logic circuit.

19. An integrated circuit structure comprising:

a multiplicity of first circuit means, each first circuit means generating output signals on output lines wherein each output signal on an output line represents a function;

second circuit means, having a multiplicity of input lines and an output line, for generating in response to signals on the multiplicity of input lines an output signal on said output line representing a function;

first programmable means, operatively connected to a first multiplicity of output lines from said multiplicity of circuit means and a first input line in the multiplicity of input lines, for coupling therethrough a signal on one of the first multiplicity of output lines to the first input line of the second circuit means; and second programmable means, operatively connected to a second multiplicity of output lines from said multiplicity of first circuit means and a second input line of the second circuit means, for coupling therethrough a signal on one of the second multiplicity of output lines to the second input line of the second circuit means wherein the function generated by the second circuit means in response to the signals from the first and second programmable means is a combination of the functions represented by the signals from the first and second programmable means.

* * * * *

UNITED STATES PATENT AND TRADEMARK OFFICE
CERTIFICATE OF CORRECTION

PATENT NO.   : 4,963,768
DATED        : October 16, 1990
INVENTOR(S)  : Om P. Agrawal, et al.

It is certified that error appears in the above-identified patent and that said Letters Patent is hereby corrected as shown below:

Column 1, line 10, after "1988," insert --now U.S. Pat. No. 4,931,671, issued June 5, 1990,--.

Column 32, line 7, Claim 9, "on" should read --one--.

Signed and Sealed this

Fourth Day of August, 1992

*Attest:*

DOUGLAS B. COMER

*Attesting Officer*     *Acting Commissioner of Patents and Trademarks*